(12) United States Patent
Kawakami et al.

(10) Patent No.: US 9,508,792 B2
(45) Date of Patent: Nov. 29, 2016

(54) SEMICONDUCTOR DEVICE INCLUDING AN ELECTRIC FIELD BUFFER LAYER AND METHOD FOR MANUFACTURING SAME

(71) Applicant: MITSUBISHI ELECTRIC CORPORATION, Chiyoda-ku, Tokyo (JP)

(72) Inventors: Tsuyoshi Kawakami, Tokyo (JP); Ze Chen, Tokyo (JP); Akito Nishii, Tokyo (JP); Fumihito Masuoka, Tokyo (JP); Katsumi Nakamura, Tokyo (JP); Akihiko Furukawa, Tokyo (JP); Yuji Murakami, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/430,746

(22) PCT Filed: May 1, 2013

(86) PCT No.: PCT/JP2013/062691
§ 371 (c)(1),
(2) Date: Mar. 24, 2015

(87) PCT Pub. No.: WO2014/057700
PCT Pub. Date: Apr. 17, 2014

(65) Prior Publication Data
US 2015/0221721 A1    Aug. 6, 2015

(30) Foreign Application Priority Data

Oct. 11, 2012 (JP) ................ 2012-225784

(51) Int. Cl.
*H01L 23/58* (2006.01)
*H01L 21/336* (2006.01)
(Continued)

(52) U.S. Cl.
CPC ......... *H01L 29/0619* (2013.01); *H01L 21/046* (2013.01); *H01L 21/0465* (2013.01);
(Continued)

(58) Field of Classification Search
CPC ............ H01L 29/0619; H01L 21/324; H01L 21/266; H01L 29/861; H01L 29/872; H01L 21/765
See application file for complete search history.

(56) References Cited

U.S. PATENT DOCUMENTS

| | | |
|---|---|---|
| 4,573,066 A | 2/1986 | Whight |
| 4,672,738 A | 6/1987 | Stengl et al. |

(Continued)

FOREIGN PATENT DOCUMENTS

| | | |
|---|---|---|
| JP | 59-110164 A | 6/1984 |
| JP | 61-084830 | 4/1986 |

(Continued)

OTHER PUBLICATIONS

Office Action issued Mar. 31, 2015 in Japanese Patent Application No. 2014-540763 (with English language translation).

(Continued)

*Primary Examiner* — Thomas L Dickey
*Assistant Examiner* — Damon Hillman
(74) *Attorney, Agent, or Firm* — Oblon, McClelland, Maier & Neustadt, L.L.P.

(57) ABSTRACT

An electric field buffer layer is formed so as to surround an active region. The electric field buffer layer includes a plurality of P-type impurity layers. Each of the P-type impurity layers includes P-type implantation layers and P-type diffusion layers that are formed so as to respectively surround the P-type implantation layers and contain P-type impurities at a concentration lower than that of the P-type implantation layers. A first P-type implantation layer is formed to be in contact with or to partially overlap the active region. Each of the P-type diffusion layers is formed to have an expansion to a degree to which the first P-type diffusion layer is in contact with or overlaps a second P-type diffusion layer. Intervals between the P-type implantation layers increase from the active region toward the outer peripheral portion of the semiconductor substrate.

19 Claims, 26 Drawing Sheets

(51) Int. Cl.
  *H01L 21/3205*  (2006.01)
  *H01L 29/06*    (2006.01)
  *H01L 29/66*    (2006.01)
  *H01L 29/861*   (2006.01)
  *H01L 29/868*   (2006.01)
  *H01L 29/872*   (2006.01)
  *H01L 29/16*    (2006.01)
  *H01L 21/266*   (2006.01)
  *H01L 21/324*   (2006.01)
  *H01L 21/765*   (2006.01)
  *H01L 21/04*    (2006.01)
  *H01L 29/20*    (2006.01)

(52) U.S. Cl.
  CPC ......... *H01L21/266* (2013.01); *H01L 21/324* (2013.01); *H01L 21/765* (2013.01); *H01L 29/0615* (2013.01); *H01L 29/1608* (2013.01); *H01L 29/6606* (2013.01); *H01L 29/66068* (2013.01); *H01L 29/66136* (2013.01); *H01L 29/66143* (2013.01); *H01L 29/861* (2013.01); *H01L 29/868* (2013.01); *H01L 29/872* (2013.01); *H01L 29/2003* (2013.01)

(56) References Cited

U.S. PATENT DOCUMENTS

| | | |
|---|---|---|
| 6,002,159 A | 12/1999 | Bakowski et al. |
| 6,040,237 A | 3/2000 | Bakowski et al. |
| 6,831,345 B2 | 12/2004 | Kinoshita et al. |
| 7,049,675 B2 | 5/2006 | Kinoshita et al. |
| 8,258,052 B2 | 9/2012 | Okuno et al. |
| 8,716,717 B2 | 5/2014 | Kawakami et al. |
| 2003/0067033 A1 | 4/2003 | Kinoshita et al. |
| 2003/0218220 A1* | 11/2003 | Takahashi ........... H01L 29/0619 257/409 |
| 2004/0173820 A1 | 9/2004 | Kinoshita et al. |
| 2006/0063335 A1* | 3/2006 | Kurosaki ........... H01L 29/0619 438/270 |
| 2008/0265359 A1* | 10/2008 | Noda ................. H01L 29/0619 257/495 |
| 2008/0315249 A1* | 12/2008 | Minato ................ H01L 29/407 257/139 |
| 2011/0195563 A1 | 8/2011 | Okuno et al. |
| 2014/0353678 A1 | 12/2014 | Kawakami et al. |

FOREIGN PATENT DOCUMENTS

| | | |
|---|---|---|
| JP | 1-270346 A | 10/1989 |
| JP | 7-249737 A | 9/1995 |
| JP | 2000-516767 A | 12/2000 |
| JP | 2002-231965 A | 8/2002 |
| JP | 2002-270857 A | 9/2002 |
| JP | 2003-101039 A | 4/2003 |
| JP | 2003-197898 A | 7/2003 |
| JP | 2006-156637 A | 6/2006 |
| JP | 2007-096006 A | 4/2007 |
| JP | 3997551 | 10/2007 |
| JP | 2007-324428 A | 12/2007 |
| JP | 2008-277353 A | 11/2008 |
| JP | 2011-165856 A | 8/2011 |
| WO | 98/02924 A2 | 1/1998 |

OTHER PUBLICATIONS

International Preliminary Report on Patentability and Written Opinion issued Apr. 23, 2015 (with English Translation).

R. Stengl, et al., "Variation of lateral doping—a new concept to avoid high voltage breakdown of planar junctions," IEDM 85, 1985, pp. 154-157.

International Search Report issued Aug. 6, 2013 in PCT/JP2013/062691 filed May 1, 2013.

* cited by examiner

F I G. 1 3
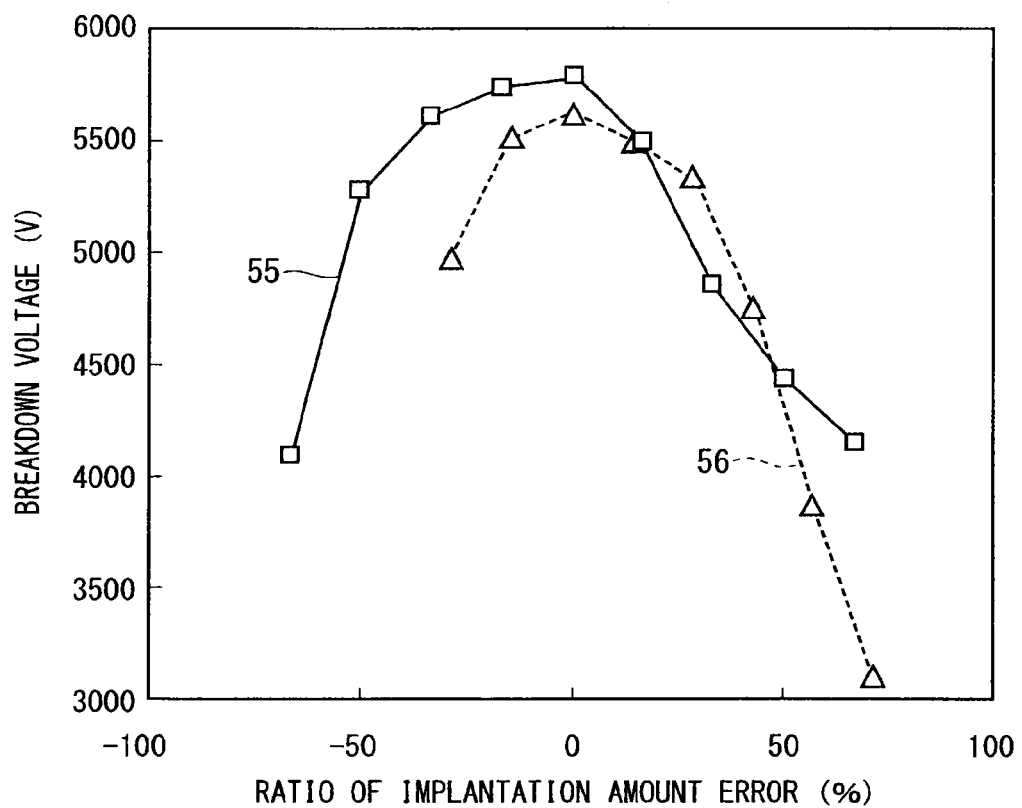

F I G. 1 6
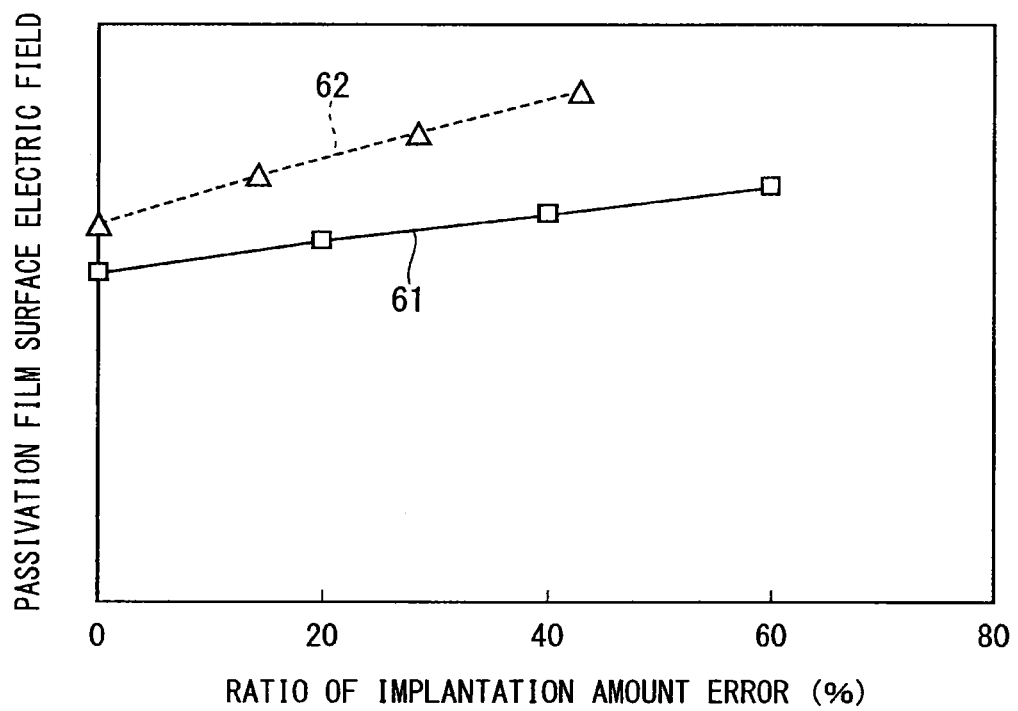

F I G. 1 9
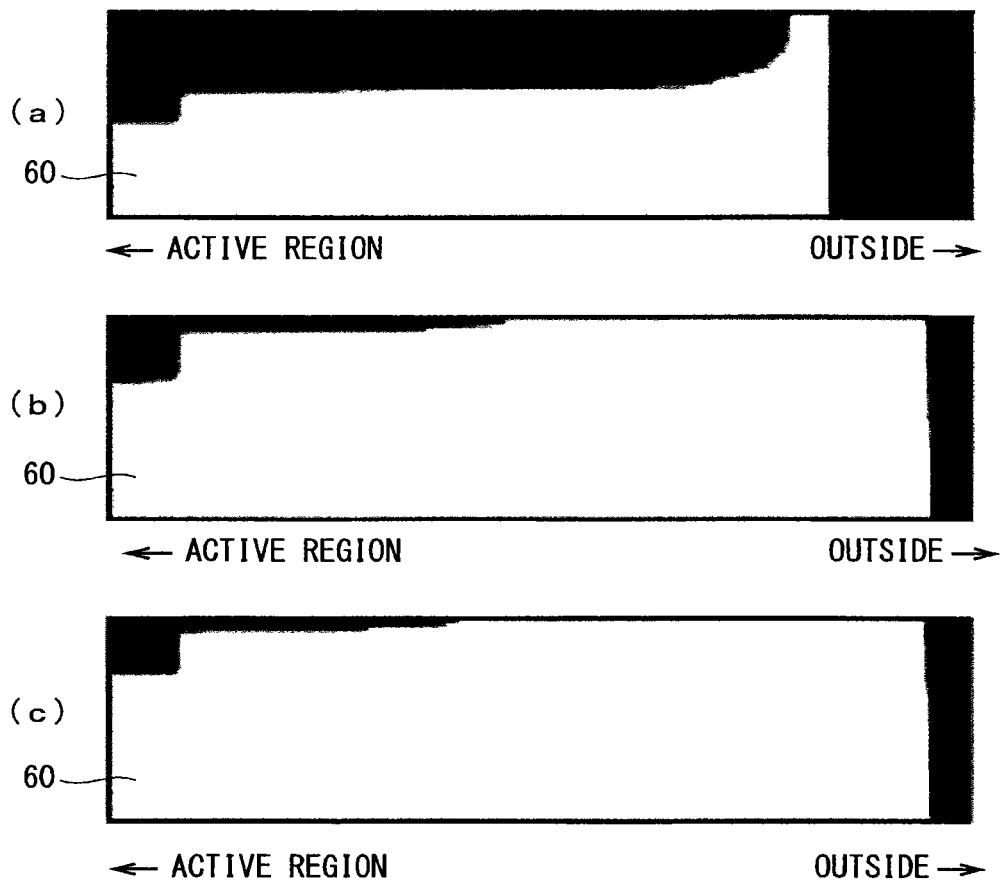

SEMICONDUCTOR DEVICE INCLUDING AN ELECTRIC FIELD BUFFER LAYER AND METHOD FOR MANUFACTURING SAME

TECHNICAL FIELD

The present invention relates to a semiconductor device and a method for manufacturing the same, and more particularly, to a semiconductor device suitable as a power electronics semiconductor device having a breakdown voltage of kilovolts or more units and a method for manufacturing the same.

BACKGROUND ART

Semiconductor devices used in power electronics (hereinafter referred to as "power semiconductor devices" in some cases) especially for semiconductor devices having breakdown voltage of greater than or equal to 100 volts include diodes, metal-oxide-semiconductor field effect transistors (MOSFETs), and insulated gate bipolar transistors (IGBTs). The semiconductor devices are provided with termination structures for maintaining high breakdown voltage.

For example, such termination structure is provided in a semiconductor device (hereinafter referred to as a "vertical device" in some cases) in which current flows perpendicularly to a surface on one side in a thickness direction of a semiconductor substrate (hereinafter referred to as a "substrate surface" in some cases) so as to surround a region that functions as an active element (hereinafter referred to as an "active region" in some cases).

The termination structure have the function of maintaining high voltage generated in the substrate surface between the active region and an end portion of the semiconductor device. The high breakdown voltage of the semiconductor device cannot be achieved without the termination structure.

The breakdown voltage of the semiconductor device includes a reverse breakdown voltage of a diode and an off-state breakdown voltage of a transistor. In either case, the breakdown voltage is defined as a voltage capable of interrupting current, namely, the voltage being an upper limit voltage that passes no current.

In a state where the semiconductor device interrupts the current, a depletion layer expands inside the semiconductor substrate. The depletion layer can maintain the high voltage. The voltage exceeding the breakdown voltage is applied, causing an avalanche breakdown in an electric field concentrated portion inside the semiconductor substrate. This breaks the depletion layer, passing a short-circuit current.

For example, in a case where a PN junction diode (hereinafter referred to as a "PIN diode" in some cases) is formed of a low-concentration N-type semiconductor substrate and a high-concentration P-type implantation layer, the depletion layer mostly expands in the low-concentration N-type semiconductor substrate in an off state. The depletion layer maintains the high voltage. The breakdown voltage is limited by an end portion of the high-concentration P-type implantation layer, and specifically, an electric field concentration at an outer edge portion thereof.

A low-concentration P-type implantation layer is then formed adjacent to the end portion of the high-concentration P-type implantation layer, and the depletion layer thus expands both in the low-concentration N-type semiconductor substrate and the low-concentration P-type implantation layer. This relieves the electric field at the end portion of the high-concentration P-type implantation layer to increase the breakdown voltage.

The low-concentration P-type implantation layer is referred to as a reduced surface field (RESURF) layer or a junction termination extension (JTE) layer. Moreover, the termination structure is referred to as a RESURF structure.

The depletion layer also expands in the RESURF layer in the RESURF structure. To obtain the high breakdown voltage, the RESURF layer is preferably depleted almost completely to the outermost surface with a desired voltage. The conditions are specified by an implantation amount in the RESURF layer, such as a dosage amount or an implantation surface density.

In a case where the implantation amount in the entire RESURF layer is single, an optimal implantation amount is determined by a semiconductor material forming the semiconductor substrate without having a dependence on an impurity concentration of the semiconductor substrate. For example, the optimal implantation amount of silicon (Si) is approximately $1 \times 10^{12}$ cm$^{-2}$. The optimal implantation amount of silicon carbide (SiC) of polytype 4H is approximately $1 \times 10^{13}$ cm$^{-2}$. These values of the optimal implantation amounts are values in a case where an activation ratio of the impurities implanted is 100%. The values of the optimal implantation amounts are referred to as RESURF conditions.

The RESURF structure has problems below. To obtain the high breakdown voltage, an electric field is concentrated also at an outer edge portion of the RESURF layer in the RESURF structure. As a result, the high breakdown voltage is limited by the avalanche breakdown at the outer edge portion of the RESURF layer. In other words, the RESURF structure has limits on the high breakdown voltage.

The problem can be avoided by, for example, gradually decreasing the implantation amount in the RESURF layer toward the outside of the semiconductor substrate (for example, see Non Patent Document 1 and Patent Document 1). Such structure in which the implantation amount in the RESURF layer gradually decreases disperses the electric field concentrated points to a countless number of places and greatly reduces a maximum electric field inside the semiconductor. The structure of the RESURF layer is referred to as a variation of lateral doping (VLD) structure.

Moreover, the RESURF structure has the implantation amount in the RESURF layer gradually reduced toward the outside of the semiconductor substrate (for example, see Patent Document 2 and Patent Document 3). Effects similar to those in the case with the RESURF layer in the VLD structure disclosed in Non Patent Document 1 or Patent Document 1 can be obtained in the RESURF structure.

Specifically, in the case of the RESURF structure disclosed in Patent Document 2 or Patent Document 3, the electric fields are concentrated at the outer edge portion of the high-concentration P-type implantation layer, the boundary portion of the RESURF layers having different implantation amounts, and the outermost edge portion of the RESURF layer. Therefore, the effects of relieving the electric fields in the RESURF structure disclosed in Patent Document 2 or Patent Document 3 are inferior to the effects in the case where the RESURF layer in the VLD structure disclosed in Non Patent Document 1 or Patent Document 1 is used. However, as compared to the entire RESURF layer in which the implantation amount is single, the RESURF structure disclosed in Patent Document 2 or Patent Document 3 disperses the electric field concentrated points, thereby reducing the maximum electric field inside the semiconductor substrate.

PRIOR ART DOCUMENT

Patent Document

Patent Document 1: Japanese Patent Application Laid-Open No. 61-84830 (1986)
Patent Document 2: Japanese Patent No. 3997551
Patent Document 3: Japanese Unexamined Patent Application Publication (Translation of PCT Application) No. 2000-516767

Non Patent Document

Non Patent Document 1: R. Stengl and U. Gosele, "VARIATION OF LATERAL DOPING—A NEW CONCEPT TO AVOID HIGH VOLTAGE BREAKDOWN OF PLANAR JUNCTIONS," I EDM 85, p. 154, 1985.

SUMMARY OF INVENTION

Problems to be Solved by the Invention

As described above, the RESURF structure of the conventional technology disclosed in Non Patent Document 1 and Patent Documents 1 to 3 is a structure in which the implantation amount in the RESURF layer is reduced toward the outer end portion of the semiconductor substrate and is effective for the high breakdown voltage.

However, in the RESURF structure of the conventional technology, the implantation amount in which the high breakdown voltage is obtained (hereinafter referred to as an "optimal implantation amount" in some cases) has a narrow margin. If the optimal implantation amount has the narrow margin, a variation in a manufacturing process easily has an influence and the implantation amount in a manufactured product easily falls outside the optimal implantation amount.

The product in which the implantation amount falls outside the optimal implantation amount has problems below. If the implantation amount is smaller than the optimal implantation amount, the RESURF layer is completely depleted before reaching a desired voltage and the electric field concentration significantly occurs at the outer peripheral portion of the active region, causing an avalanche breakdown. Moreover, if the implantation amount is greater than the optimal implantation amount, a region inside the RESURF layer, namely, the region close to the active region is not depleted to the outermost surface and a region that maintains the high voltage generated in the substrate surface becomes narrow, causing a decrease in the breakdown voltage. Therefore, the product in which the implantation amount falls outside the optimal implantation amount is a defective product.

In this manner, if the margin of the optimal implantation amount is narrow, the variation in the manufacturing process easily has an influence and the implantation amount easily falls outside the optimal implantation amount, which easily result in a low yield, namely, a low efficiency percentage.

The present invention has been made in view of the above mentioned problems, and an object thereof is to provide a semiconductor device that is hardly influenced by a variation in a manufacture process and can be manufactured with a relatively high yield and provide a method for manufacturing the semiconductor device.

Means to Solve the Problems

A semiconductor device of the present invention, comprising: a semiconductor substrate of a first conductivity type; an active region of a second conductivity type formed in a surface portion on one side in a thickness direction of the semiconductor substrate and formed away from an outer peripheral portion of the semiconductor substrate; and an electric field buffer layer formed in the surface portion on the one side in the thickness direction of the semiconductor substrate in an annular shape so as to surround the active region from an outer peripheral portion of the active region toward the outer peripheral portion of the semiconductor substrate, wherein the electric field buffer layer includes: a plurality of high-concentration impurity layers that are formed at intervals so as to surround the active region and contain second conductivity type impurities; and a plurality of low-concentration impurity layers that are formed so as to respectively surround the high-concentration impurity layers and contain the second conductivity type impurities at a concentration lower than that of the high-concentration impurity layers, an innermost high-concentration impurity layer formed on the innermost side in a radial direction of the electric field buffer layer among the high-concentration impurity layers is formed to be in contact with or to partially overlap the active region, the low-concentration impurity layer that surrounds the innermost high-concentration impurity layer is formed to be connected to at least one of the low-concentration impurity layers that respectively surround the other high-concentration impurity layers formed outside the innermost high-concentration impurity layer in the radial direction, and intervals between the high-concentration impurity layers increase from the active region toward the outer peripheral portion of the semiconductor substrate.

A method for manufacturing a semiconductor device that comprises a semiconductor substrate of a first conductivity type, an active region of a second conductivity type formed in a surface portion on one side in a thickness direction of the semiconductor substrate and formed away from an outer peripheral portion of the semiconductor substrate, and an electric field buffer layer formed in an annular shape so as to surround the active region from an outer peripheral portion of the active region toward the outer peripheral portion of the semiconductor substrate, the method comprising: a mask formation step of forming, on a surface portion on one side in a thickness direction of the semiconductor substrate, an implantation mask in which a plurality of openings surrounding a portion corresponding to a region to form the active region are formed at intervals in a radial direction; an ion implantation step of ion-implanting the second conductivity type impurities in the semiconductor substrate through the implantation mask to form high-concentration impurity layers; and a heat treatment step of heat-treating the semiconductor substrate in which the second conductivity type impurities have been ion-implanted to form low-concentration impurity layers that respectively surround the high-concentration impurity layers, wherein in the mask formation step, the implantation mask is formed such that the intervals between the openings in the radial direction increase from a portion corresponding to a region in which the active region is formed toward a portion corresponding to the outer peripheral portion of the semiconductor substrate, upon completion of the heat treatment step, an innermost high-concentration impurity layer formed on the innermost side in a radial direction of the electric field buffer layer among the high-concentration impurity layers is formed to be in contact with or to partially overlap the active region, and the low-concentration impurity layer that surrounds the innermost high-concentration impurity layer is formed to be connected to at least one of the low-concentration impurity layers that respectively surround the other high-concentration impurity layers formed outside the innermost high-concentration impurity layer in the radial direction.

Effects of the Invention

In the semiconductor device of the present invention, the active region of the second conductivity type is formed in the surface portion on the one side in the thickness direction of the semiconductor substrate of the first conductivity type and formed away from the outer peripheral portion of the semiconductor substrate. The electric field buffer layer is formed in the annular shape so as to surround the active region from the outer peripheral portion of the active region toward the outer peripheral portion of the semiconductor substrate. The electric field buffer layer includes the plurality of high-concentration impurity layers formed at the intervals so as to surround the active region and the plurality of low-concentration impurity layers formed so as to surround the high-concentration impurity layers. The low-concentration impurity layers contain the second conductivity type impurities at the concentration lower than that of the high-concentration impurity layers. The innermost high-concentration impurity layer formed on the innermost side in the radial direction of the electric field buffer layer is formed to be in contact with or to partially overlap the active region. The low-concentration impurity layer that surrounds the innermost high-concentration impurity layer is formed to be connected to at least one of the low-concentration impurity layers that surround the other high-concentration impurity layers formed outside the innermost high-concentration impurity layer in the radial direction. The intervals between the high-concentration impurity layers increase from the active region toward the outer peripheral portion of the semiconductor substrate.

This configuration can relatively expand the margin of the implantation amount of the second conductivity type impurities that can achieve the semiconductor device having the relatively high breakdown voltage when the high-concentration impurity layers and the low-concentration impurity layers are formed. This can achieve the semiconductor device that is hardly influenced by the variation in the manufacturing process and can be manufactured with the relatively high yield.

The method for manufacturing the semiconductor device forms the implantation mask on the surface portion on the one side in the thickness direction of the semiconductor substrate in the mask formation step. In the implantation mask, the plurality of openings surrounding the portion corresponding to the region in which the active region is formed are formed at the intervals in the radial direction. The ion implantation step ion-implants the second conductivity type impurities in the semiconductor substrate through the implantation mask to form the high-concentration impurity layers. The heat treatment step heat-treats the semiconductor substrate in which the second conductivity type impurities have been ion-implanted to form the low-concentration impurity layers that surround the high-concentration impurity layers. Thus, the electric field buffer layer including the high-concentration impurity layers and the low-concentration impurity layers is formed in the annular shape so as to surround the active region from the outer peripheral portion of the active region toward the outer peripheral portion of the semiconductor substrate. Upon completion of the heat treatment step, the innermost high-concentration impurity layer formed on the innermost side in the radial direction of the electric field buffer layer among the high-concentration impurity layers is formed to be in contact with or to partially overlap the active region. The low-concentration impurity layer that surrounds the innermost high-concentration impurity layer is formed to be connected to at least one of the low-concentration impurity layers that surround the other high-concentration impurity layers formed outside the innermost high-concentration impurity layer in the radial direction. Such electric field buffer layer can achieve the semiconductor device having the relatively high breakdown voltage.

In the mask formation step, the implantation mask is formed such that the intervals between the openings in the radial direction increase from the portion corresponding to the region in which the active region is formed toward the portion corresponding to the outer peripheral portion of the semiconductor substrate. This can relatively expand the margin of the implantation amount of the second conductivity type impurities that can achieve the semiconductor device having the relatively high breakdown voltage. Therefore, the semiconductor device that suppresses the influence by the variation in the manufacturing process and has the relatively high breakdown voltage can be manufactured with the relatively high yield.

Moreover, the low-concentration impurity layers are formed in the heat treatment performed after the ion implantation in which the high-concentration impurity layers are formed, so that the ion implantation to form the low-concentration impurity layers does not need to be performed. Furthermore, to achieve the relatively high breakdown voltage, no heat treatment for a long time needs to be performed after the ion implantation. Therefore, the electric field buffer layer capable of achieving the relatively high breakdown voltage as described above can be easily formed.

These and other objects, features, aspects and advantages of the present invention will become more apparent from the following detailed description of the present invention when taken in conjunction with the accompanying drawings.

BRIEF DESCRIPTION OF DRAWINGS

FIG. 13 is a graph illustrating simulation results regarding the margin of the implantation amount in the semiconductor device 1 of the first embodiment of the present invention.

FIG. 16 is a graph illustrating a simulation result regarding a maximum electric field in a surface of a passivation film.

FIG. 19 is an image illustrating simulation results regarding the distribution of the depletion layer of the substrate section in the semiconductor device of the conventional technology.

DESCRIPTION OF EMBODIMENTS

First Embodiment

Figure 1:
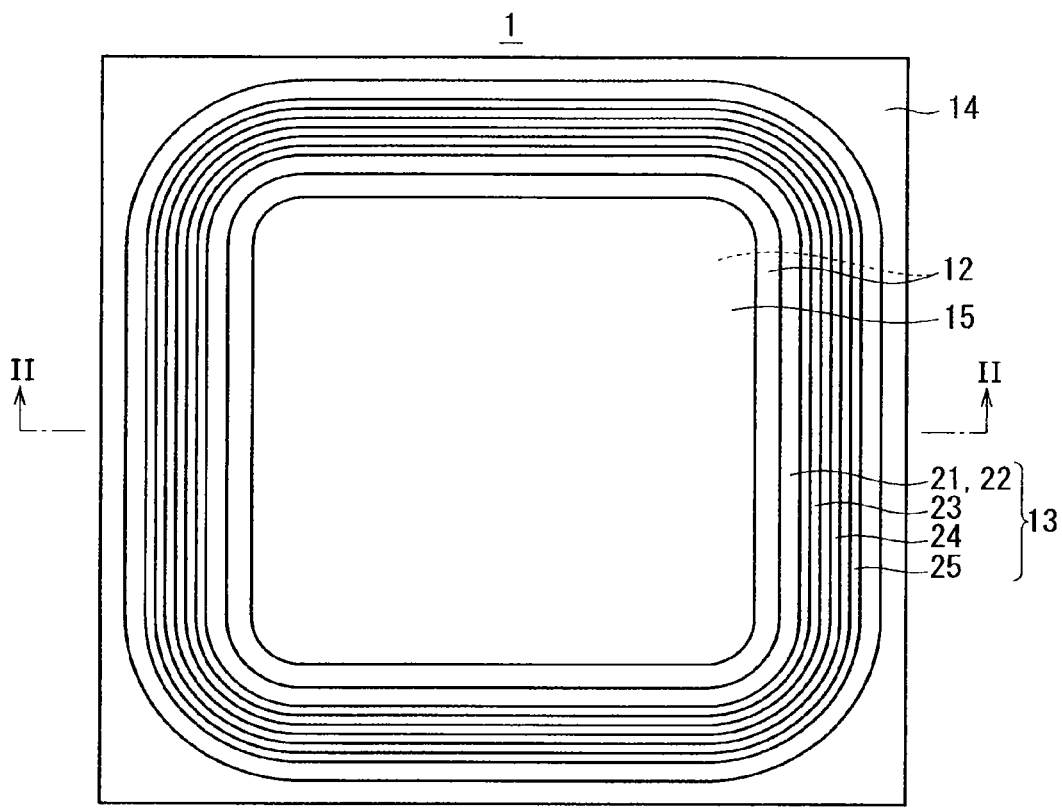
FIG. 1 is a plan view illustrating a configuration of a semiconductor device 1 of a first embodiment of the present invention.
Figure 2:
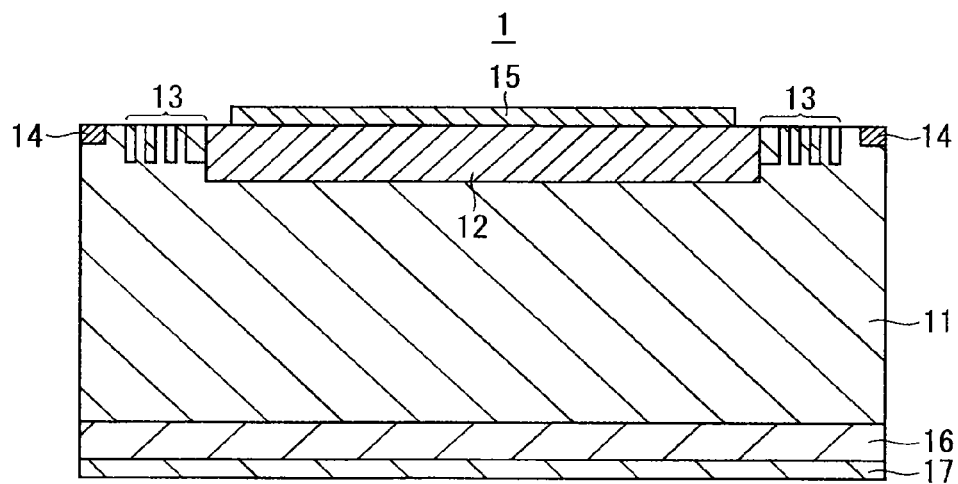
FIG. 2 is a cross-sectional view taken along a cross-sectional line II-II of FIG. 1.

FIG. 1 is a plan view illustrating a configuration of a semiconductor device 1 of a first embodiment of the present invention. This embodiment shows a configuration of a PIN diode that is a configuration in a case where the semiconductor device 1 is applied to a vertical diode. FIG. 2 is a cross-sectional view taken along a cross-sectional line II-II of FIG. 1.

The semiconductor device 1, as shown in FIGS. 1 and 2, includes a semiconductor substrate 11, an active region 12, an electric field buffer layer 13, a stopper layer 14, an anode electrode 15, a cathode layer 16, and a cathode electrode 17. The semiconductor substrate 11, the stopper layer 14, and the cathode layer 16 have N-type conductivity. The active region 12 and the electric field buffer layer 13 have P-type conductivity. The N-type corresponds to a first conductivity type, and the P-type corresponds to a second conductivity type.

The semiconductor substrate 11 is an N-type semiconductor substrate. The semiconductor substrate 11 contains a relatively low concentration of N-type impurities. In the following description, the relatively low concentration of the N-type impurities may be indicated by "N⁻." FIG. 1 corresponds to the plan view of the semiconductor device 1 as seen from one side in a thickness direction of the semiconductor substrate 11. The semiconductor substrate 11 has a rectangular shape, and specifically, the square shape as seen from the one side in the thickness direction.

The active region 12 is formed away from an outer peripheral portion of the semiconductor substrate 11 in a surface portion on the one side in the thickness direction of the semiconductor substrate 11. Specifically, the active region 12 is formed in the center of the surface portion on the one side in the thickness direction of the semiconductor substrate 11. The active region 12 is formed in a substantially square shape, and specifically, the square shape with four corner portions formed by an arc-shaped curve of 90°, as seen from the one side in the thickness direction of the semiconductor substrate 11. The active region 12 is formed of a P-type impurity layer that contains a relatively high concentration of P-type impurities.

The electric field buffer layer 13 is formed from the outer peripheral portion of the active region 12 toward the outer peripheral portion of the semiconductor substrate 11 in the surface portion on the one side in the thickness direction of the semiconductor substrate 11. The electric field buffer layer 13 is formed in an annular shape so as to surround the active region 12 as seen from the one side in the thickness direction of the semiconductor substrate 11. In the following description, a radial direction of the electric field buffer layer 13 may be simply referred to as a "radial direction," and a circumferential direction of the electric field buffer layer 13 may be simply referred to as a "circumferential direction."

The electric field buffer layer 13 includes a plurality of P-type impurity layers 21, 22, 23, 24, 25. The plurality of P-type impurity layers 21, 22, 23, 24, 25 are each formed in the annular shape as seen from the one side in the thickness direction of the semiconductor substrate 11 and are disposed side by side in the radial direction. Each of the P-type impurity layers 21, 22, 23, 24, 25 is formed in a substantially annular square, and specifically, the annular square with four corner portions formed by an arc-shaped curve of 90°, as seen from the one side in the thickness direction of the semiconductor substrate 11.

The stopper layer 14 is formed away from the electric field buffer layer 13 at the outer peripheral portion of the semiconductor substrate 11 in the surface portion on the one side in the thickness direction of the semiconductor substrate 11. The stopper layer 14 is formed of an N-type impurity layer that contains a relatively high concentration of the N-type impurities.

A structure, outside the active region 12 in the radial direction, from the electric field buffer layer 13 to the stopper layer 14 is a termination structure. In other words, the termination structure includes the electric field buffer layer 13 and the stopper layer 14.

The anode electrode 15 is provided on a surface portion on one side in a thickness direction of the active region 12. The anode electrode 15 is formed on part of the surface portion on the one side in the thickness direction of the active region 12, and specifically, in the center thereof. The anode electrode 15 has a substantially square shape smaller than the active region 12, and specifically, the square shape with four corner portions formed by an arc-shaped curve of 90°, as seen from the one side in the thickness direction of the semiconductor substrate 11.

The cathode layer 16 is formed in the surface portion of the semiconductor substrate 11 on the side opposite to the side on which the active region 12 is formed, namely, a surface portion on the other side in the thickness direction of the semiconductor substrate 11 (hereinafter referred to as a "substrate back surface" in some cases). The cathode layer 16 is formed on the entire substrate back surface. The cathode layer 16 is formed of the N-type impurity layer that contains the relatively high concentration of the N-type impurities.

The cathode electrode 17 is provided on the surface portion on the other side in a thickness direction of the cathode layer 16. The cathode electrode 17 is provided on the entire surface portion on the other side in the thickness direction of the cathode layer 16.

In the semiconductor device 1 having the configuration described above, a bias voltage is applied between the anode electrode 15 in contact with the active region 12 and the cathode electrode 17 being the substrate back surface. This causes the semiconductor device 1 to function as a PN junction diode.

Figure 3:
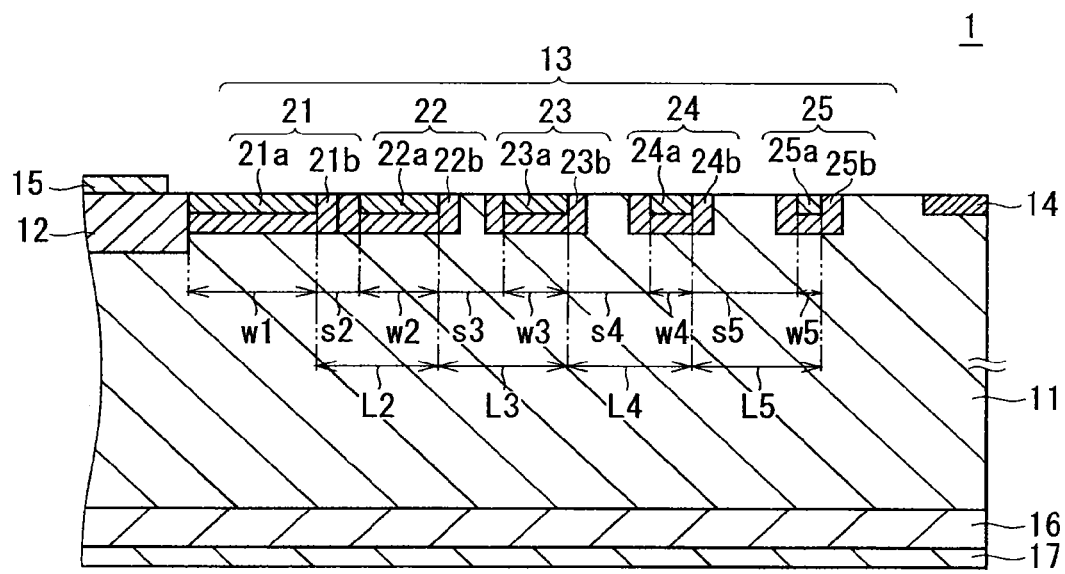
FIG. 3 is a cross-sectional view illustrating an enlarged portion of an electric field buffer layer 13 of the semiconductor device 1 in the first embodiment of the present invention.

This embodiment gives description mainly about the configuration of the electric field buffer layer 13. FIG. 3 is a cross-sectional view illustrating an enlarged portion of the electric field buffer layer 13 of the semiconductor device 1 in the first embodiment of the present invention.

As shown in FIG. 3, the active region 12 that contains the relatively high concentration of the P-type impurities is formed in the surface portion on the one side in the thickness direction of the semiconductor substrate 11 that contains the relatively low concentration ($N^{31}$) of the N-type impurities. The active region 12 is formed of a P-base layer being a semiconductor layer that contains the P-type impurities. In the following description, the active region 12 may be referred to as a "P-base layer 12."

The plurality of P-type impurity layers 21, 22, 23, 24, 25 are formed so as to surround the P-base layer 12 as seen from the one side in the thickness direction of the semiconductor substrate 11. The plurality of P-type impurity layers 21, 22, 23, 24, 25 form the electric field buffer layer 13.

The stopper layer 14 that contains the relatively high concentration of the N-type impurities is formed at the outer peripheral portion of the semiconductor substrate 11 at an interval from the electric field buffer layer 13 in the radial direction.

The electric field buffer layer 13 in this embodiment includes five P-type impurity layers 21, 22, 23, 24, 25, and specifically, a first P-type impurity layer 21, a second P-type impurity layer 22, a third P-type impurity layer 23, a fourth P-type impurity layer 24, and a fifth P-type impurity layer 25.

Each of the P-type impurity layers 21, 22, 23, 24, 25 is configured to include a plurality of P-type impurity layers having different concentrations of the P-type impurities, and specifically, two types of the P-type impurity layers. One of the types of the P-type impurity layers includes P-type implantation layers 21a, 22a, 23a, 24a, 25a that contain the relatively low concentration of the P-type impurities, and the other type includes P-type diffusion layers 21b, 22b, 23b, 24b, 25b that contain the P-type impurities at a concentration lower than that of the P-type implantation layers 21a, 22a, 23a, 24a, 25a.

As compared to the P-type diffusion layers 21b, 22b, 23b, 24b, 25b, the P-type implantation layers 21a, 22a, 23a, 24a, 25a have the P-type impurities at the concentration higher than that of the P-type diffusion layers 21b, 22b, 23b, 24b, 25b. Therefore, in this embodiment, the P-type implantation layers 21a, 22a, 23a, 24a, 25a correspond to high-concentration impurity layers while the P-type diffusion layers 21b, 22b, 23b, 24b, 25b correspond to low-concentration impurity layers.

The plurality of P-type implantation layers, namely, the first to fifth P-type implantation layers 21a to 25a are formed at intervals so as to surround the active region 12 as seen from the one side in the thickness direction of the semiconductor substrate 11.

Each of the P-type implantation layers 21a, 22a, 23a, 24a, 25a is surrounded by the corresponding P-type diffusion layers 21b, 22b, 23b, 24b, 25b. The P-type implantation layers and the P-type diffusion layers surrounding the P-type implantation layers are assumed to be separated here for easy understanding although the successive change in the concentration of the P-type impurities does not actually allow to define the boundaries. Specifically, regions formed by ion implantation of the impurities are referred to as "implantation layers," and regions formed by diffusion of the impurities in heat treatment after the ion implantation are referred to as "diffusion layers."

The first P-type impurity layer 21 includes a first P-type implantation layer 21a and a first P-type diffusion layer 21b that surrounds the first P-type implantation layer 21a. The second P-type impurity layer 22 includes a second P-type implantation layer 22a and a second P-type diffusion layer 22b that surrounds the second P-type implantation layer 22a. The third P-type impurity layer 23 includes a third P-type implantation layer 23a and a third P-type diffusion layer 23b that surrounds the third P-type implantation layer 23a. The fourth P-type impurity layer 24 includes a fourth P-type implantation layer 24a and a fourth P-type diffusion layer 24b that surrounds the fourth P-type implantation layer 24a. The fifth P-type impurity layer 25 includes a fifth P-type implantation layer 25a and a fifth P-type diffusion layer 25b that surrounds the fifth P-type implantation layer 25a.

The first P-type implantation layer 21a formed on the innermost side in the radial direction of the electric field buffer layer 13 among the P-type implantation layers 21a to 25a is formed to be in contact with or to partially overlap the P-base layer 12 forming the active region. In this embodiment, the first P-type implantation layer 21a is formed in contact with the P-base layer 12. The first P-type implantation layer 21a corresponds to an innermost high-concentration impurity layer.

The P-base layer 12 is formed to a position deeper than that of the electric field buffer layer 13 from the substrate surface. Similarly to each of the P-type impurity layers 21, 22, 23, 24, 25 forming the electric field buffer layer 13, the P-base layer 12 is also actually configured to include a portion corresponding to the P-type implantation layer and a portion corresponding to the P-type diffusion layer, but the P-base layer 12 is treated to be formed of a single layer here for easy understanding.

The first P-type implantation layer 21a is formed to be in contact with or to partially overlap the P-base layer 12 outside the P-base layer 12 in the radial direction. In this embodiment, as shown in FIG. 3, the first P-type implantation layer 21a is formed in contact with the P-base layer 12 outside the P-base layer 12 in the radial direction. Also as shown in FIG. 3, the second P-type implantation layer 22a is formed at an interval from the first P-type implantation layer 21a outside the first P-type implantation layer 21a. The third P-type implantation layer 23a is formed at an interval from the second P-type implantation layer 22a outside the second P-type implantation layer 22a. The fourth P-type implantation layer 24a is formed at an interval from the third P-type implantation layer 23a outside the third P-type implantation layer 23a. The fifth P-type implantation layer 25a is formed at an interval from the fourth P-type implantation layer 24a outside the fourth P-type implantation layer 24a.

The first to fifth P-type implantation layers 21a, 22a, 23a, 24a, 25a are surrounded by the corresponding first to fifth P-type diffusion layers 21b, 22b, 23b, 24b, 25b, respectively. The electric field buffer layer 13 is configured to include the first to fifth P-type implantation layers 21a, 22a, 23a, 24a, 25a and the first to fifth P-type diffusion layers 21b, 22b, 23b, 24b, 25b.

At least the fifth P-type diffusion layer 25b that surrounds the fifth P-type implantation layer 25a formed on the outermost side in the radial direction of the electric field buffer layer 13 among the P-type implantation layers 21a to 25a is formed at an interval from the P-type diffusion layer that surrounds the other P-type implantation layer formed on the inner side next to the fifth P-type implantation layer 25a in the radial direction. In other words, at least the fifth P-type diffusion layer 25b is formed at an interval from the fourth P-type diffusion layer 24b that surrounds the fourth P-type implantation layer 24a on the inner side next to the fifth P-type diffusion layer 25b. The fifth P-type implantation layer 25a corresponds to an outermost high-concentration impurity layer.

Here, a length dimension (hereinafter referred to as a "width") in the radial direction of the first P-type implantation layer 21a is indicated by w1, a width of the second P-type implantation layer 22a is indicated by w2, a width of the third P-type implantation layer 23a is indicated by w3, a width of the fourth P-type implantation layer 24a is indicated by w4, and a width of the fifth P-type implantation layer 25a is indicated by w5.

Moreover, a region between the P-type implantation layers adjacent to each other in the radial direction is referred to as an "interlayer region." Specifically, a region between the first P-type implantation layer 21a and the second P-type implantation layer 22a is referred to as a "second interlayer region," and a width being a length dimension in the radial direction of the second interlayer region is indicated by s2. A region between the second P-type implantation layer 22a and the third P-type implantation layer 23a is referred to as a "third interlayer region," and a width of the third interlayer region is indicated by s3. A region between the third P-type implantation layer 23a and the fourth P-type implantation layer 24a is referred to as a "fourth interlayer region," and a width of the fourth interlayer region is indicated by s4. A region between the fourth P-type implantation layer 24a and the fifth P-type implantation layer 25a is referred to as a "fifth interlayer region," and a width of the fifth interlayer region is indicated by s5.

Moreover, each of the P-type implantation layers 22a, 23a, 24a, 25a except for the first P-type implantation layer 21a and the interlayer regions of the inside thereof are combined to be referred to as a "set." Specifically, the second P-type implantation layer 22a and the second interlayer region of the inside thereof are combined to be referred to as a "second set." The third P-type implantation layer 23a and the third interlayer region of the inside thereof are combined to be referred to as a "third set." The fourth P-type implantation layer 24a and the fourth interlayer region of the inside thereof are combined to be referred to as a "fourth set." The fifth P-type implantation layer 25a and the fifth interlayer region of the inside thereof are combined to be referred to as a "fifth set."

A width being a length dimension in the radial direction of the set is referred to as a "set width" indicated by L. Specifically, a width of the second set is referred to as a "second set width," a width of the third set is referred to as a "third set width," a width of the fourth set is referred to as a "fourth set width," and a width of the fifth set is referred to as a "fifth set width."

The set width L is a sum of the width w of the P-type implantation layer and the width s of the interlayer region of the inside thereof, which forms the set. That is to say, the set width L is the sum of the width s of the interlayer region and the width w of the P-type implantation layer in contact with the outside of the interlayer region in the radial direction, which forms the set. Therefore, $L2=w2+s2$, $L3=w3+s3$, $L4=w4+s4$, $L5=w5+s5$ where L2 represents the second set width, L3 represents the third set width, L4 represents the fourth set width, and L5 represents the fifth set width. In this embodiment, all of the set widths L2 to L5 are equal, and thus $L2=L3=L4=L5$.

The intervals between the P-type implantation layers adjacent to each other in the radial direction, namely, the widths s2, s3, s4, s5 of the interlayer regions increase from the inside toward the outside in the radial direction, namely, from the active region 12 toward the outer peripheral portion of the semiconductor substrate 11. In other words, $s2<s3<s4<s5$. In this embodiment, $L2=L3=L4=L5$ as described above, so that $w2>w3>w4>w5$.

Thus, in this embodiment, s2, s3, s4, s5 that are the intervals between the P-type implantation layers adjacent to each other in the radial direction linearly increase, and specifically, increase in arithmetic progression from the inside toward the outside in the radial direction. The widths w2, w3, w4, w5 of the other P-type implantation layers 22a, 23a, 24a, 25a except for the first P-type implantation layer 21a linearly decrease, and specifically, decrease in arithmetic progression from the inside toward the outside in the radial direction.

The width w1 of the first P-type implantation layer 21a is an independent parameter. The width w1 of the first P-type implantation layer 21a may be nearly equal to the set width, for example. In a case where a difference in depth between the P-base layer 12 and the first P-type diffusion layer 21b is relatively great, the first P-type implantation layer 21a preferably has the relatively great width w1 to relieve the electric field at an end portion (hereinafter referred to as a "bottom end portion" in some cases) on the other side in the thickness direction of the P-base layer 12 upon switching.

Moreover, each of the P-type diffusion layers 21b, 22b, 23b, 24b, 25b is formed to have an expansion (hereinafter referred to as a "diffusion length" in some cases) to the degree to which the first P-type diffusion layer 21b is in contact with or overlaps the second P-type diffusion layer 22b. In this embodiment, the first P-type diffusion layer 21b and the second P-type diffusion layer 22b are formed in contact with each other. As described below, the diffusion length of the P-type diffusion layer is too great, which reduces the effects of the present invention, and thus the diffusion length of the P-type diffusion layer is selected as appropriate.

Figure 4:
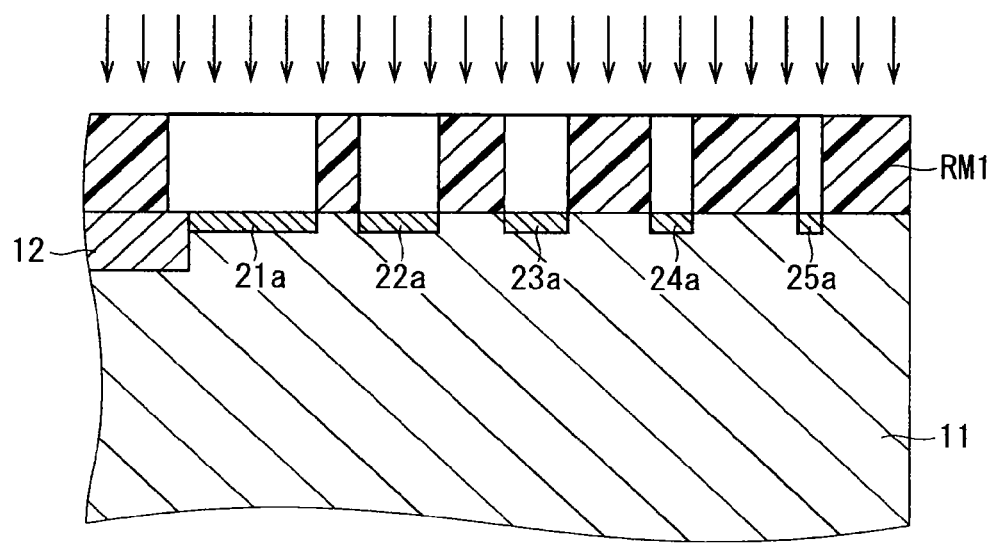
FIG. 4 is a cross-sectional view illustrating a state in which an ion implantation is performed using a resist mask RM1.
Figure 5:
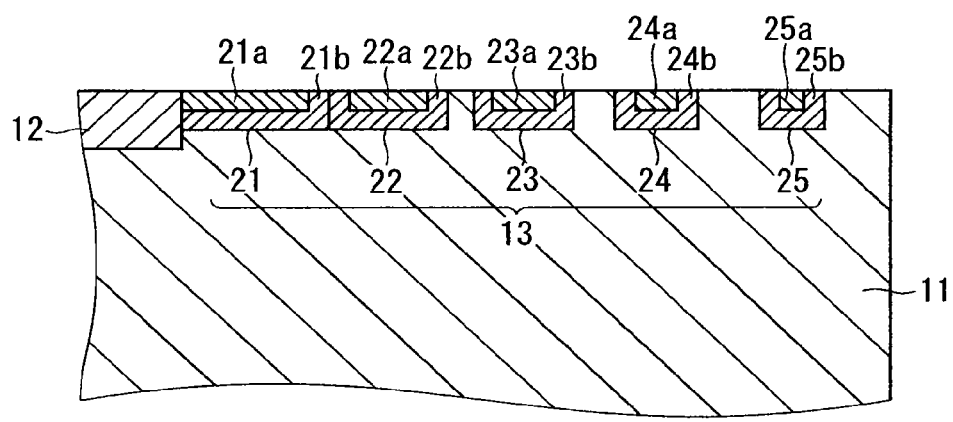
FIG. 5 is a cross-sectional view illustrating a state in a stage in which formation of the electric field buffer layer 13 has been completed.

Next, a method for manufacturing the semiconductor device 1 in the first embodiment of the present invention will be described. The method for manufacturing the semiconductor device 1 of this embodiment includes a process of forming the P-base layer 12 (hereinafter referred to as a "base layer formation process" in some cases) and a process of forming the electric field buffer layer 13 (hereinafter referred to as an "electric field buffer layer formation process" in some cases). The electric field buffer layer formation process includes a mask formation step, an ion implantation step, and a heat treatment step. FIG. 4 is a cross-sectional view illustrating a state in which an ion implantation is performed using a resist mask RM1. FIG. 5 is a cross-sectional view illustrating a state in a stage in which the formation of the electric field buffer layer 13 has been completed.

As shown in FIG. 4, first, in the base layer formation process, the P-base layer 12 that contains the relatively high concentration of the P-type impurities is formed in part of the surface portion on the one side in the thickness direction of the semiconductor substrate 11 that contains the relatively low concentration (N$^-$) of the N-type impurities.

Subsequently, in the mask formation step, the resist mask RM1 is formed on the surface portion on the one side in the thickness direction of the semiconductor substrate 11. The resist mask RM1 corresponds to an implantation mask that is a mask for ion implantation. The resist mask RM1 is formed to have a pattern with openings corresponding to regions (hereinafter referred to as "formation regions" in some cases) in which the first to fifth P-type implantation layers 21a, 22a, 23a, 24a, 25a are formed. In other words, the resist mask RM1 is formed to have the pattern in which the plurality of openings are formed at intervals in the radial direction, the openings surrounding a portion corresponding to a region in which the P-base layer 12 being the active region is formed.

In this embodiment, the resist mask RM1 is formed such that the intervals between the openings in the radial direction increase from the portion corresponding to the region in which the P-base layer 12 being the active region is formed toward the portion corresponding to the outer peripheral portion of the semiconductor substrate 11.

Then, in the ion implantation step, the P-type impurities are ion-implanted in the semiconductor substrate 11 through the resist mask RM1. Specifically, acceptor ions being ions of the P-type impurities, such as boron ions, are implanted with relatively low energy from an upper portion of the resist mask RM1, namely, the one side in the thickness direction thereof. This forms the first to fifth P-type implantation layers 21a, 22a, 23a, 24a, 25a.

Next, after removal of the resist mask RM1, the semiconductor substrate 11 in which the acceptor ions have been implanted is heat-treated in the heat treatment step to diffuse the acceptor ions implanted. As a result, as shown in FIG. 5, the first to fifth P-type diffusion layers 21b, 22b, 23b, 24b, 25b are formed so as to surround the P-type implantation layers 21a, 22a, 23a, 24a, 25a. This forms the electric field buffer layer 13.

FIG. 5 illustrates such that the region corresponding to each of the P-type implantation layers 21a, 22a, 23a, 24a, 25a does not change before and after the heat treatment for easy understanding. However, the heat treatment actually reduces a surface acceptor concentration of each of the P-type implantation layers 21a, 22a, 23a, 24a, 25a and increases an acceptor concentration in an implantation depth. The "implantation depth" corresponds to a maximum depth that the acceptor ions reach by the ion implantation.

In addition, as described above, the successive change in the acceptor concentration being the concentration of the P-type impurities does not actually allow to define the boundaries between the P-type implantation layers and the P-type diffusion layers. However, for easy understanding herein, the P-type implantation layers and the P-type diffusion layers are assumed to be separated into the regions in which the impurities are ion-implanted as the "implantation layers" and the regions in which the impurities are diffused in the heat treatment after the ion implantation as the "diffusion layers."

Also in this embodiment, the electric field buffer layer 13 is formed after the formation of the P-base layer 12, but this order may be reversed. In addition, the heat treatment for diffusing the acceptor ions may be shared by the P-base layer 12 and the electric field buffer layer 13.

Also in this embodiment, the resist mask RM1 is used as a mask for the ion implantation, which is not restrictive, and an oxide film mask formed of an oxide film, for example, may be used.

Figure 6:
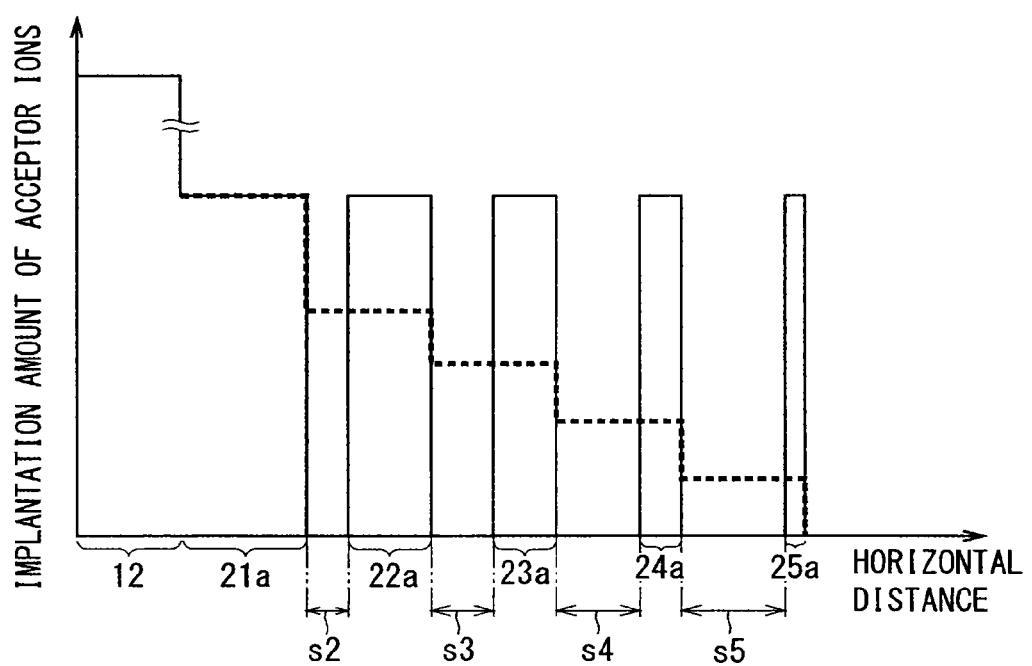
FIG. 6 is a graph illustrating a planar distribution of an implantation amount of acceptor ions in the semiconductor device 1 of the first embodiment of the present invention.

FIG. 6 is a graph illustrating a planar distribution of an implantation amount of the acceptor ions in the semiconductor device 1 of the first embodiment of the present invention. In FIG. 6, the vertical axis represents the implantation amount of the acceptor ions being the impurities in the electric field buffer layer 13, and the horizontal axis represents a distance in a horizontal direction of the semiconductor substrate 11. The horizontal direction of the semiconductor substrate 11 is a direction parallel to the surface on the one side in the thickness direction of the semiconductor substrate 11 and a direction parallel to the radial direction. The implantation amount of the acceptor ions being the impurities implanted in the region in which the electric field buffer layer 13 is formed in the step shown in FIG. 4 is indicated as in the graph shown in FIG. 6.

As shown in the solid line in FIG. 6, the acceptor ions are implanted in the regions corresponding to the first to fifth P-type implantation layers 21a, 22a, 23a, 24a, 25a in the implantation amount smaller than that in the P-base layer 12.

Here, a step-shaped distribution of the implantation amount shown in the broken line in FIG. 6 is determined by calculating an average value of each implantation amount of a set in pairs of regions having the acceptor ions implanted therein except for the first P-type implantation layer 21a and regions that are adjacent to the inside of the regions with the acceptor ions and have no acceptor ions implanted therein.

The step-shaped distribution of the implantation amount is similar to the distribution of the implantation amount in the RESURF layer disclosed in Patent Document 2 and Patent Document 3. If the number of sets further increases, the distribution is similar to the distribution of the implantation amount in the RESURF layer in the VLD structure disclosed in Non Patent Document 1 and Patent Document 1.

The regions having the acceptor ions implanted therein (hereinafter referred to as "implanted regions" in some cases) correspond to the second to fifth P-type implantation layers 22a, 23a, 24a, 25a, and the regions that are adjacent to the inside of the implanted regions and have no acceptor ions implanted therein (hereinafter referred to as "non-implanted regions" in some cases) correspond to the regions between the P-type implantation layers 21a, 22a, 23a, 24a, 25a adjacent to each other, namely, the second to fifth interlayer regions.

In the electric field buffer layer 13 of this embodiment, the second to fifth sets have the fixed widths L2 to L5, the second to fifth sets being formed of the second to fifth P-type implantation layers 22a, 23a, 24a, 25a being the implanted regions and the second to fifth interlayer regions being the non-implanted regions adjacent to the inside of the implanted regions.

In other words, in this embodiment, the P-type implantation layers 21a to 25a and the P-type diffusion layers 21b to 25b are formed such that a sum of the widths s2 to s5 of the interlayer regions between the P-type implantation layers 21a, 22a, 23a, 24a, 25a adjacent to each other and the widths w2 to w5 of the P-type implantation layers 22a, 23a, 24a, 25a in contact with the outside of the interlayer regions in the radial direction, respectively, is a predetermined value.

Moreover, in this embodiment, the widths w2 to w5 of the second to fifth P-type implantation layers 22a, 23a, 24a, 25a being the implanted regions gradually and linearly decrease toward the outside in the radial direction, and the widths of the interlayer regions being the non-implanted regions, namely, s2 to s5 that are the intervals between the P-type implantation layers 21a, 22a, 23a, 24a, 25a adjacent to each other gradually and linearly increase toward the outside in the radial direction. Thus, the average value of each implantation amount in the second set to the fifth set gradually and linearly decreases with respect to the horizontal distance toward the outside in the radial direction.

Such configuration of the electric field buffer layer 13 is an extremely well-balanced configuration that easily obtains high breakdown voltage, robustness against a variation in a manufacturing process, and robustness against operating environment of the semiconductor device even in a case where the number of sets is relatively small. Here, the robustness denotes a characteristic that prevents changes due to external factors inside.

As described above, in this embodiment, with the fixed widths L2 to L5 of the sets, the widths w2 to w5 of the P-type implantation layers 22a to 25a forming the sets gradually decrease toward the outside in the radial direction and s2 to s5 that are the intervals between the P-type implantation layers 21a to 25a adjacent to each other gradually increase toward the outside in the radial direction, thereby artificially forming the RESURF layer disclosed in Non Patent Document 1 and Patent Documents 1 to 3. In this embodiment, the number of sets is four for easy understanding, but the greater number of sets is preferable, which reduces a divergence between the RESURF layer artificially formed and the RESURF layer disclosed in Non Patent Document 1 and Patent Documents 1 to 3.

The P-type implantation layers 21a to 25a formed discretely, namely, digitally increase a concentration gradient in the PN junctions of the P-type implantation layers 21a to 25a, whereby the electric field concentration occurs at the outer peripheral portion of each of the P-type implantation layers 21a to 25a. Then, this embodiment performs the appropriate heat treatment to form the P-type diffusion layers 21b to 25b, decreases the concentration gradient in the PN junctions, and relieves the electric field concentrations.

After the heat treatment, the discrete distribution of the acceptor ions is almost maintained. The discrete distribution of the acceptor ions is maintained, thereby expanding the margin of the implantation amount in which the high breakdown voltage is obtained. Therefore, a strong heat treatment for an extremely long time as disclosed in Non Patent Document 1 and Patent Document 3 is not needed. This will be described below.

Next, description will be given of an effect of applying the semiconductor device 1 of the first embodiment of the present invention to a vertical PIN diode of Si having a breakdown voltage of 4500 V class with reference to simulation results shown in FIGS. 7 to 15.

Figure 7:
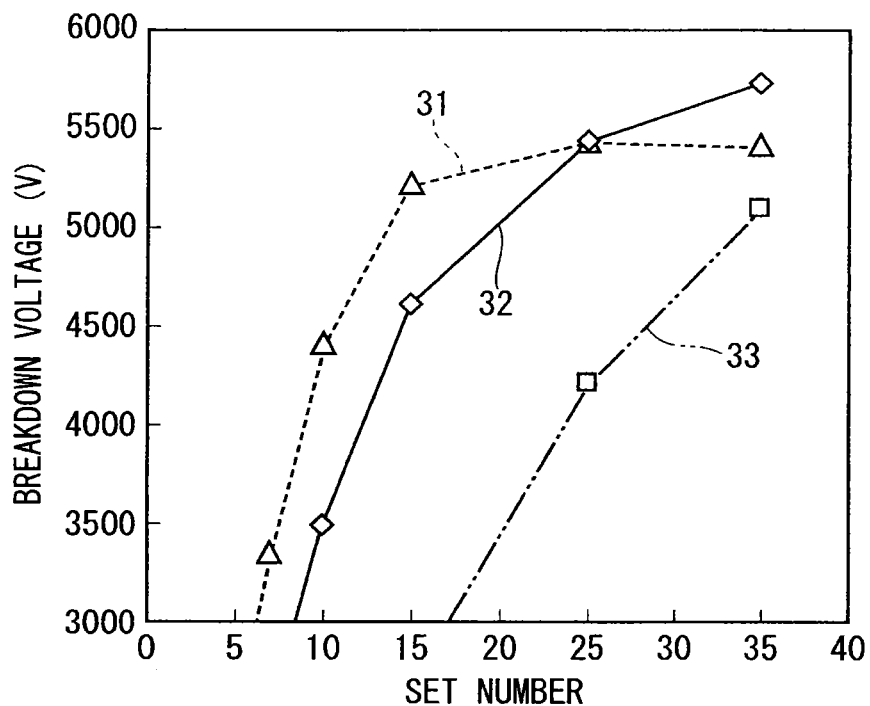
FIG. 7 is a graph illustrating a simulation result regarding a dependence of breakdown voltage on the number of sets in the semiconductor device 1 of the first embodiment of the present invention.
Figure 8:
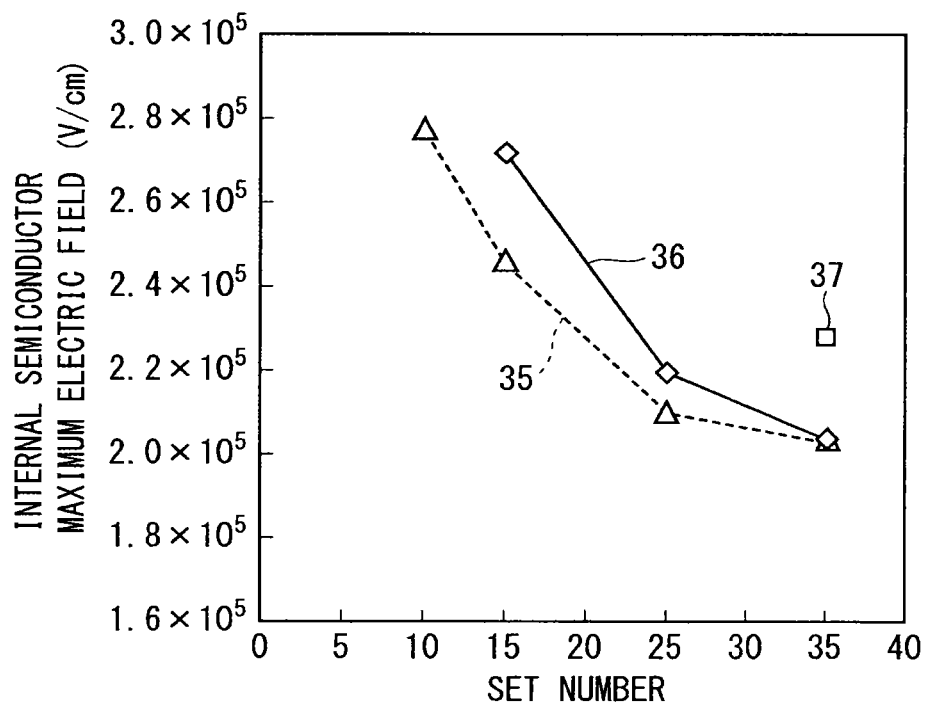
FIG. 8 is a graph illustrating a simulation result regarding a dependence of an electric field on the number of sets in the semiconductor device 1 of the first embodiment of the present invention.

First, the number of sets included in the electric field buffer layer 13 will be described. FIG. 7 is a graph illustrating a simulation result regarding a dependence of the breakdown voltage on the number of sets in the semiconductor device 1 of the first embodiment of the present invention. FIG. 8 is a graph illustrating a simulation result regarding a dependence of the electric field on the number of sets in the semiconductor device 1 of the first embodiment of the present invention. In FIG. 7, the vertical axis represents the breakdown voltage (V) in 300 K, and the horizontal axis represents the number of sets included in the electric field buffer layer 13. In FIG. 8, the vertical axis represents a maximum electric field inside the semiconductor device 1 (hereinafter referred to as an "internal semiconductor maximum electric field") (V/cm) in a case where the voltage of 4500 V is applied, and the horizontal axis represents the number of sets included in the electric field buffer layer 13.

FIG. 7 illustrates the simulation result of the breakdown voltage in a case where the electric field buffer layer 13 has a fixed width in the radial direction and the number of sets included in the electric field buffer layer 13 is changed. FIG. 8 illustrates the simulation result of the internal semiconductor maximum electric field in a case where the electric field buffer layer 13 has the fixed width in the radial direction, the number of sets included in the electric field buffer layer 13 is changed, and the voltage of 4500 V is applied between the anode electrode 15 and the cathode electrode 17 of the semiconductor device 1.

The simulation results shown in FIGS. 7 and 8 are results of performing the simulation on conditions that the implantation amount of the P-type impurities of $1.8\times10^{12}$ cm$^{-2}$, $2.5\times10^{12}$ cm$^{-2}$, and $3.5\times10^{12}$ cm$^{-2}$ in each of the P-type implantation layers 21a, 22a, 23a, 24a, 25a forming the electric field buffer layer 13, and the heat treatment is performed such that the electric field buffer layer 13 has a PN junction depth of 6 μm.

In FIG. 7, a case of the implantation amount of $1.8\times10^{12}$ cm$^{-2}$ in each of the P-type implantation layers 21a to 25a of the electric field buffer layer 13 is indicated by a broken line with a symbol "Δ" and a reference numeral "31," a case of the implantation amount of $2.5\times10^{12}$ cm$^{-2}$ in each of the P-type implantation layers 21a to 25a of the electric field buffer layer 13 is indicated by a solid line with a symbol "◊" and a reference numeral "32," and a case of the implantation amount of $3.5\times10^{12}$ cm$^{-2}$ in each of the P-type implantation layers 21a to 25a of the electric field buffer layer 13 is indicated by a chain double-dashed line with a symbol "□" and a reference numeral "33."

In FIG. 8, a case of the implantation amount of $1.8\times10^{12}$ cm$^{-2}$ in each of the P-type implantation layers 21a to 25a of the electric field buffer layer 13 is indicated by a broken line with a symbol "Δ" and a reference numeral "35," a case of the implantation amount of $2.5\times10^{12}$ cm$^{-2}$ in each of the P-type implantation layers 21a to 25a of the electric field buffer layer 13 is indicated by a solid line with a symbol "◊" and a reference numeral "36," and a case of the implantation amount of $3.5\times10^{12}$ cm$^{-2}$ in each of the P-type implantation layers 21a to 25a of the electric field buffer layer 13 is indicated by a symbol "□" and a reference numeral "37."

Here, a ratio of the width w of the implanted region to the set width L of the one set is referred to as a "set implantation ratio," and the innermost set implantation ratio and the outermost set implantation ratio in the radial direction are thus fixed.

As seen from FIGS. 7 and 8, as the number of sets is lower, the breakdown voltage is lower. However, if the number of sets increases up to 35, the breakdown voltage in the appropriate implantation amount greatly exceeds 5200 V being a target value at a room temperature. In addition, the internal semiconductor maximum electric field in 4500 V can be reduced to 0.2 MV/cm, namely, $2.0\times10^5$ V/cm. In this embodiment, the "room temperature" is assumed to be 25° C.

As the target breakdown voltage increases, the necessary number of sets increases. In addition, the innermost set implantation ratio almost has no dependence on the breakdown voltage, but the outermost set implantation ratio needs to be reduced as the target breakdown voltage increases.

Figure 9:
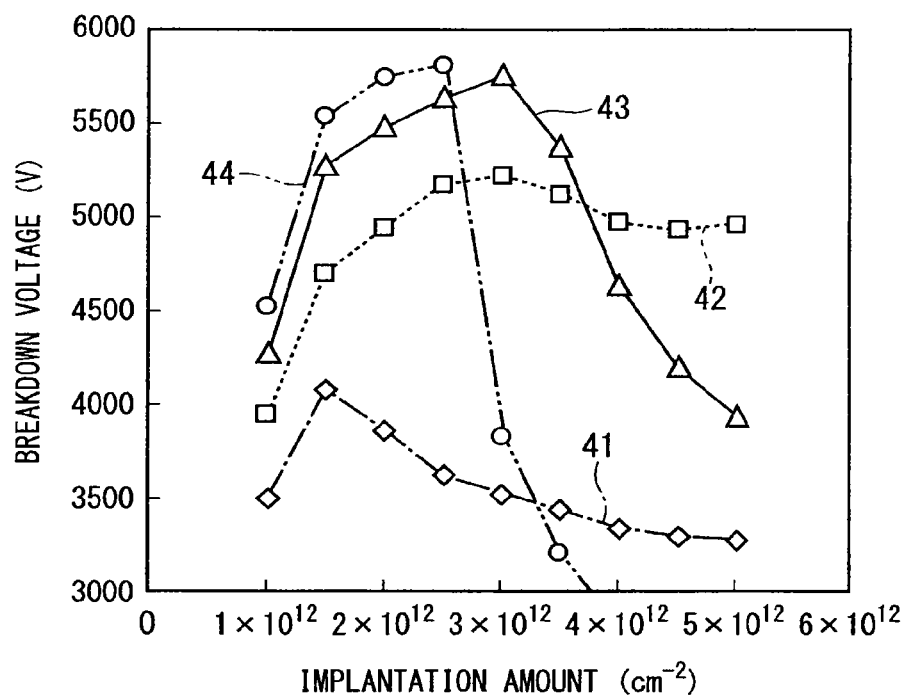
FIG. 9 is a graph illustrating a simulation result regarding a dependence of breakdown voltage on the implantation amount in the semiconductor device 1 of the first embodiment of the present invention.

Next, heat treatment time will be described. FIG. 9 is a graph illustrating a simulation result regarding a dependence of the breakdown voltage on the implantation amount in the semiconductor device 1 of the first embodiment of the present invention. In FIG. 9, the vertical axis represents the breakdown voltage (V) in 300 K, and the horizontal axis represents the implantation amount (cm$^{-2}$) in each of the P-type implantation layers 21a to 25a of the electric field buffer layer 13. FIG. 9 illustrates the dependence of the breakdown voltage on the implantation amount when the heat treatment time is a parameter. Here, the number of sets is 35.

Also in FIG. 9, the heat treatment time is represented by the PN junction depth of the electric field buffer layer 13 formed in the heat treatment in the heat treatment time. In FIG. 9, a case where the electric field buffer layer 13 has the PN junction depth of 2 μm is indicated by an alternate long and short dashed line with a symbol "◊" and a reference numeral "41," a case where the electric field buffer layer 13 has the PN junction depth of 4 μm is indicated by a broken line with a symbol "□" and a reference numeral "42," a case where the electric field buffer layer 13 has the PN junction depth of 6 μm is indicated by a solid line with a symbol "Δ" and a reference numeral "43," and a case where the electric field buffer layer 13 has the PN junction depth of 8 μm is indicated by a chain double-dashed line with a symbol "○" and a reference numeral "44."

The breakdown voltage does not reach 5200 V being the target value if the heat treatment time, namely, the PN junction depth of the electric field buffer layer 13 is short as in the cases where the electric field buffer layer 13 has the PN junction depth of 2 μm indicated by the reference numeral "41" and the electric field buffer layer 13 has the PN junction depth of 4 μm indicated by the reference numeral "42." The reason is that the relatively strong electric field concentration occurs at the outer peripheral portion of each of the P-type implantation layers 21a to 25a.

Moreover, the breakdown voltage in the optimal implantation amount of $1.5\times10^{12}$ cm$^{-2}$ to $2.5\times10^{12}$ cm$^{-2}$ is high if the heat treatment time, namely, the PN junction depth of the electric field buffer layer 13 is excessively long as in the case where the electric field buffer layer 13 has the PN junction depth of 8 μm indicated by the reference numeral "44." However, the margin of the implantation amount in which the high breakdown voltage of 5200 V being the target value is obtained becomes narrow. The reason is that the excessively long heat treatment time causes an excessive progress of thermal diffusion, and the discrete distribution of the acceptor ions that is the characteristic of the present invention thus becomes blur, approaching the RESURF layer in the VLD structure disclosed in Non Patent Document 1 and Patent Document 1.

In other words, there is the optimal heat treatment to secure both the high breakdown voltage and the margin of the implantation amount. In the example shown in FIG. 9, the optimal heat treatment is the degree to which the PN junction depth is 6 μm, as indicated by the reference numeral "43." At this time, a range of the implantation amount in which the high breakdown voltage is obtained is $1.5 \times 10^{12}$ $cm^{-2}$ to $3.5 \times 10^{12}$ $cm^{-2}$ in a surface density. The range of the implantation amount corresponds to 1.5 to 3.5 times that of the RESURF condition determined by a semiconductor material forming the semiconductor substrate 11. The RESURF condition is the optimal value of the implantation amount in the RESURF structure that is predetermined for every semiconductor material forming the semiconductor substrate 11.

Therefore, a sum of the surface density of the P-type impurities of each of the P-type implantation layers 21a to 25a in the surface on the one side in the thickness direction of the semiconductor substrate 11 and the surface density of the P-type impurities of each of the P-type diffusion layers 21b to 25b surrounding the P-type implantation layers 21a to 25a in the thickness direction of the semiconductor substrate 11 is preferably greater than or equal to 1.5 times and less than or equal to 3.5 times the RESURF condition predetermined for every semiconductor material forming the semiconductor substrate 11.

Again, as seen from FIGS. 7 to 9, the semiconductor device 1 of this embodiment can obtain no high breakdown voltage as long as the number of P-type implantation layers 21a to 25a included in the electric field buffer layer 13, namely, the number of sets increases to diffuse the electric field concentrations by the number of P-type implantation layers 21a to 25a while the electric field concentration at the end portion of each of the P-type implantation layers 21a to 25a is relieved by performing the appropriate thermal diffusion.

Here, the attention is focused on the width (hereinafter referred to as an "innermost P-type implantation layer interval" in some cases) s2 of the interlayer region located on the innermost side. If the innermost P-type implantation layer interval s2 is too small, no electric field concentrations occur at the bottom end portion of the P-type implantation layer 21a connected to the P-base layer 12, resulting in the same state as that having one less P-type implantation layer. On the other hand, if the innermost P-type implantation layer interval s2 is too great, a capacitive coupling between the P-type implantation layer 21a connected to the P-base layer 12 and the P-type implantation layer 22a on the outer side next to the P-type implantation layer 21a is too small, resulting in the insufficient relief from the electric field concentration at the bottom end portion of the P-type implantation layer 21a connected to the P-base layer 12. In other words, the innermost P-type implantation layer interval s2 has the optimal value.

In the semiconductor device 1 of this embodiment, the optimal value of the innermost P-type implantation layer interval s2 is nearly equal to the thermal diffusion length. Therefore, to achieve the optimal value of the innermost P-type implantation layer interval s2, the innermost first P-type diffusion layer 21b needs to be at least in contact with the second P-type diffusion layer 22b on the outer side next to the P-type diffusion layer 21b or part of the innermost first P-type diffusion layer 21b needs to overlap part of the second P-type diffusion layer 22b on the outer side next to the first P-type diffusion layer 21b.

In other words, the first P-type diffusion layer 21b that surrounds the first P-type implantation layer 21a being the innermost high-concentration impurity layer needs to be formed to be connected to at least the second P-type diffusion layer 22b that surrounds the second P-type implantation layer 22a formed on the outer side next to the first P-type implantation layer 21a M the radial direction of the electric field buffer layer 13. In addition to the second P-type diffusion layer 22b, the first P-type diffusion layer 21b may be formed to be connected to at least one or the plurality of P-type diffusion layers 23b and 24b of the P-type diffusion layers 23b to 25b except for the outermost P-type diffusion layer 25b, the P-type diffusion layers 23b to 25b being formed outside the second P-type diffusion layer 22b in the radial direction.

Moreover, as described above, the excessive progress in the thermal diffusion causes the electric field buffer layer 13 to approach the RESURF layer in the VLD structure of the conventional technology, and thus the margin of the implantation amount in which the high breakdown voltage is obtained becomes narrow, whereby the wide margin of the implantation amount that is the effect of the semiconductor device 1 of this embodiment cannot be obtained. To obtain the wide margin of the implantation amount, at least the fifth P-type diffusion layer 25b located on the outermost side needs to be formed at an interval from the fourth P-type diffusion layer 24b on the inner side next to the fifth P-type diffusion layer 25b.

Not only the fifth P-type diffusion layer 25b, at least one or the plurality of P-type diffusion layers 23b and 24b of the P-type diffusion layers 22b to 24b except for the P-type diffusion layer 22b on the outer side next to the innermost P-type diffusion layer 21b may also be formed at the interval from the P-type diffusion layers 22b and 23b formed on the inner side next to the P-type diffusion layers 23b and 24b in the radial direction, the P-type diffusion layers 22b to 24b being formed inside the fifth P-type diffusion layer 25b in the radial direction.

To obtain the high breakdown voltage and the wide margin of the implantation amount more reliably, it is necessary to appropriately design how many P-type diffusion layers from the innermost side are formed to be connected to each other and how many P-type diffusion layers from the outermost side are formed with an interval therebetween.

Figure 10:
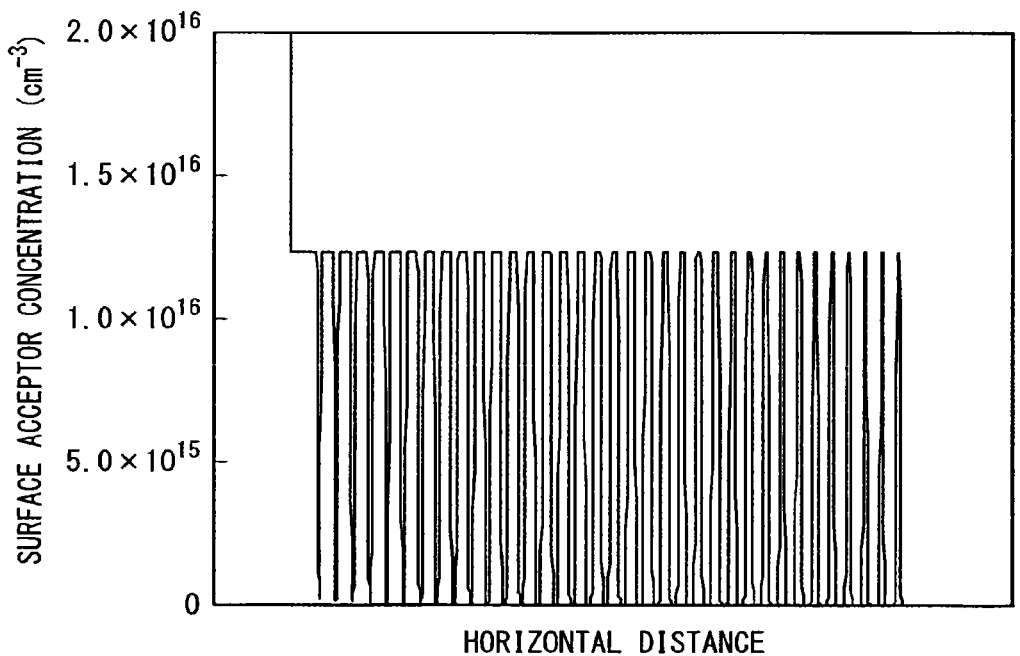
FIG. 10 is a graph illustrating a planar distribution of a surface acceptor concentration of the semiconductor device 1 in the first embodiment of the present invention.

FIG. 10 is a graph illustrating a planar distribution of a surface acceptor concentration of the semiconductor device 1 in the first embodiment of the present invention. In FIG. 10, the vertical axis represents the surface acceptor concentration ($cm^{-3}$), and the horizontal axis represents the horizontal distance. FIG. 10 illustrates the distribution of the surface acceptor concentration in a case where the number of sets included in the electric field buffer layer 13 is 35, the electric field buffer layer 13 has the PN junction depth of 6

μm, and the implantation amount of $2.5 \times 10^{12}$ cm$^{-2}$ is in each of the P-type implantation layers 21a to 25a of the electric field buffer layer 13.

As clearly seen from FIG. 10, as long as the heat treatment causes the electric field buffer layer 13 to have the PN junction depth of 6 μm as described above, the discrete distribution of the acceptor ions being the characteristic of the present invention is sufficiently maintained even if the plurality of P-type implantation layers 21a and 22a formed with the interval therebetween are connected to the P-type diffusion layers 21b and 22b in part of the electric field buffer layer 13 close to the active region 12.

Figure 11:
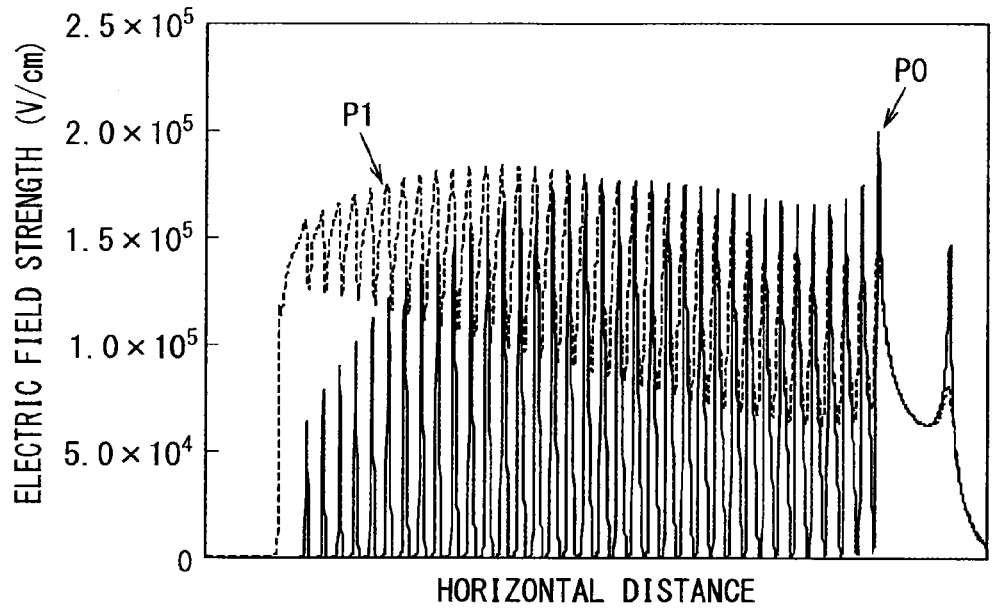
FIG. 11 is a graph illustrating a simulation result of electric field distributions in the semiconductor device 1 of the first embodiment of the present invention.

FIG. 11 is a graph illustrating a simulation result of electric field distributions in the semiconductor device 1 of the first embodiment of the present invention. In FIG. 11, the vertical axis represents an electric field strength (V/cm), and the horizontal axis represents the horizontal distance. FIG. 11 illustrates the electric field distributions of a substrate surface P0 and the vicinity of the PN junction depth P1 in a case where the voltage of 4500 V is applied to the semiconductor device 1 including the electric field buffer layer 13 having the distribution of the acceptor ions shown in FIG. 10. In this embodiment, the electric field concentrations occur in the substrate surface P0 or in the vicinity of the PN junction depth P1, and it is clear that each of all the P-type implantation layers 21a to 25a has the maximum electric field of approximately 0.2 MV/cm, namely, approximately $2.0 \times 10^5$ V/cm that is almost uniformly distributed.

Figure 12:
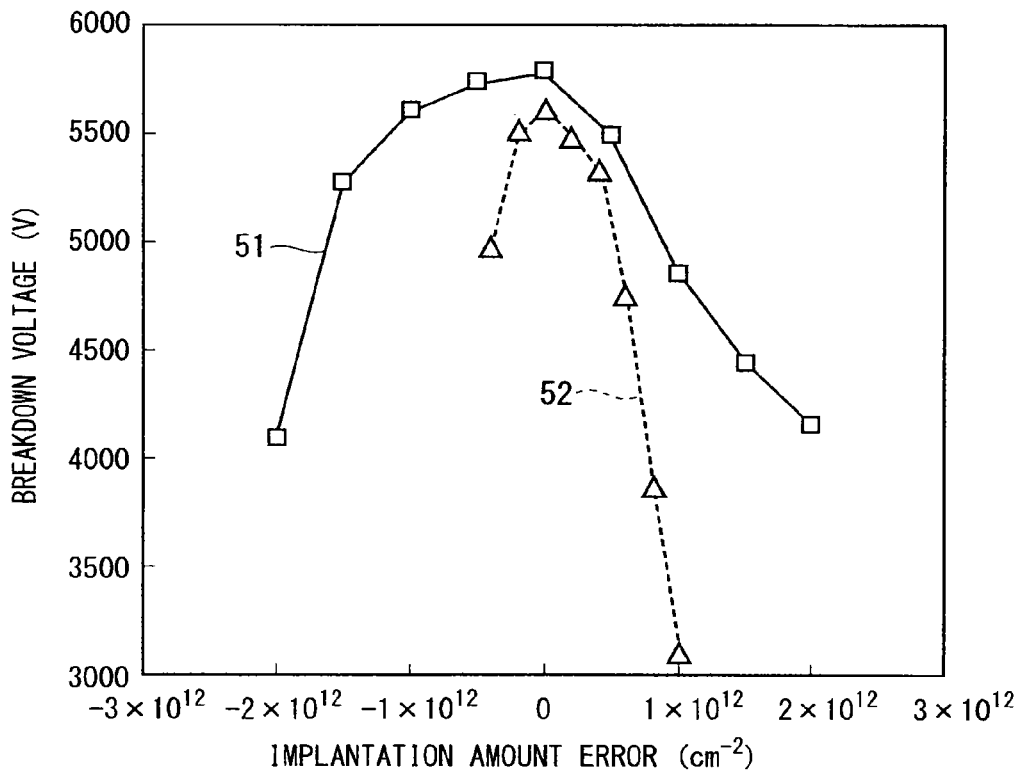
FIG. 12 is a graph illustrating simulation results regarding a margin of the implantation amount in the semiconductor device 1 of the first embodiment of the present invention.

Hereinafter, the semiconductor device 1 of this embodiment is compared to the semiconductor device including the RESURF layer in the VLD structure of the conventional technology. FIGS. 12 and 13 are graphs illustrating simulation results regarding the margin of the implantation amount in the semiconductor device 1 of the first embodiment of the present invention.

In FIG. 12, the vertical axis represents the breakdown voltage (V) in 300 K, and the horizontal axis represents an implantation amount error (cm$^{-2}$). Here, the "implantation amount error" denotes a difference between the implantation amount and an implantation amount in which the maximum breakdown voltage is obtained. In FIG. 13, the vertical axis represents the breakdown voltage (V) in 300 K, and the horizontal axis represents a ratio (%) of the implantation amount error. Here, the "ratio of the implantation amount error" denotes a proportion of the implantation amount in which the maximum breakdown voltage is obtained to an absolute value of the implantation amount error. In FIGS. 12 and 13, the implantation amount greater than the implantation amount in which the maximum breakdown voltage is obtained is indicated by positive (+), and the implantation amount smaller than the implantation amount in which the maximum breakdown voltage is obtained is indicated by negative (−).

In FIG. 12, the simulation result of the semiconductor device 1 of this embodiment is indicated by a solid line with a symbol "□" and a reference numeral "51," and the simulation result of the semiconductor device of the conventional technology is indicated by a broken line with a symbol "Δ" and a reference numeral "52". In FIG. 13, the simulation result of the semiconductor device 1 of this embodiment is indicated by a solid line with a symbol "□" and a reference numeral "55," and the simulation result of the semiconductor device of the conventional technology is indicated by a broken line with a symbol "Δ" and a reference numeral "56."

In the examples shown in FIGS. 12 and 13, the implantation amount in which the maximum breakdown voltage is obtained in the semiconductor device 1 of this embodiment is $3.0 \times 10^{12}$ cm$^{-2}$, and the implantation amount of $1.4 \times 10^{12}$ cm$^{-2}$ in the innermost RESURF layer in the radial direction is used as the implantation amount in which the maximum breakdown voltage is obtained in the semiconductor device including the RESURF layer in the VLD structure of the conventional technology.

The implantation amount at a level of $1 \times 10^{12}$ cm$^{-2}$ is close to a control lower limit of an ion implanter, so that a manufacturing variation easily occurs. Moreover, an interface charge of the order of $10^{11}$ cm$^{-2}$ is also generated in an interface between Si and an oxide film. Therefore, it is also important to observe the implantation amount error in the absolute value. As shown in FIG. 12, the margin of the implantation amount observed in the absolute value in this embodiment is greater than or equal to three times as wide as that in the conventional technology. Thus, it can be said that the semiconductor device 1 of this embodiment is resistant to the manufacturing variation due to the control lower limit of the ion implanter as described above.

Moreover, with regard to the ratio of the implantation amount error shown in FIG. 13, the margin of the implantation amount is wider in the semiconductor device 1 of this embodiment. The reason is how the depletion layer in the substrate surface expands.

Figure 14:
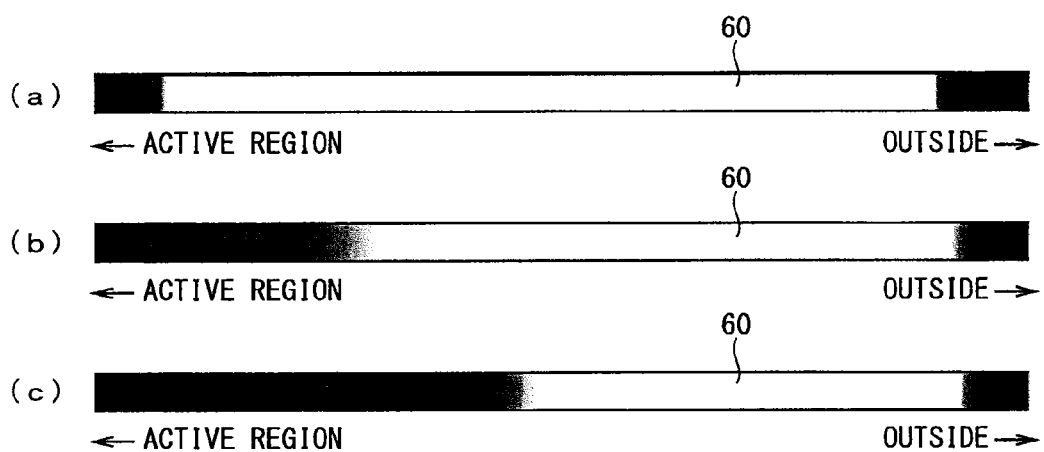
FIG. 14 is an image illustrating a simulation result regarding a distribution of a depletion layer in a substrate surface in a semiconductor device of the conventional technology.
Figure 15:
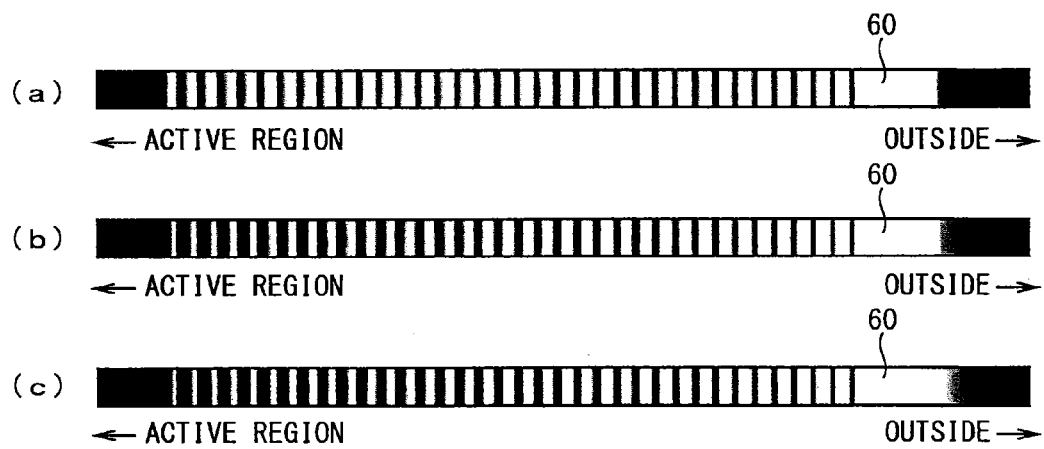
FIG. 15 is an image illustrating a simulation result regarding a distribution of a depletion layer in a substrate surface in the semiconductor device 1 of the first embodiment of the present invention.

FIG. 14 is an image illustrating a simulation result regarding a distribution of a depletion layer in a substrate surface in the semiconductor device of the conventional technology. FIG. 15 is an image illustrating a simulation result regarding a distribution of the depletion layer in the substrate surface in the semiconductor device 1 of the first embodiment of the present invention. FIGS. 14 and 15 illustrate an expansion of the depletion layer in the substrate surface in a case where the voltage of 4500 V is applied between the anode electrode and the cathode electrode of the semiconductor device. In FIGS. 14 and 15, a white portion with a reference numeral "60" indicates a depletion layer. The depletion layer 60 maintains the high voltage applied to the substrate surface.

Here, the optimal implantation amount in the semiconductor device 1 of this embodiment is $2.5 \times 10^{12}$ cm$^{-2}$, and the optimal implantation amount of $1.4 \times 10^{12}$ cm$^{-2}$ in the innermost RESURF layer in the VLD structure is used as the optimal implantation amount in the semiconductor device including the RESURF layer in the VLD structure of the conventional technology.

Part (b) of FIG. 14 and part (b) of FIG. 15 illustrate simulation results in a case of the optimal implantation amount. Part (a) of FIG. 14 and part (b) FIG. 15 illustrate simulation results in a case where the implantation amount is smaller than the optimal implantation amount and the ratio of the implantation amount error is 33.3%. Part (c) of FIG. 14 and part (c) of FIG. 15 illustrate simulation results in a case where the implantation amount is greater than the optimal implantation amount and the ratio of the implantation amount error is 33.3%.

In the case of the semiconductor device including the RESURF layer in the VLD structure of the conventional technology as shown in part (a) of FIG. 14, if the implantation amount is smaller than the optimal implantation amount, the RESURF layer is completely depleted before reaching a desired voltage and the electric field concentration significantly occurs at the outer peripheral portion of the active region 12, causing an avalanche breakdown. As shown in part (c) of FIG. 14, if the implantation amount is greater than the optimal implantation amount, the RESURF layer on the active region 12 side is not depleted to the outermost surface and a region that maintains the high voltage generated in the substrate surface becomes narrow, causing a decrease in the breakdown voltage.

In contrast, in the semiconductor device 1 of this embodiment as shown in part (a) of FIG. 15 to part (c) FIG. 15, the depletion layer expands to the outermost surface in the diffusion layer and the region without the impurities implanted, and fluctuations in the implantation amount do not greatly change this state. The reason is that the implantation layer is not completely depleted even if the implantation amount is slightly smaller than the optimal implantation amount, and the diffusion layer can be sufficiently and completely depleted even if the implantation amount is slightly greater than the optimal implantation amount. In other words, the semiconductor device 1 of this embodiment overcomes the shortcomings of the semiconductor device of the conventional technology.

The semiconductor device 1 of this embodiment having the characteristics of such expansion of the depletion layer achieves effects, which have not conventionally been known. Specifically, as compared in the same application voltage, the semiconductor device 1 of this embodiment has the maximum electric field inside the semiconductor substrate slightly greater than that of the semiconductor device including the RESURF layer in the VLD structure of the conventional technology. Nevertheless, as shown in FIGS. 12 and 13, the semiconductor device 1 of this embodiment can obtain, under the optimal conditions, the breakdown voltage higher than that of the semiconductor device including the RESURF layer in the VLD structure of the conventional technology. One of the causes is that in the semiconductor device 1 of this embodiment, the depletion layer divides a path for leakage current, and specifically, a path for positive holes (holes) generated by impact ionization to the P-base layer (active region) 12.

The description above focuses on the surface and the inside of the semiconductor substrate, and the present invention also has an effect of reducing an electric field outside the semiconductor device. The effect of reducing the electric field outside the semiconductor device is brought to the fore in a case where the implantation amount is set greater than the optimal implantation amount. An electric field in a surface of a passivation film is particularly important in the electric fields outside the semiconductor device. The passivation film is formed on the termination structure, namely, on the electric field buffer layer 13 and the stopper layer 14 forming the termination structure. As the electric field in the surface of the passivation film increases, a creeping discharge in an atmosphere easily occurs.

FIGS. 14 and 15 described above illustrate the white portion indicated by the reference numeral "60" as the depletion layer, and it can also be said that the white portion is a place from which the electric field leaks externally. In other words, in the conventional technology, the electric field does not leak externally from the surface of the RESURF layer close to the active region, so that the electric field in the surface of the passivation film is easily biased to the outside.

In contrast, in the present invention, the places from which the electric field leaks externally are spread out, so that the electric field in the surface of the passivation film is hardly biased. As shown in FIG. 11, the surface electric field of the present invention has a sharp peak in a spike shape, and thus the passivation film preferably has a thickness of greater than or equal to several μm to slacken the peak of the electric field.

FIG. 16 is a graph illustrating a simulation result regarding a maximum electric field in the surface of the passivation film. In FIG. 16, the vertical axis represents the maximum electric field in the surface of the passivation film (hereinafter referred to as a "passivation film surface electric field" in some cases) in the case where the voltage of 4500 V is applied between the anode electrode 15 and the cathode electrode 17 of the semiconductor device 1, and the horizontal axis represents the ratio of the implantation amount error (%). A value of the passivation film surface electric field increases as it goes upward of the page space on the vertical axis of FIG. 16. In FIG. 16, a case of the semiconductor device of this embodiment is indicated by a solid line with a symbol "□" and a reference numeral "61," and a case of the semiconductor device of the conventional technology is indicated by a broken line with a symbol "Δ" and a reference numeral "62."

As clearly seen from FIG. 16, in the semiconductor device 1 of this embodiment compared to the semiconductor device of the conventional technology, the passivation film surface electric field is insensitive to the implantation amount error. It is clear that the semiconductor device 1 of this embodiment has a great advantage over the semiconductor device of the conventional technology particularly in a region having a relatively great ratio of the implantation amount error, namely, a region having a relatively great implantation amount.

Furthermore, the way of expansion of the depletion layer when the voltage rises from a zero voltage is completely different between the semiconductor device of this embodiment and the semiconductor device including the RESURF layer in the VLD structure, which is the semiconductor device of the conventional technology.

Figure 17:
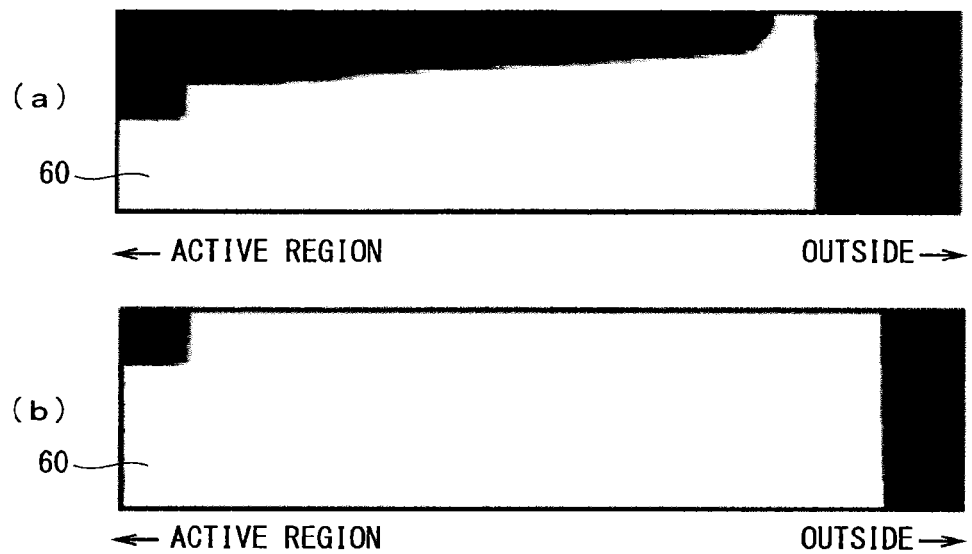
FIG. 17 is an image illustrating simulation results regarding a distribution of the depletion layer of a substrate section in the semiconductor device of the conventional technology.
Figure 18:
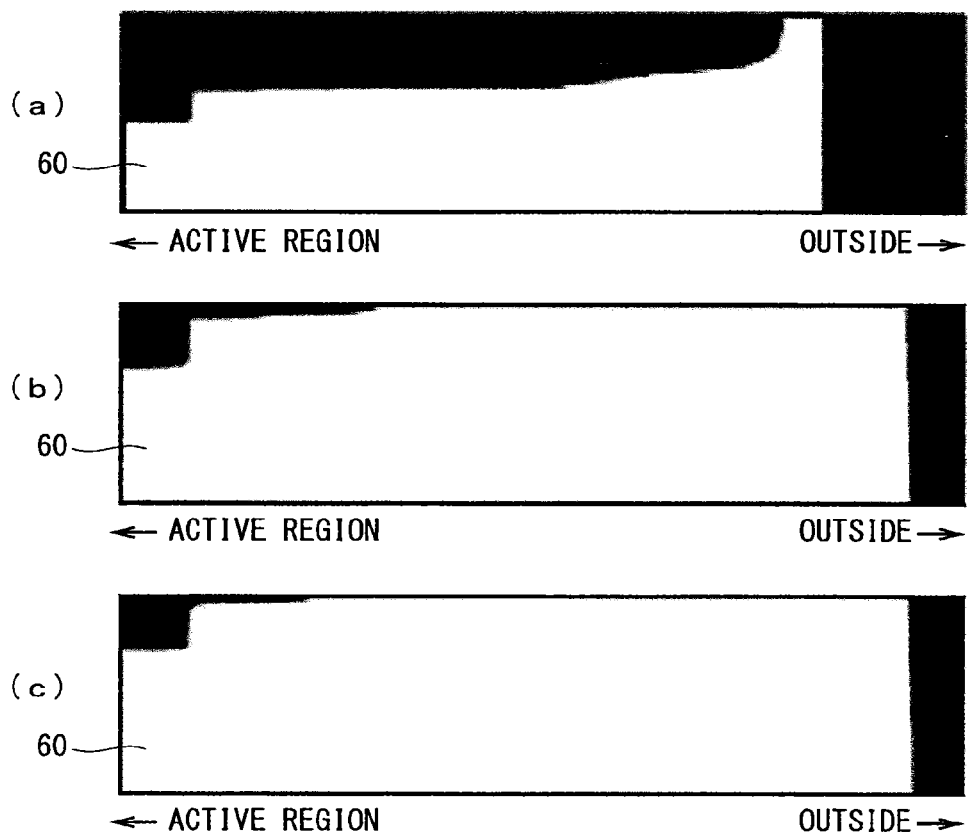
FIG. 18 is an image illustrating simulation results regarding the distribution of the depletion layer of the substrate section in the semiconductor device of the conventional technology.
Figure 20:
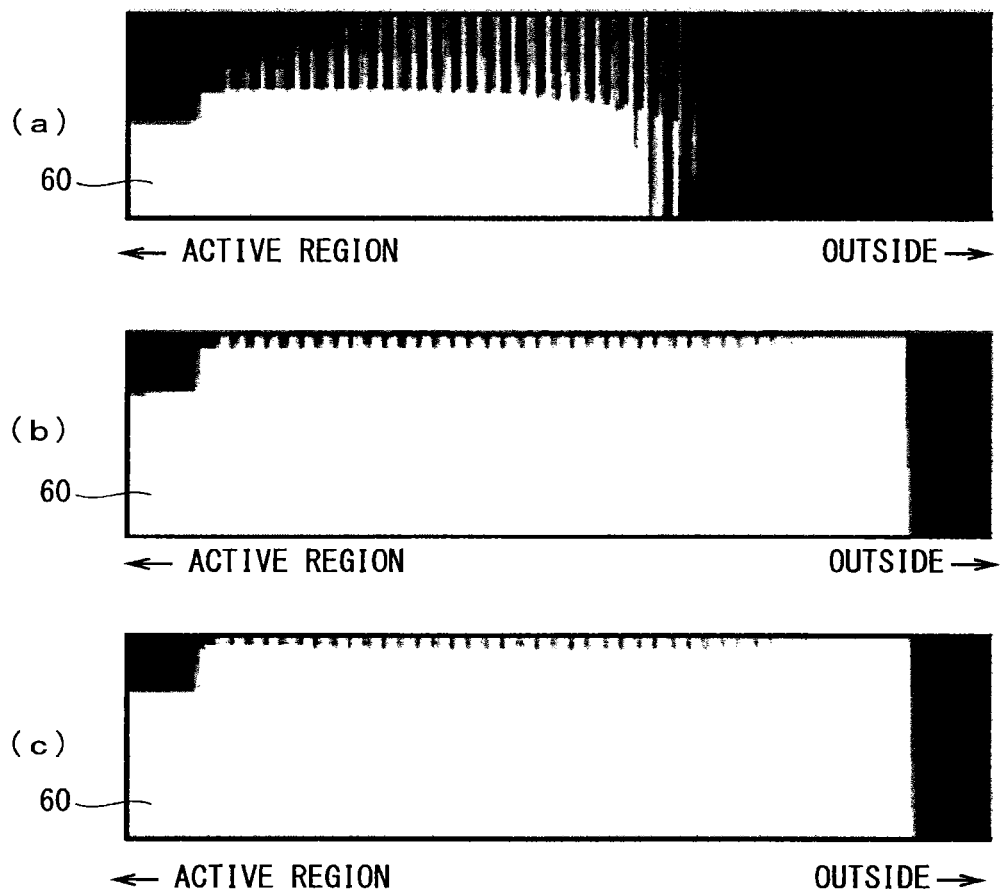
FIG. 20 is an image illustrating simulation results regarding a distribution of the depletion layer of a substrate section in the semiconductor device 1 of the first embodiment of the present invention.
Figure 21:
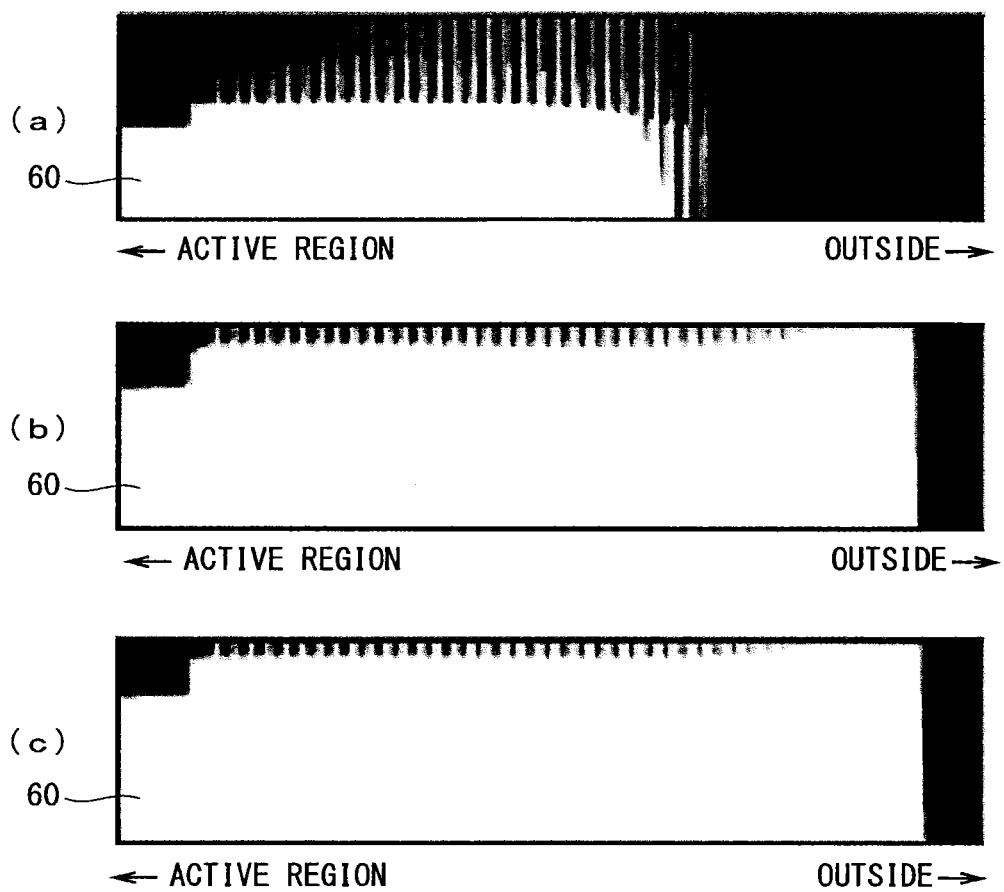
FIG. 21 is an image illustrating simulation results regarding the distribution of the depletion layer of the substrate section in the semiconductor device 1 of the first embodiment of the present invention.
Figure 22:
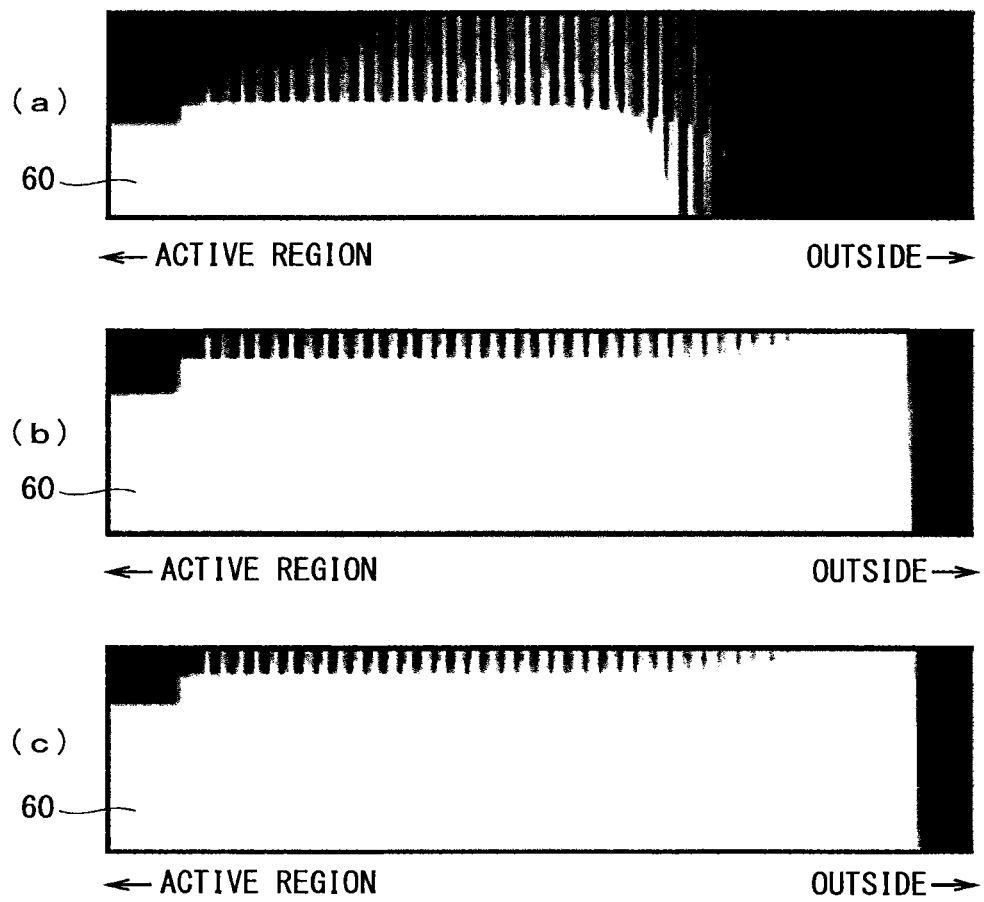
FIG. 22 is an image illustrating simulation results regarding the distribution of the depletion layer of the substrate section in the semiconductor device 1 of the first embodiment of the present invention.

FIGS. 17 to 19 are images illustrating simulation results regarding a distribution of the depletion layer of a substrate section in the semiconductor device of the conventional technology. FIGS. 20 to 22 are images illustrating simulation results regarding a distribution of the depletion layer of a substrate section in the semiconductor device 1 of the first embodiment of the present invention.

FIGS. 17 to 22 illustrate expansion of the depletion layer of the substrate section in cases where a voltage of 100 V, 4500 V, or 5200 V is applied between the anode electrode 15 and the cathode electrode 17 of the semiconductor devices. Part (a) of FIG. 17, part (a) FIG. 18, part (a) of FIG. 19, part (a) of FIG. 20, part (a) of FIG. 21, and part (a) of FIG. 22 illustrate the results in the case where the voltage of 100 V is applied. Part (b) of FIG. 17, part (b) of FIG. 18, part (b) of FIG. 19, part (b) of FIG. 20, part (b) FIG. 21, and part (b) of FIG. 22 illustrate the results in the case where the voltage of 4500 V is applied. Part (c) of FIG. 18, part (c) of FIG. 19, part (c) of FIG. 20, part (c) of FIG. 21, and part (c) of FIG. 22 illustrate the results in the case where the voltage of 5200 V is applied.

Moreover, the images shown in FIGS. 18 and 21 illustrate the simulation results in a case of the optimal implantation amount. The images shown in FIGS. 17 and 20 illustrate the simulation results in a case where the implantation amount is smaller than the optimal implantation amount and the ratio of the implantation amount error is 33.3%. The images shown in FIGS. 19 and 22 illustrate the simulation results in a case where the implantation amount is greater than the optimal implantation amount and the ratio of the implantation amount error is 33.3%.

In FIGS. 17 to 22, the white portion with the reference numeral "60" indicates the depletion layer. The depletion layer 60 maintains the voltage applied to the semiconductor device. FIGS. 17 to 22 illustrate the simulation results in a state where the breakdown voltage increases in an atmosphere at the temperature of 125 C. ° in which the semiconductor device is disposed.

In the conventional technology, as shown in FIGS. 17 to 19, the depletion layer 60 in the substrate outermost surface expands inwardly from the outermost portion of the electric field buffer layer. In contrast, in the present invention, as shown in FIGS. 20 to 22, the depletion layer 60 in the substrate outermost surface starts to expand from a place in which the P-type diffusion layers are not connected to each other, namely, the place in which an N-type region appears in the substrate outermost surface outside the P-base layer for the first time, and then the depletion layer 60 discretely expands from the place as the center.

Then, in the semiconductor device 1 of this embodiment, as shown in part (a) of FIG. 20 to part (c) of FIG. 20, part (a) FIG. 21 to part (c) of FIG. 21, and part (a) of FIG. 22 to part (c) of FIG. 22, all of the diffusion layers are depleted almost to the substrate outermost surface in a stage in which the voltage is relatively low. As a result, as compared to the conventional technology, the semiconductor device 1 of this embodiment can greatly reduce the electric field leaking externally even in the voltage lower than a rated voltage.

Figure 23:
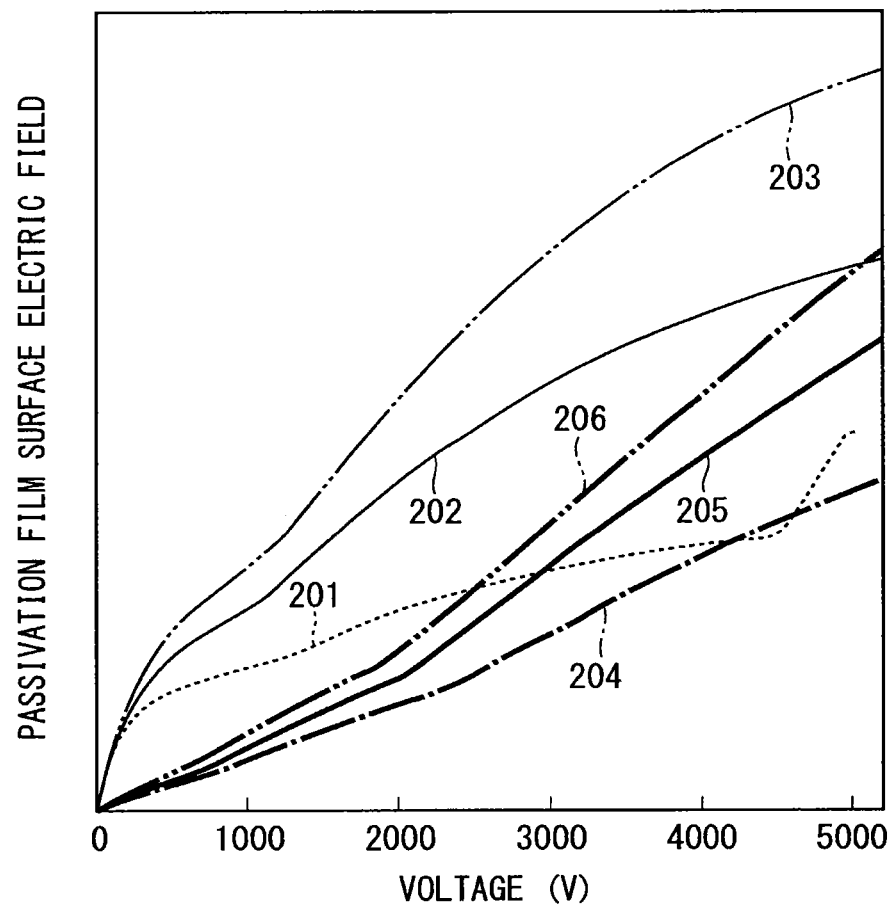
FIG. 23 is a graph illustrating a simulation result regarding the maximum electric field in the surface of the passivation film.

FIG. 23 is a graph illustrating a simulation result regarding the maximum electric field in the surface of the passivation film. In FIG. 23, the vertical axis represents the passivation film surface electric field, and the horizontal axis represents the voltage (V) applied between the anode electrode and the cathode electrode of the semiconductor device. A value of the passivation film surface electric field increases as it goes upward of the page space on the vertical axis of FIG. 23.

In FIG. 23, in the semiconductor device 1 of this embodiment, a case of the optimal implantation amount is indicated by a thick solid line with a reference numeral "205," a case where the implantation amount is smaller than the optimal implantation amount and the ratio of the implantation amount error is 33.3% is indicated by a thick alternate long and short dashed line with a reference numeral "204," and a case where the implantation amount is greater than the optimal implantation amount and the ratio of the implantation amount error is 33.3% is indicated by a thick chain double-dashed line with a reference numeral "206."

Moreover, in FIG. 23, in the semiconductor device of the conventional technology, a case of the optimal implantation amount is indicated by a thin solid line with a reference numeral "202," a case where the implantation amount is smaller than the optimal implantation amount and the ratio of the implantation amount error is 33.3% is indicated by a thin broken line with a reference numeral "201," and a case where the implantation amount is greater than the optimal implantation amount and the ratio of the implantation amount error is 33.3% is indicated by a thin chain double-dashed line with a reference numeral "203." Similarly to FIGS. 17 to 22, FIG. 23 also illustrates the simulation result in the state where the breakdown voltage increases in the atmosphere at the temperature of 125 C. ° in which the semiconductor device is disposed.

As clearly seen from FIG. 23, as compared to the semiconductor device of the conventional technology, the semiconductor device 1 of this embodiment can reduce the maximum electric field in the surface of the passivation film by one-half when one-half of the voltage of 4500 V being the rated voltage, namely, the voltage of 2250 V is applied. This is a great advantage because a power electronics semiconductor device is normally used in a power supply voltage that is approximately one-half of the rated voltage.

In the semiconductor device 1 of this embodiment as described above, the P-type active region 12 is formed away from the outer peripheral portion of the semiconductor substrate 11 in the surface portion on the one side in the thickness direction of the semiconductor substrate 11. The electric field buffer layer 13 having the annular shape is formed from the outer peripheral portion of the active region 12 toward the outer peripheral portion of the semiconductor substrate 11 so as to surround the active region 12.

The electric field buffer layer 13 includes the plurality of P-type implantation layers 21a to 25a formed with the interval therebetween so as to surround the active region 12 and the plurality of P-type diffusion layers 21b to 25b formed so as to surround the P-type implantation layers 21a to 25a. The P-type diffusion layers 21b to 25b have the P-type impurities at a concentration lower than that of the P-type implantation layers 21a to 25a.

The first P-type implantation layer 21a formed on the innermost side in the radial direction of the electric field buffer layer 13 is formed to be in contact with or to partially overlap the active region 12. The interval between the P-type impurity layers 21a to 25a adjacent to each other, namely, the width s of the interlayer region increases toward the outer peripheral portion of the semiconductor substrate 11 from the active region 12.

Moreover, the first P-type diffusion layer 21b that surrounds the first P-type implantation layer 21a is formed to be connected to at least one of the P-type diffusion layers 22b to 25b that surround the other P-type implantation layers 22a to 25a outside the first P-type diffusion layer 21b, and specifically, to the second P-type diffusion layer 22b.

The configuration as described above in the semiconductor device 1 of this embodiment can relatively expand the margin of the implantation amount of the P-type impurities that can achieve the semiconductor device 1 having the relatively high breakdown voltage when the P-type implantation layers 21a to 25a and the P-type diffusion layers 21b to 25b are formed. This can achieve the semiconductor device 1 that is hardly influenced by a variation in a manufacturing process and can be manufactured with a relatively high yield.

Also in the method for manufacturing the semiconductor device of this embodiment, in the mask formation step, the resist mask RM1 is formed on the surface portion on the one side in the thickness direction of the semiconductor substrate 11. The resist mask RM1 is formed to have the pattern with the plurality of openings formed at the intervals in the radial direction, the openings surrounding the portion corresponding to the region in which the active region 12 is formed.

In the ion implantation step, the P-type impurities are ion-implanted in the semiconductor substrate 11 through the resist mask RM1 to form the P-type implantation layers 21a to 25a. The semiconductor substrate 11 in which the P-type impurities have been implanted is heat-treated in the heat treatment step to form the P-type diffusion layers 21b to 25b that surround the P-type implantation layers 21a to 25a.

Thus, the electric field buffer layer 13 including the P-type implantation layers 21a to 25a and the P-type diffusion layers 21b to 25b is formed in the annular shape so as to surround the active region 12 from the outer peripheral portion of the active region 12 toward the outer peripheral portion of the semiconductor substrate 11.

Upon completion of the heat treatment step, the first P-type implantation layer 21a formed on the innermost side in the radial direction of the electric field buffer layer 13 among the P-type implantation layers 21a to 25a being the high-concentration impurity layers is formed to be in contact with or to partially overlap the P-base layer 12 being the active region. The first P-type diffusion layer 21b being the low-concentration impurity layer that surrounds the first P-type implantation layer 21a is formed to be connected to at least one of the low-concentration impurity layers that surround the second to fifth P-type implantation layers 22a to 25a being the other high-concentration impurity layers formed outside the first P-type implantation layer 21a in the radial direction, namely, at least one of the second to fifth P-type diffusion layers 22b to 25b.

Such electric field buffer layer 13 can achieve the semiconductor device 1 having the relatively high breakdown voltage.

Also in the mask formation step, the resist mask RM1 is formed such that the interval between the openings in the radial direction increases from the portion corresponding to the region in which the active region 12 is formed toward the portion corresponding to the outer peripheral portion of the semiconductor substrate 11. This can relatively expand the margin of the implantation amount of the P-type impurities that can achieve the semiconductor device 1 having the relatively high breakdown voltage. Therefore, the semiconductor device 1 that suppresses the influence by the variation in the manufacturing process and has the relatively high breakdown voltage can be manufactured with the relatively high yield.

The P-type diffusion layers 21b to 25b are formed in the heat treatment performed after the ion implantation in which the P-type implantation layers 21a to 25a are formed, eliminating the need to perform the ion implantation to form the P-type diffusion layers 21b to 25b. To achieve the relatively high breakdown voltage, no heat treatment for a long time needs to be performed after the ion implantation. Therefore, the electric field buffer layer 13 capable of achieving the relatively high breakdown voltage as described above can be easily formed.

In the semiconductor device 1 of this embodiment, at least the fifth P-type diffusion layer 25b that surrounds the fifth P-type implantation layer 25a formed on the outermost side in the radial direction of the electric field buffer layer 13 among the P-type implantation layers 21a to 25a is formed at the interval from the fourth P-type diffusion layer 24b that surrounds the fourth P-type implantation layer 24a formed on the inner side next to the fifth P-type implantation layer 25a in the radial direction.

In the semiconductor device 1 of this embodiment, the P-type implantation layers 21a to 25a are formed such that the sum L of the widths s of the interlayer regions between the P-type implantation layers 21a to 25a adjacent to each other and the widths w of the P-type implantation layers 22a to 25a in contact with the outside of the interlayer regions in the radial direction is a predetermined value. Such configuration can achieve the semiconductor device 1 that is excellent in any of the high breakdown voltage, the robustness against the variation in the manufacturing process, and the robustness against the operating environment of the semiconductor device.

In the semiconductor device 1 of this embodiment, the sum of the surface density of the P-type impurities of each of the P-type implantation layers 21a to 25a in the surface on the one side in the thickness direction of the semiconductor substrate 11 and the surface density of the P-type impurities of each of the P-type diffusion layers 21b to 25b surrounding the P-type implantation layers 21a to 25a in the thickness direction of the semiconductor substrate 11 is greater than or equal to 1.5 times and less than or equal to 3.5 times the RESURF condition that is the optimal value for the surface density in the RESURF structure predetermined for every semiconductor material forming the semiconductor substrate 11. Thus, as compared to a case where the surface density of the P-type impurities in the surface portion on the one side in the thickness direction of the P-type implantation layers 21a to 25a is less than 1.5 times the optimal value or exceeds 3.5 times the optimal value, the semiconductor device 1 having the high breakdown voltage can be achieved.

In the semiconductor device 1 of this embodiment, the intervals between the P-type implantation layers 21a to 25a, namely, the widths s of the interlayer regions increase in arithmetic progression from the active region 12 toward the outer peripheral portion of the semiconductor substrate 11. Such configuration can achieve the semiconductor device 1 that is excellent in any of the high breakdown voltage, the robustness against the variation in the manufacturing process, and the robustness against the operating environment of the semiconductor device.

Second Embodiment

Figure 24:
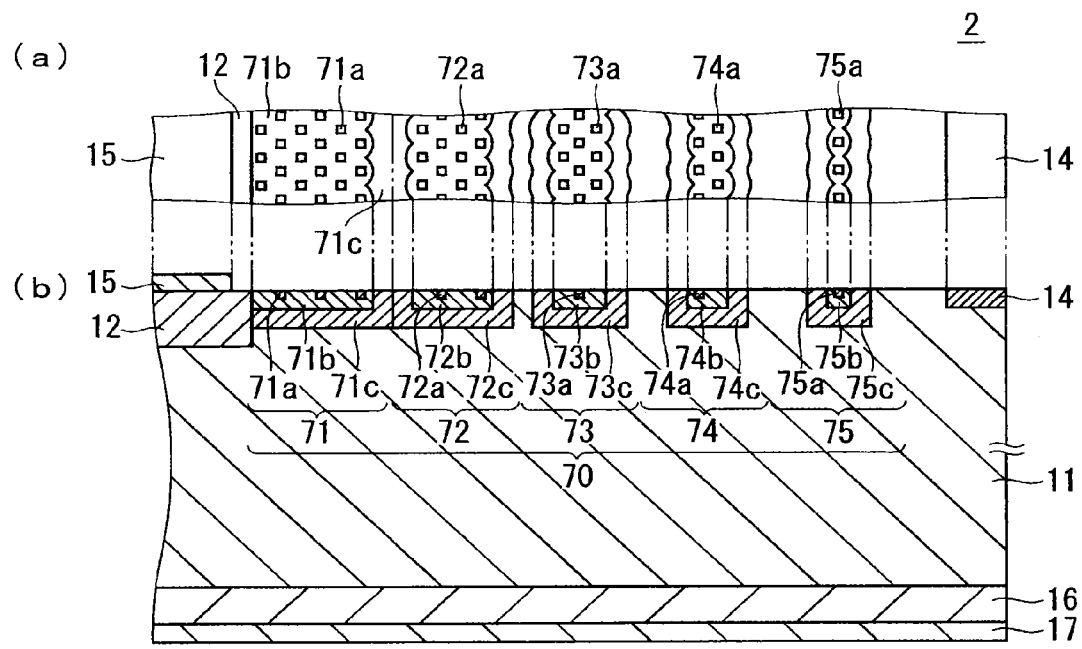
FIG. 24 is a plan view and a cross-sectional view illustrating a configuration of a semiconductor device 2 in a second embodiment of the present invention.

FIG. 24 is a plan view and a cross-sectional view illustrating a configuration of a semiconductor device 2 in a second embodiment of the present invention. FIG. 24(a) is the plan view illustrating the configuration of the semiconductor device 2 in the second embodiment of the present invention, and FIG. 24(b) is the cross-sectional view illustrating the configuration of the semiconductor device 2 in the second embodiment of the present invention.

Also in this embodiment, description will be given of the configuration in the case where the semiconductor device 2 of this embodiment is applied to the PIN diode similarly to the first embodiment. The semiconductor device 2 of this embodiment has the configuration similar to that of the semiconductor device 1 of the first embodiment, so that the same configuration is denoted by the same reference numerals and the common description will be omitted here. FIG. 24 illustrates an enlarged portion of an electric field buffer layer 70 similarly to FIG. 3 as described above.

As shown in FIG. 24, in the semiconductor device 2 of this embodiment similar to the semiconductor device 1 of the first embodiment, the P-base layer 12 being the active region that contains the relatively high concentration of the P-type impurities is formed in the surface portion on the one side in the thickness direction of the semiconductor substrate 11 that contains the relatively low concentration (N⁻) of the N-type impurities. The electric field buffer layer 70 formed of a plurality of P-type impurity layers 71, 72, 73, 74, 75 is formed so as to surround the P-base layer 12.

The electric field buffer layer 70 includes five P-type impurity layers 71, 72, 73, 74, 75, and specifically, a first P-type impurity layer 71, a second P-type impurity layer 72, a third P-type impurity layer 73, a fourth P-type impurity layer 74, and a fifth P-type impurity layer 75.

Each of the P-type impurity layers 71, 72, 73, 74, 75 is configured to include a plurality of P-type impurity layers having different concentrations of the P-type impurities, and specifically, three types of P-type impurity layers 71a to 75a, 71b to 75b, 71c to 75c.

One of the three types of the P-type impurity layers 71a to 75a, 71b to 75b, 71c to 75c includes the P-type implantation layers 71a, 72a, 73a, 74a, 75a that contain the relatively high concentration of the P-type impurities. The other includes the shallow P-type diffusion layers 71b, 72b, 73b, 74b, 75b that are formed to relatively shallow positions from the substrate surface and contain the relatively low concentration of the P-type impurities. The other includes the deep P-type diffusion layers 71c, 72c, 73c, 74c, 75c that are formed to positions deeper than the shallow P-type diffusion layers 71b to 75b from the substrate surface and contain the P-type impurities at a concentration lower than that of the shallow P-type diffusion layers 71b to 75b.

The P-type implantation layers 71a, 72a, 73a, 74a, 75a correspond to local high-concentration regions. The shallow P-type diffusion layers 71b, 72b, 73b, 74b, 75b correspond to the high-concentration impurity layers. The deep P-type diffusion layers 71c, 72c, 73c, 74c, 75c correspond to the low-concentration impurity layers.

The corresponding shallow P-type diffusion layers 71b, 72b, 73b, 74b, 75b are formed so as to surround the P-type implantation layers 71a, 72a, 73a, 74a, 75a, and furthermore, the corresponding deep P-type diffusion layers 71c, 72c, 73c, 74c, 75c are formed so as to surround the shallow P-type diffusion layers 71b, 72b, 73b, 74b, 75b.

The P-type implantation layers 71a to 75a, the shallow P-type diffusion layers 71b to 75b, and the deep P-type diffusion layers 71c to 75c are assumed to be separated in this embodiment for easy understanding although the successive change in the concentration of the P-type impurities does not actually allow to define the boundaries.

Specifically, the high-concentration regions formed by the ion implantation of the P-type impurities in the same ion implantation step as the P-base layer 12 are referred to as the "P-type implantation layers 71a to 75a." Among the regions formed by diffusion of the P-type impurities in the heat treatment after the ion implantation, the regions having almost the same concentration of the P-type impurities as that of the P-type implantation layers in the first embodiment are referred to as the "shallow P-type diffusion layers 71b to 75b," and the other regions having the concentration of the P-type impurities lower than that of the shallow P-type diffusion layers 71b to 75b are referred to as the "deep P-type diffusion layers 71c to 75c." The acceptor ions being the P-type impurities implanted in the P-type implantation layers 71a to 75a spread out concentrically in the heat treatment, so that the surfaces of the P-type implantation layers 71a to 75a have the acceptor ions at a concentration lower than that of the P-base layer 12.

The first P-type impurity layer 71 includes a first P-type implantation layer 71a, a first shallow P-type diffusion layer 71b that surrounds the first P-type implantation layer 71a, and a first deep P-type diffusion layer 71c that surrounds the first shallow P-type diffusion layer 71b.

The second P-type impurity layer 72 includes a second P-type implantation layer 72a, a second shallow P-type diffusion layer 72b that surrounds the second P-type implantation layer 72a, and a second deep P-type diffusion layer 72c that surrounds the second shallow P-type diffusion layer 72b.

The third P-type impurity layer 73 includes a third P-type implantation layer 73a, a third shallow P-type diffusion layer 73b that surrounds the third P-type implantation layer 73a, and a third deep P-type diffusion layer 73c that surrounds the third shallow P-type diffusion layer 73b.

The fourth P-type impurity layer 74 includes a fourth P-type implantation layer 74a, a fourth shallow P-type diffusion layer 74b that surrounds the fourth P-type implantation layer 74a, and a fourth deep P-type diffusion layer 74c that surrounds the fourth shallow P-type diffusion layer 74b.

The fifth P-type impurity layer 75 includes a fifth P-type implantation layer 75a, a fifth shallow P-type diffusion layer 75b that surrounds the fifth P-type implantation layer 75a, and a fifth deep P-type diffusion layer 75c that surrounds the fifth shallow P-type diffusion layer 75b.

The first shallow P-type diffusion layer 71b is formed to be in contact with or to partially overlap the P-base layer 12 outside the P-base layer 12. In this embodiment, as shown in FIG. 24, the first shallow P-type diffusion layer 71b is formed in contact with the P-base layer 12 in the radial direction outside the P-base layer 12. Also as shown in FIG. 24, the second shallow P-type diffusion layer 72b is formed at an interval from the first shallow P-type diffusion layer 71b outside the first shallow P-type diffusion layer 71b. The third shallow P-type diffusion layer 73b is formed at an interval from the second shallow P-type diffusion layer 72b outside the second shallow P-type diffusion layer 72b. The fourth shallow P-type diffusion layer 74b is formed at an interval from the third shallow P-type diffusion layer 73b outside the third shallow P-type diffusion layer 73b. The fifth shallow P-type diffusion layer 75b is formed at an interval from the fourth shallow P-type diffusion layer 74b outside the fourth shallow P-type diffusion layer 74b.

Each of the P-type implantation layers 71a to 75a is formed in a dot shape, and the plurality of dots are periodically disposed in a staggered arrangement as seen from the one side in the thickness direction of the semiconductor substrate 11, forming a P-type implantation layer group in each of the shallow P-type diffusion layers 71b to 75b. In the following description, the P-type implantation layers 71a to 75a are collectively referred to as "P-type implantation layer groups 71a to 75a," and each of the P-type implantation layers forming the P-type implantation layer groups 71a to 75a may be referred to as the "dot."

The electric field buffer layer 70 is configured to include the P-type implantation layer groups 71a to 75a, the shallow P-type diffusion layer 71b to 75b, and the deep P-type diffusion layers 71c to 75c.

The P-type implantation groups 71a, 72a, 73a, 74a, 75a adjacent to each other have intervals formed therebetween, the intervals being greater than the dot intervals. The dot lines, for example, the outermost dot line of a first P-type implantation layer group 71a and the innermost dot line of a second P-type implantation layer group 72a, that are disposed at positions facing each other in the adjacent P-type implantation layer groups in the radial direction keep the relationship of the staggered arrangement, and thus each of the dots is disposed at the position in the staggered format. In this manner, the intervals between the shallow P-type diffusion layers 71b to 75b can be maintained almost constant in the circumferential direction, whereby the local electric field concentration in the circumferential direction can be prevented.

Here, the widths of the shallow P-type diffusion layers 71b to 75b and the intervals between the shallow P-type diffusion layers 71b to 75b in the electric field buffer layer 70 follow the same rules as those for the widths of the P-type implantation layers 21a, 22a, 23a, 24a, 25a and the intervals between the P-type implantation layers in the electric field buffer layer 13 of the first embodiment, respectively. The widths of the shallow P-type diffusion layers 71b, 72b, 73b, 74b, 75b actually fluctuate periodically in the circumferential direction, but an average value of a portion having the greatest width and a portion having the smallest width is assumed to be the widths of the shallow P-type diffusion layers 71b, 72b, 73b, 74b, 75b herein.

The widths w1 to w5 of the P-type implantation layers 21a to 25a in the first embodiment described above can be set to a given value, but the widths of the shallow P-type diffusion layers 71b to 75b in this embodiment can only take a discrete value determined by the number of dot lines of the P-type implantation layer groups 71a to 75a. Therefore, the number of dot lines of the P-type implantation layer groups 71a to 75a is actually gradually reduced toward the outside in the radial direction. In other words, the same set of the number of dot lines in the radial direction may include a plurality of sets thereof, the dot lines determining the widths of the shallow P-type diffusion layers 71b to 75b.

Moreover, the deep P-type diffusion layers 71c to 75c have an expansion such that the first deep P-type diffusion layer 71c is in contact with or overlap the second deep P-type diffusion layer 72c. Similarly to the P-type diffusion layers 21b to 25b of the first embodiment, the deep P-type diffusion layers 71c to 75c expand too much, reducing the effects of the present invention, so that the widths of the deep P-type diffusion layers 71c to 75c are selected as appropriate.

In this embodiment, the P-type implantation layers forming the P-type implantation layer groups 71a to 75a have the dot shape, but when the implantation amount in the P-base layer 12 is not relatively great, for example, the implantation amount of Si of approximately $1 \times 10^{13}$ cm$^{-2}$, the P-type implantation layers forming the P-type implantation layer groups 71a to 75a may have a thin stripe shape. In this case, each of the P-type implantation layer groups 71a to 75a is formed of one or more P-type implantation layers having the thin stripe shape. If the implantation amount in the P-base layer 12 is slightly greater and the acceptor ions to be implanted are thus slightly greater for the stripe shape, the P-type implantation layers having the stripe shape are cut into pieces and openings may be disposed in a grid pattern.

Next, a method for manufacturing the semiconductor device 2 in the second embodiment of the present invention will be described. The method for manufacturing the semiconductor device 2 of this embodiment includes a process of forming the electric field buffer layer 70. The process of forming the electric field buffer layer 70 will be described.

Figure 25:
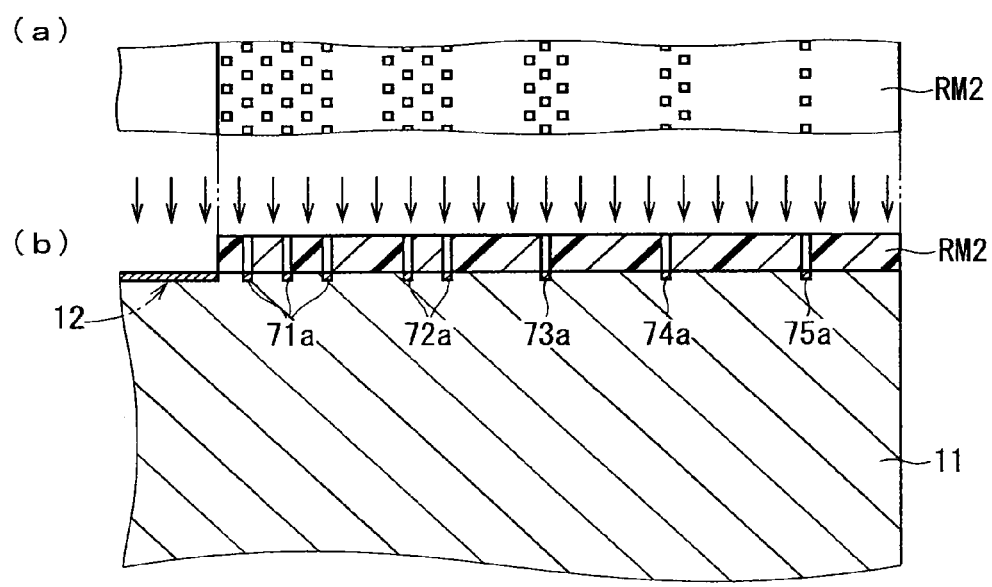
FIG. 25 is a diagram illustrating a state in which an ion implantation is performed using a resist mask RM2.
Figure 26:
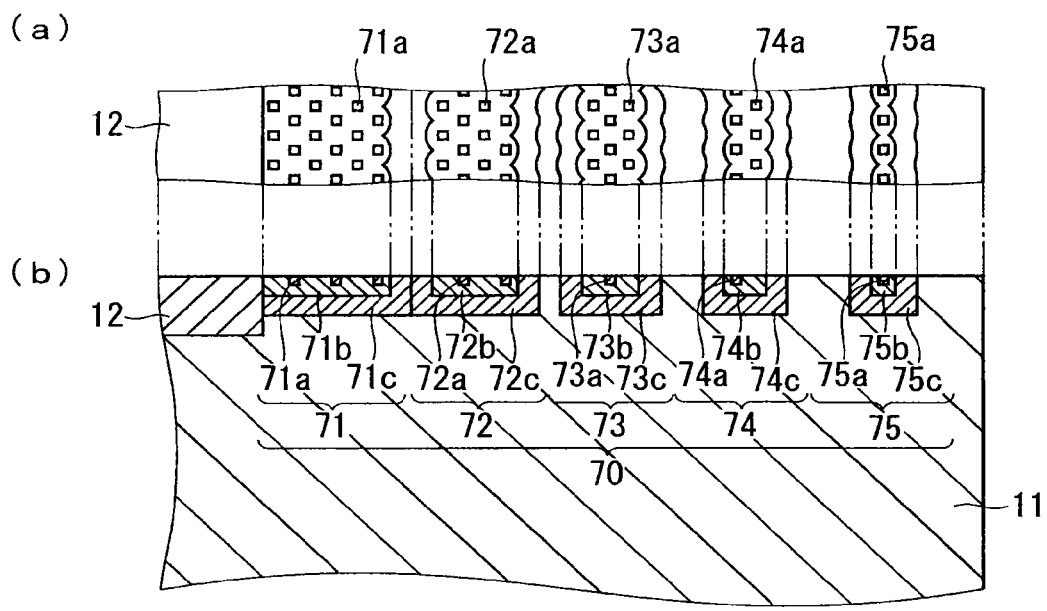
FIG. 26 is a plan view and a cross-sectional view illustrating a state in a stage in which formation of an electric field buffer layer 70 has been completed.

FIG. 25 is a diagram illustrating a state in which an ion implantation is performed using a resist mask RM2. FIG. 25(a) is a plan view illustrating a configuration of the resist mask RM2 as seen from the one side in the thickness direction, and FIG. 25(b) is a cross-sectional view illustrating a state in which the ion implantation is performed using the resist mask RM2. FIG. 26 is a plan view and a cross-sectional view illustrating a state in a stage in which formation of the electric field buffer layer 70 has been completed. FIG. 26(a) is the plan view illustrating the state in the stage in which the formation of the electric field buffer layer 70 has been completed as seen from the one side in the thickness direction, and FIG. 26(b) is the cross-sectional view illustrating the state in the stage in which the formation of the electric field buffer layer 70 has been completed.

As shown in FIG. 25, the resist mask RM2 is formed on the surface portion on the one side in the thickness direction of the semiconductor substrate 11 that contains the relatively low concentration (N−) of the N-type impurities. The resist mask RM2 has a complete opening corresponding to a region in which the P-base layer 12 is formed and has a pattern with openings corresponding to regions in which the P-type implantation layers forming the P-type implantation layer groups 71a, 72a, 73a, 74a, 75a are formed.

Then, P-type impurity ions being the acceptor ions are ion-implanted with relatively low energy from an upper portion of the resist mask RM2, namely, the one side in the thickness direction thereof. At this time, the amount of acceptor ions being implanted corresponds to the implantation amount in the P-base layer 12 being the active region.

Next, after removal of the resist mask RM2, the heat treatment is performed to diffuse the acceptor ions implanted. As a result, as shown in FIG. 26, the P-base layer 12 forming the active region and the electric field buffer layer 70 are formed at the same time. The shallow P-type diffusion layers 71a to 75b are formed in the electric field buffer layer 70 so as to surround the P-type implantation layers forming the P-type implantation layer groups 71a to 75a. Moreover, the deep P-type diffusion layers 71c to 75c are formed so as to surround the shallow P-type diffusion layers 71b to 75b. Here, a distinction between implantation layers and diffusion layers in the P-base layer 12 is not taken into consideration.

Thus, in this embodiment, the P-base layer 12 and the electric field buffer layer 70 are formed at the same time, so that the number of photomasks for photolithography and the manufacturing steps can be reduced as compared to the first embodiment.

Moreover, using such formation technique can gradually change a density of the dots, namely, an aperture ratio of the implantation mask between the P-base layer 12 and the first P-type implantation layer group 71a and can slacken the change in the PN junction depth at the boundary between the P-base layer 12 and the first P-type impurity layer 71. Using this technique eliminates the need to expand the width of the shallow P-type diffusion layer 71b even in a case where a difference in depth between the P-base layer 12 and the deep P-type diffusion layer 71c is great.

The resist mask RM2 is used as the ion implantation mask herein, which is easy, but an oxidation film mask may be used.

Next, description will be given of an effect of applying the semiconductor device 2 of the second embodiment of the present invention to the vertical PIN diode of Si having the breakdown voltage of 4500 V class with reference to FIG. 27 and FIG. 28.

Figure 27:
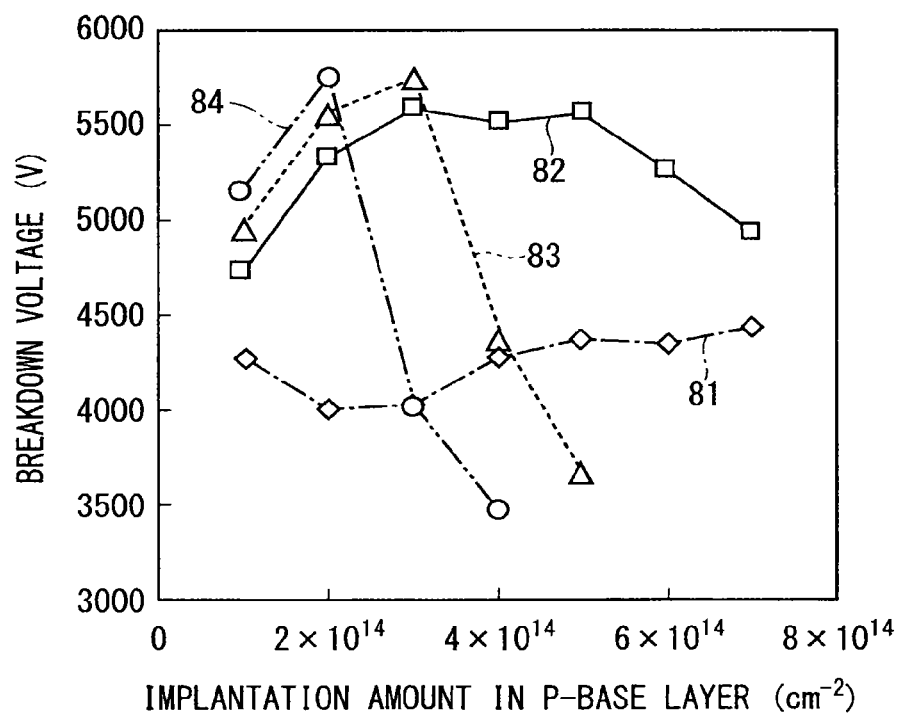
FIG. 27 is a graph illustrating a simulation result regarding a dependence of breakdown voltage on an implantation amount in the semiconductor device 2 of the second embodiment of the present invention.

FIG. 27 is a graph illustrating a simulation result regarding a dependence of breakdown voltage on an implantation amount in the semiconductor device 2 of the second embodiment of the present invention. FIG. 28 is a graph illustrating a simulation result regarding a margin of the implantation amount in the semiconductor device 2 of the second embodiment of the present invention. In FIG. 27, the vertical axis represents the breakdown voltage (V) in 300 K, and the horizontal axis represents the implantation amount (cm$^{-2}$) in the P-base layer 12. In FIG. 28, the vertical axis represents the breakdown voltage (V) in 300 K, and the horizontal axis represents a ratio of an implantation amount error (%).

In the examples shown in FIG. 27 and FIG. 28, the number of sets included in the electric field buffer layer 70 is 35, the dot-shaped openings (hereinafter referred to as "dot openings" in some cases) formed in the portions corresponding to the dots in the implantation mask have a shape of 0.5 μm per side, and dimensions of the unit cell of the staggered arrangement of dots are 2 μm in the radial direction and 5 μm in the circumferential direction.

FIG. 27 illustrates the dependence of the breakdown voltage on the implantation amount when the heat treatment time is a parameter. In FIG. 27 similar to FIG. 9, the heat treatment time is represented by the PN junction depth of the electric field buffer layer 70 formed in the heat treatment in the heat treatment time. In FIG. 27, a case where the electric field buffer layer 70 has the PN junction depth of 4 μm is indicated by an alternate long and short dashed line with a symbol "◇" and a reference numeral "81," a case where the electric field buffer layer 70 has the PN junction depth of 6 μm is indicated by a solid line with a symbol "□" and a reference numeral "82," a case where the electric field buffer layer 70 has the PN junction depth of 8 μm is indicated by a broken line with a symbol "Δ" and a reference numeral "83," and a case where the electric field buffer layer 70 has the PN junction depth of 12 μm is indicated by a chain double-dashed line with a symbol "○" and a reference numeral "84."

In this example similar to the first embodiment, the optimal heat treatment is the degree to which the electric field buffer layer 70 has the PN junction depth of 6 μm. If the heat treatment is weaker, that is, the PN junction is shallower than this, the breakdown voltage decreases. If the heat treatment is too strong, that is, the PN junction is too deep, the margin of the implantation amount in which the high breakdown voltage is obtained becomes narrow even with the high breakdown voltage in the optimal implantation amount.

The reason is that the weak heat treatment strengthen the electric field concentrations at bottom portions of the P-type implantation layer groups 71a to 75a and the shallow P-type diffusion layers 71b to 75b. In addition, the reason is that the excessively strong heat treatment causes an excessive progress of thermal diffusion, and the discrete distribution of the acceptor ions that is the characteristic of the present invention becomes blur, approaching the RESURF layer in the VLD structure disclosed in Non Patent Document 1 and Patent Document 1. The dependence of the breakdown voltage on the implantation amount has a depression in the case where the PN junction depth is 6 μm because the widths of the shallow P-type diffusion layers 71b to 75b can only take a discrete value determined by the number of dot lines of the P-type implantation layer groups 71a to 75a.

Figure 28:
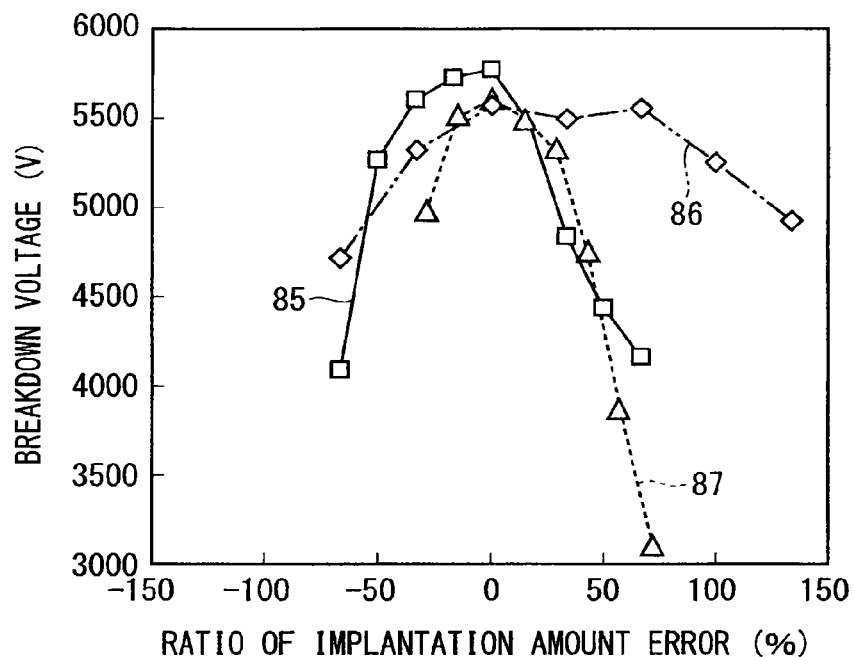
FIG. 28 is a graph illustrating a simulation result regarding a margin of the implantation amount in the semiconductor device 2 of the second embodiment of the present invention.

FIG. 28 illustrates the margins of the implantation amounts in the semiconductor device of the second embodiment of the present invention, the semiconductor device of the first embodiment, and the semiconductor device including the RESURF layer in the VLD structure of the conventional technology. In FIG. 28, the vertical axis represents the breakdown voltage, and the horizontal axis represents the ratio of the implantation amount error, namely, a proportion of the implantation amount in which the maximum breakdown voltage is obtained to an absolute value of the implantation amount error.

In FIG. 28, the simulation result of the semiconductor device 1 of the first embodiment is indicated by a solid line with a symbol "☐" and a reference numeral "85," the simulation result of the semiconductor device of the second embodiment is indicated by a chain double-dashed line with a symbol "◇" and a reference numeral "86," and the simulation result of the semiconductor device of the conventional technology is indicated by a broken line with a symbol "Δ" and a reference numeral "87." It is apparent from FIG. 28 that the second embodiment of the present invention can expand the margin of the implantation amount approximately twice as wide as that of the first embodiment.

With regard to the semiconductor device of the second embodiment and the semiconductor device including the RESURF layer in the VLD structure of the conventional technology, the horizontal axis of FIG. 28 may be replaced with a ratio of an error in an area of a dot opening (hereinafter referred to as a "dot opening area" in some cases). If the dimension of the dot opening is sub μm, a variation in a manufacturing step, and more particularly, a photolithography step easily causes the error of the dot opening area to increase. Using the second embodiment can obtain the margin of the dot opening area greater than or equal to twice as wide as that in the VLD structure of the conventional technology.

The reason why the second embodiment can obtain the margin of the implantation amount wider than that of the first embodiment is that the P-type implantation layers 71a to 75a at the relatively high concentration are surrounded by the shallow P-type diffusion layers 71b to 75b at the relatively low concentration to relieve the electric field concentrations that occur at the bottom portions of the P-type implantation layers 71a to 75a. Moreover, the P-type diffusion layers 71c to 75c at the lower concentration relieve the electric field concentrations that occur at the bottom portions of the shallow P-type diffusion layers 71b to 75b. Therefore, the second embodiment can achieve the margin of the implantation amount wider than that in the first embodiment.

There are the P-type implantation layers 71a to 75a at the relatively high concentration in the semiconductor device 2 of the second embodiment, and the shallow P-type diffusion layers 71b to 75b and the deep P-type diffusion layers 71c to 75c have periodic waves in the circumferential direction, whereby electrical characteristics are shown as follows. The maximum electric field inside the semiconductor is increased by approximately 20% greater than or equal to that of the semiconductor device 1 of the first embodiment. The maximum breakdown voltage is decreased by approximately 3 to 4%, and specifically, approximately 200 V less than or equal to that of the semiconductor device 1 of the first embodiment.

As to the electric field leaking externally from the semiconductor device, the semiconductor device 2 of the second embodiment has the same characteristics as those of the semiconductor device 1 of the first embodiment.

In this embodiment as described above, the shallow P-type diffusion layers 71b to 75b include the P-type implantation layer groups 71a to 75a at the relatively high concentration in the surface portion on the one side in the thickness direction of the shallow P-type diffusion layers 71b to 75b. The P-type implantation layers forming the P-type implantation layer groups 71a to 75a are each disposed periodically in the radial or the circumferential direction, or in the radial direction and the circumferential direction.

Thus, in this embodiment, the P-type implantation layer groups 71a to 75a in which the P-type implantation layers at the relatively high concentration are each disposed periodically in the radial or the circumferential direction, or in the radial direction and the circumferential direction are formed in the surface portion on the one side in the thickness direction of the shallow P-type diffusion layers 71b to 75b. This configuration can periodically change, in the radial or the circumferential direction, or in the radial direction and the circumferential direction of the electric field buffer layer 70, a concentration distribution of the P-type impurities in the surface portion on the one side in the thickness direction of the shallow P-type diffusion layers 71b to 75b. This can further expand the margin of the implantation amount in which the high breakdown voltage is obtained.

Also in this embodiment, the shallow P-type diffusion layers 71b to 75b include the P-type implantation layer groups 71a to 75a in the surface portion on the one side in the thickness direction of the shallow P-type diffusion layers 71b to 75b, the P-type implantation layer groups 71a to 75a containing the P-type impurities at a concentration substantially equal to that of the P-base layer 12 being the active region. Thus, part of manufacturing steps can be omitted, which will be described below.

Also in the mask formation step in the method for manufacturing the semiconductor device of this embodiment, the portion corresponding to the region in which the P-base layer 12 being the active region is formed is open, and the resist mask RM2 is formed such that the portion corresponding to the electric field buffer layer 70 has the openings in the periodic pattern in the radial or the circumferential direction, or in the radial direction and the circumferential direction.

The ion implantation is performed through the resist mask RM2, and the heat treatment is further performed, whereby the P-base layer 12 being the active region and the electric field buffer layer 70 can be formed at the same time. Therefore, the number of manufacturing steps can be reduced.

Third Embodiment

Figure 29:
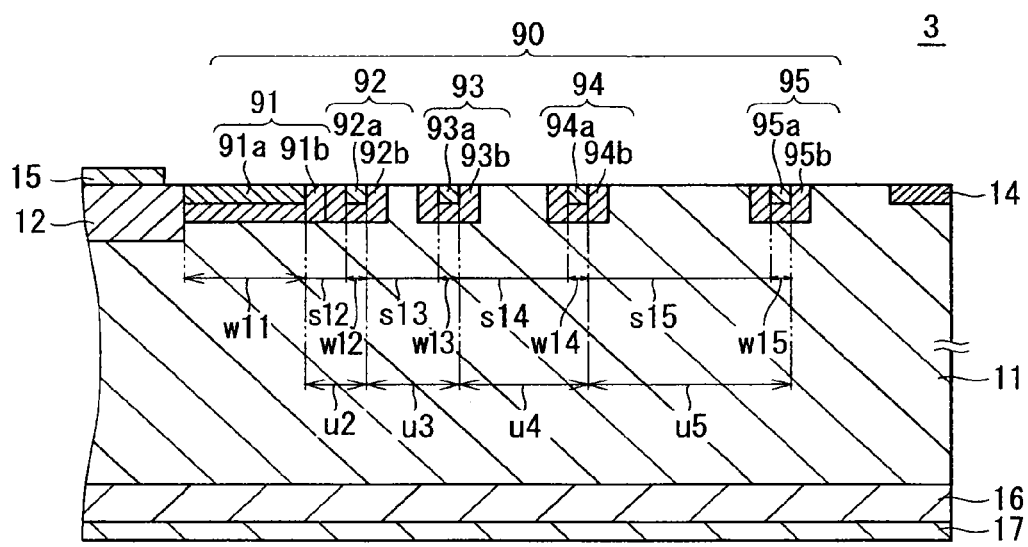
FIG. 29 is a cross-sectional view illustrating a configuration of a semiconductor device 3 in a third embodiment of the present invention.

FIG. 29 is a cross-sectional view illustrating a configuration of a semiconductor device 3 in a third embodiment of the present invention. The semiconductor device 3 of this embodiment has the configuration similar to that of the semiconductor device 1 of the first embodiment, so that the same configuration is denoted by the same reference numerals and the common description will be omitted here. FIG. 29 illustrates an enlarged portion of an electric field buffer layer 90 similarly to FIG. 3 as described above.

As shown in FIG. 29, in the semiconductor device 3 of this embodiment similar to the semiconductor device 1 of the first embodiment, the P-base layer 12 being the active region that contains the relatively high concentration of the P-type impurities is formed in the surface portion on the one side in the thickness direction of the semiconductor substrate 11 that contains the relatively low concentration (N⁻) of the N-type impurities. The electric field buffer layer 90 formed of a plurality of P-type impurity layers 91, 92, 93, 94, 95 is formed so as to surround the P-base layer 12.

The electric field buffer layer 90 includes five P-type impurity layers, and specifically, a first P-type impurity layer 91, a second P-type impurity layer 92, a third P-type impurity layer 93, a fourth P-type impurity layer 94, and a fifth P-type impurity layer 95.

Each of the P-type impurity layers 91 to 95 is configured to include a plurality of P-type impurity layers having different concentrations of the P-type impurities, and specifically, two types of P-type impurity layers 91a to 95a, 91b to 95b. One of the two types of the P-type impurity layers 91a to 95a, 91b to 95b includes the P-type implantation layers 91a to 95a that contain the relatively low concentration of the P-type impurities. The other includes the P-type diffusion layers 91b to 95b that contain the P-type impurities at a concentration lower than that of the P-type impurity layers 91a to 95a.

As compared to the P-type diffusion layers 91b to 95b, the P-type implantation layers 91a to 95a have the P-type impurities at a concentration higher than that of the P-type diffusion layers 91b to 95b. Therefore, in this embodiment, the P-type implantation layers 91a to 95a correspond to the high-concentration impurity layers, and the P-type diffusion layers 91b to 95b correspond to the low-concentration impurity layers.

The P-type implantation layers 91a to 95a and the P-type diffusion layers 91b to 95b are assumed to be separated in this embodiment for easy understanding although the successive change in the concentration of the P-type impurities does not actually allow to define the boundaries. Specifically, the regions formed by the ion implantation of the P-type impurities is assumed to be "P-type implantation layers" separately from the regions as the "P-type diffusion layers" formed by diffusion of the P-type impurities in the heat treatment after the ion implantation.

A first P-type implantation layer 91a is formed to be in contact with or to partially overlap the outside of the P-base layer 12. In this embodiment, as shown in FIG. 29, the first P-type implantation layer 91a is formed in contact with the outside of the P-base layer 12. Also as shown in FIG. 29, a second P-type implantation layer 92a is formed at an interval from the outside of the first P-type implantation layer 91a. A third P-type implantation layer 93a is formed at an interval from the outside of the second P-type implantation layer 92a. A fourth P-type implantation layer 94a is formed at an interval from the outside of the third P-type implantation layer 93a. A fifth P-type implantation layer 95a is formed at an interval from the outside of the fourth P-type implantation layer 94a.

Each of the P-type implantation layers 91a to 95a is surrounded by the corresponding P-type diffusion layers 91b to 95b. The electric field buffer layer 90 is configured to include the P-type implantation layers 91a to 95a and the P-type diffusion layers 91b to 95b.

Here, widths w of the first to fifth P-type implantation layers 91a to 95a in the electric field buffer layer 90 are referred to as w11, w12, w13, w14, w15, respectively. Moreover, widths s of second to fifth interlayer regions being the regions between the P-type implantation layers 91a to 95a adjacent to each other are referred to as s12, s13, s14, s15, respectively.

In this embodiment, the widths w12 to w15 of the second to fourth P-type implantation layers 92a, 93a, 94a, 95a are equal, and w0=w12=w13=w14=w15 where w0 is a constant value. The widths s12 to s15 of the second to fifth interlayer regions gradually expand toward the outside in the radial direction. In other words, s12<s13<s14<s15 holds true.

Also in this embodiment similarly to the first embodiment as described above, pairs of the P-type implantation layers 92a to 95a being the implanted regions except for the first P-type implantation layer 91a and the interlayer regions being the non-implanted regions adjacent to the inside of the P-type implantation layers 92a to 95a in the radial direction are referred to as sets. In this embodiment, a set width is indicated by "u."

A length corresponding to the set widths u of the sets is respectively u2, u3, u4, u5 that are defined as u2=s12+w12=s12+w0, u3=s13+w13=s13+w0, u4=s14+w14=s14+w0, u5=s15+w15=s15+w0. If the w0, s12 are known, u2 is also known.

Next, a process of determining the set widths u3, u4, u5 is shown. Hereinafter, to avoid misinterpretation, the set widths u2, u3, u4, u5 are indicated by u(2), u(3), u(4), u(5), respectively. If A and B are defined as A=implantation amount (cm⁻²)×w1 (μm), B=inclination (cm⁻²·μm⁻¹) of the implantation amount in the RESURF layer in the VLD structure to be artificially imitated in the electric field buffer layer 90, recurrence formulas expressed as the following expression (1) to expression (3) determine u(3), u(4), u(5).

[Math 1]
$$u(3) = \frac{A/u(2) - \sqrt{A^2/u(2)^2 - 4AB}}{2B} \quad (1)$$

[Math 2]
$$u(4) = \frac{A/u(3) - \sqrt{A^2/u(3)^2 - 4AB}}{2B} \quad (2)$$

[Math 3]
$$u(5) = \frac{A/u(4) - \sqrt{A^2/u(4)^2 - 4AB}}{2B} \quad (3)$$

Conditions for the first P-type implantation layer 91*a* and the first to fifth diffusion layers 91*b*, 92*b*, 93*b*, 94*b*, 95*b* are similar to those for the P-type implantation layer 21*a* and the P-type diffusion layers 21*b*, 22*b*, 23*b*, 24*b*, 25*b* of the first embodiment, respectively.

The recurrence formula expressed as the following expression (4) and generalized between u(k−1) and u(k) can be applied to the electric field buffer layer 90 having two or more number of given sets.

[Math 4]
$$u(k) = \frac{A/u(k-1) - \sqrt{A^2/u(k-1)^2 - 4AB}}{2B} \quad (4)$$

The dimensions are determined in this manner, whereby the RESURF layer in the VLD structure in which the implantation amount gradually and linearly decreases toward the outside in the radial direction can be artificially formed even in a case where the widths w11 to w15 of the P-type implantation layers 91*a* to 95*a* except for the layer adjacent to the P-base layer, namely, the first P-type implantation layer 91*a* are constant.

Figure 30:
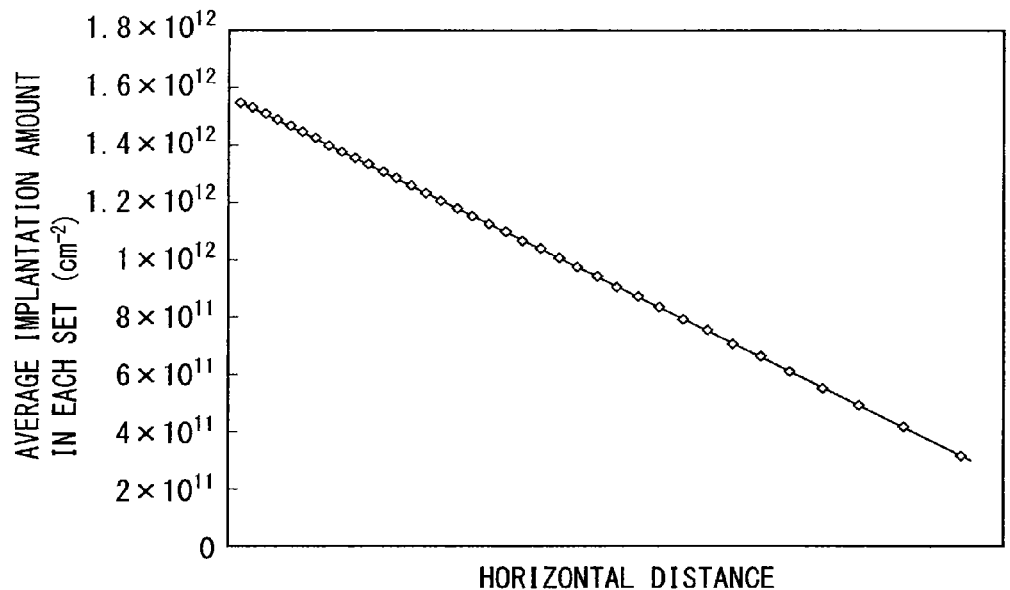
FIG. 30 is a graph illustrating simulation results when the semiconductor device 3 of the third embodiment of the present invention is applied to a vertical PIN diode of Si having a breakdown voltage of 4500 V class.
Figure 31:
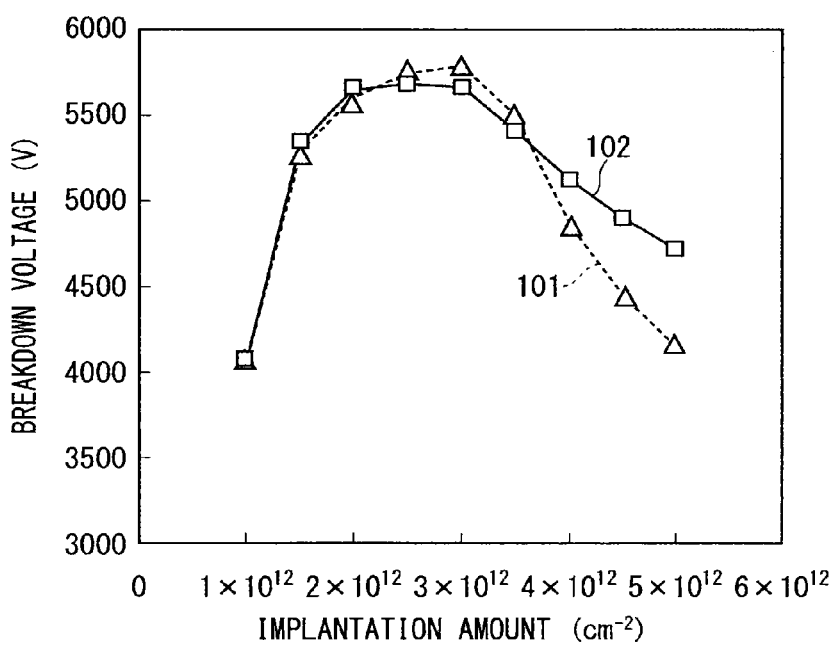
FIG. 31 is a graph illustrating simulation results when the semiconductor device 3 of the third embodiment of the present invention is applied to the vertical PIN diode of Si having the breakdown voltage of 4500 V class.

FIG. 30 and FIG. 31 are graphs illustrating simulation results when the semiconductor device 3 of the third embodiment of the present invention is applied to the vertical PIN diode of Si having the breakdown voltage of 4500 V class. In FIG. 30, the vertical axis represents an average implantation amount (cm$^{-2}$) in each set, and the horizontal axis represents the horizontal distance. In FIG. 31, the vertical axis represents the breakdown voltage (V) in 300 K, and the horizontal axis represents the implantation amount (cm$^{-2}$). In FIG. 31, the simulation result of the semiconductor device 1 of the first embodiment as described above is indicated by a broken line with a symbol "Δ" and a reference numeral "101," and the simulation result of the semiconductor device 3 of the third embodiment is indicated by a solid line with a symbol "□" and a reference numeral "102."

The mentioned-above recurrence formula determines each of the set widths, whereby the electric field buffer layer 90 in which the average implantation amount in each of the sets gradually decreases as shown in FIG. 30 can be obtained.

FIG. 31 compares a dependence of the breakdown voltage on the implantation amount between the third embodiment and the first embodiment. Here, the number of sets in the third embodiment is almost equal to that in the first embodiment. As seen from FIG. 31, in the third embodiment as compared to the first embodiment, the maximum value of the breakdown voltage is decreased by approximately 2 to 3%, and specifically, approximately 150 V, but the margin of the implantation amount in which the high breakdown voltage is obtained is equal.

In this embodiment as described above, the electric field buffer layer 90 includes three or more of the P-type implantation layers 91*a* to 95*a*. The widths w12 to w15 of the other P-type implantation layers except for the first P-type implantation layer 91*a* among the P-type implantation layers 91*a* to 95*a*, namely, the second to fifth P-type implantation layers 92*a* to 95*a* are equal.

The intervals s13 to s15 between the second to fifth P-type implantation layers 92*a* to 95*a* are determined by giving the interval s12 between the first and second P-implantation layers 91*a*, 92*a* from the recurrence formula giving a solution to a quadratic equation, and particularly, the expression (4). That is, the positions of the second to fifth P-type implantation layers 92*a* to 95*a* can be determined by using the recurrence formula that gives the solution to the quadratic equation similar to the expression (4) on the basis of a distance from the first P-type implantation layer 91*a*. In other words, the positions of the second to fifth P-type implantation layers 92*a* to 95*a* are expressed by the recurrence formula that gives the solution to the quadratic equation on the basis of the distance from the P-type implantation layer 91*a*.

Such configuration can obtain effects similar to those of the first embodiment even in the case where the second to fifth P-type implantation layers 92*a* to 95*a* have the equal widths w12 to w15. Moreover, this configuration can further expand the margin of the implantation amount by selecting the process of forming the electric field buffer layer 90 as appropriate.

Fourth Embodiment

Figure 32:
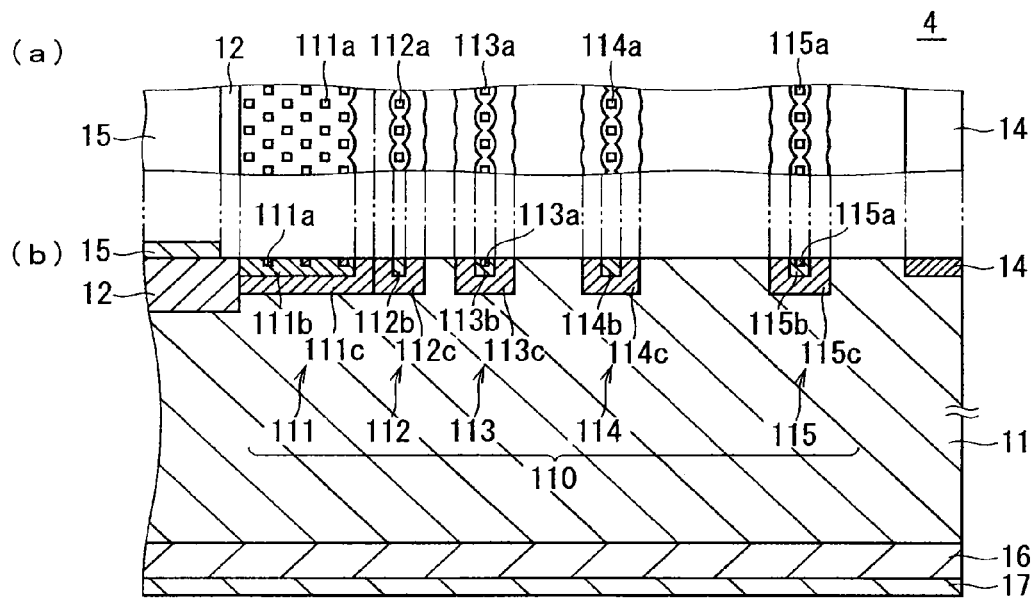
FIG. 32 is a plan view and a cross-sectional view illustrating a configuration of a semiconductor device 4 in a fourth embodiment of the present invention.

FIG. 32 is a plan view and a cross-sectional view illustrating a configuration of a semiconductor device 4 in a fourth embodiment of the present invention. FIG. 32(*a*) is the plan view illustrating the configuration of the semiconductor device 4 in the fourth embodiment of the present invention, and FIG. 32(*b*) is the cross-sectional view illustrating the configuration of the semiconductor device 4 in the fourth embodiment of the present invention.

Also in this embodiment, description will be given of the configuration in the case where the semiconductor device 4 of this embodiment is applied to the PIN diode similarly to the first embodiment. The semiconductor device 4 of this embodiment has the configuration similar to that of the semiconductor device 1 of the first embodiment, so that the same configuration is denoted by the same reference numerals and the common description will be omitted here. FIG. 32 illustrates an enlarged portion of an electric field buffer layer 110.

As shown in FIG. 32, the P-base layer 12 being the active region that contains the relatively high concentration of the P-type impurities is formed in the surface portion on the one side in the thickness direction of the semiconductor substrate 11 that contains the relatively low concentration (N$^{31}$) of the N-type impurities. The electric field buffer layer 110 formed of a plurality of P-type impurity layers 111 to 115 is formed so as to surround the P-base layer 12.

The electric field buffer layer 110 includes five P-type impurity layers, and specifically, a first P-type impurity layer 111, a second P-type impurity layer 112, a third P-type impurity layer 113, a fourth P-type impurity layer 114, and a fifth P-type impurity layer 115.

Each of the P-type impurity layers 111 to 115 has three types of P-type impurity layers having different concentrations of the P-type impurities. The three types of the P-type impurity layers are, P-type implantation layers 111a to 115a at the relatively high concentration, shallow P-type diffusion layers 111b to 115b at the relatively low concentration, and deep P-type diffusion layers 111c to 115c at the lower concentration.

The P-type implantation layers and the P-type diffusion layers are assumed to be separated for easy understanding in this embodiment although the successive change in the concentration of the impurities does not actually allow to define the boundaries. Specifically, the P-type implantation layers and the P-type diffusion layers are assumed to be separated into the P-type implantation layers 111a to 115a being the high-concentration regions formed by implantation in the same ion implantation step as that of the P-base layer 12, the shallow P-type diffusion layers 111b to 115b being the regions formed by diffusion in the heat treatment at the concentration nearly equal to that of the P-type implantation layers 21a to 25a of the first embodiment, and the deep P-type diffusion layers 111c to 115c being the regions formed by diffusion in the heat treatment at the concentration lower than that of the shallow P-type diffusion layers 111b to 115b. It should be noted that the acceptor ions implanted in the P-type implantation layers 111a to 115a spread out concentrically in the heat treatment, so that the P-type implantation layers 111a to 115a have the surface concentration lower than that of the P-base layer 12.

A first shallow P-type diffusion layer 111b is formed to be in contact with or to partially overlap the outside of the P-base layer 12 in the radial direction. In this embodiment, as shown in FIG. 32, the first shallow P-type diffusion layer 111b is formed in contact with the outside of the P-base layer 12 in the radial direction. Also as shown in FIG. 32, a second shallow P-type diffusion layer 112b is formed at an interval from the outside of the first shallow P-type diffusion layer 111b. A third shallow P-type diffusion layer 113b is formed at an interval from the outside of the second shallow P-type diffusion layer 112b. A fourth shallow P-type diffusion layer 114b is formed at an interval from the outside of the third shallow P-type diffusion layer 113b. A fifth shallow P-type diffusion layer 115b is formed at an interval from the outside of the fourth shallow P-type diffusion layer 114b.

The P-type implantation layers 111a to 115a correspond to the local high-concentration regions, the shallow P-type diffusion layers 111b to 115b correspond to the high-concentration impurity layers, and the deep P-type diffusion layers 111c to 115c correspond to the low-concentration impurity layers.

Each of the P-type implantation layers 111a to 115a is formed in a dot shape, and the plurality of dots are periodically disposed in the circumferential direction as seen from the one side in the thickness direction of the semiconductor substrate 11, forming a P-type implantation layer group in each of the shallow P-type diffusion layers 111b to 115b. In the following description, the P-type implantation layers 111a to 115a are collectively referred to as "P-type implantation layer groups 111a to 115a," and each of the P-type implantation layers forming the P-type implantation layer groups 111a to 115a may be referred to as the "dot."

In this embodiment, a first P-type implantation layer group 111a is formed of the dot-shaped P-type implantation layers periodically disposed in the staggered arrangement in a plane direction. A first shallow P-type diffusion layer 111b surrounds each of the P-type implantation layers forming the first P-type implantation layer group 111a and is also surrounded by a first deep P-type diffusion layer 111c.

Second to fifth P-type implantation layer groups 112a to 115a are each formed of the dot-shaped P-type implantation layers periodically disposed in a line in the circumferential direction in the plane direction. Second to fifth shallow P-type diffusion layers 112b to 115b surround the P-type implantation layers forming the corresponding P-type implantation layer groups 112a to 115a and are also surrounded by the corresponding deep P-type diffusion layers 112c to 115c.

The electric field buffer layer 110 is configured to include the first to fifth P-type implantation layer groups 111a to 115a, the first to fifth shallow P-type diffusion layers 111b to 115b, and the first to fifth deep P-type diffusion layers 111c to 115c.

The P-type implantation groups 111a to 115a adjacent to each other have intervals formed therebetween, the intervals being greater than the dot intervals. The dot lines, for example, the outermost dot line of the first P-type implantation layer group 111a and the innermost dot line of the second P-type implantation layer group 112a, that are disposed at positions facing each other in the adjacent P-type implantation layer groups 111a to 115a in the radial direction keep the relationship of the staggered arrangement, and thus each of the dots is disposed at the position in the staggered format. In this manner, the intervals between the shallow P-type diffusion layers 111b to 115b can be maintained almost constant in the circumferential direction, whereby the local electric field concentration in the circumferential direction can be prevented.

Here, the widths of the shallow P-type diffusion layers 111b to 115b and the intervals between the shallow P-type diffusion layers 111b to 115b in the electric field buffer layer 110 follow the same rules as those for the widths of the P-type implantation layers 91a to 95a and the intervals between the P-type implantation layers 91a to 95a in the electric field buffer layer 90 of the third embodiment, respectively. The widths of the shallow P-type diffusion layers 111b to 115b actually fluctuate periodically in the circumferential direction, but an average value of a portion having the greatest width and a portion having the smallest width is assumed to be the widths of the shallow P-type diffusion layers 111b to 115b herein.

In the fourth embodiment, the second to fourth shallow P-type diffusion layers 112b to 115b are respectively derived from the second to fifth P-type implantation layer groups 112a to 115a formed of the line of the dot-shaped P-type implantation layers, so that all of them have the same width.

In the second embodiment as described above, the width of each of the P-type diffusion layers 71b to 75b can only take a discrete value determined by the number of dot lines of the corresponding P-type implantation layer groups 71a to 75a. In contrast, in the fourth embodiment, the widths of the second to fifth shallow P-type diffusion layers 112a to 115a except for the first shallow P-type diffusion layer 111a in contact with the outside of the P-base layer 12 have the constant value determined by the P-type implantation layer groups formed of the line of the dot-shaped P-type implantation layers, thereby having no problems such as the problems in the second embodiment. Moreover, the fourth embodiment easily achieves the high breakdown voltage in a case where the dot opening area is great.

Figure 33:
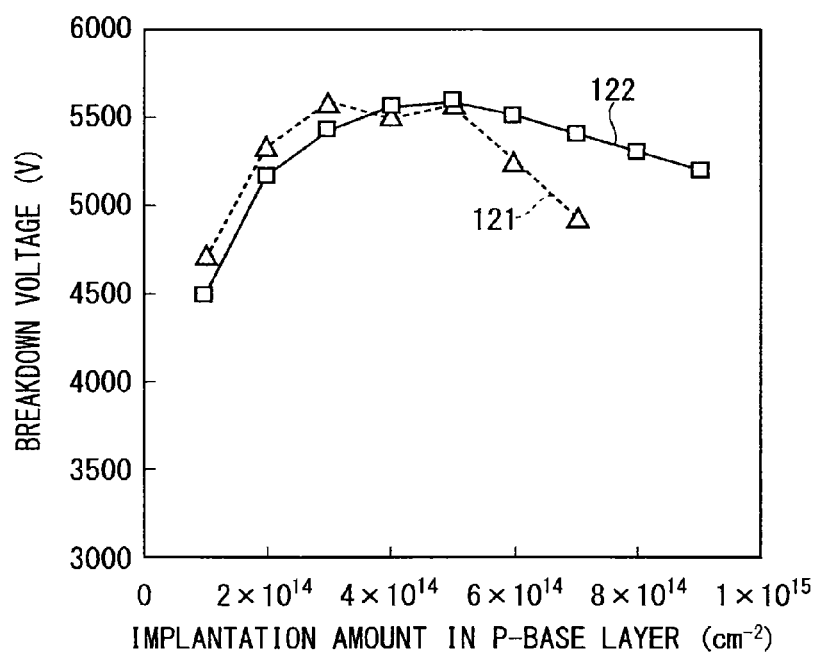
FIG. 33 is a graph illustrating a simulation result when the semiconductor device 4 of the fourth embodiment of the present invention is applied to the vertical PIN diode of Si having the breakdown voltage of 4500 V class.

FIG. 33 is a graph illustrating a simulation result when the semiconductor device 4 of the fourth embodiment of the present invention is applied to the vertical PIN diode of Si having the breakdown voltage of 4500 V class. FIG. 33 compares a dependence of the breakdown voltage on the implantation amount between the fourth embodiment and the second embodiment. In FIG. 33, the vertical axis represents the breakdown voltage (V) in 300 K, and the horizontal axis represents the implantation amount ($cm^{-2}$) in the P-base layer 12.

In FIG. 33, the simulation result of the semiconductor device 2 of the second embodiment is indicated by a broken line with a symbol "Δ" and a reference numeral "121," and the simulation result of the semiconductor device 4 of the fourth embodiment is indicated by a solid line with a symbol "□" and a reference numeral "122."

Here, when the semiconductor device 4 of the fourth embodiment is formed, the dot opening of an implantation mask has a shape of 1 μm per side, a period in the circumferential direction of the dot opening is 5 μm, and the number of sets is 46. When the semiconductor device 2 of the second embodiment is formed, the dot opening has the shape of 0.5 μm per side and the number of sets is 35. In either case, the heat treatment is under the condition such a degree that the PN junction depth is 6 μm.

As seen from FIG. 33, the semiconductor 4 of the fourth embodiment has no problems in which the widths of the second to fifth shallow P-type diffusion layers 112b to 115b are discrete, so that the dependence of the breakdown voltage on the implantation amount does not have the depression as seen in the semiconductor device 2 of the second embodiment. The semiconductor device 4 of the fourth embodiment can obtain the breakdown voltage equal to that of the semiconductor device 2 of the second embodiment, and furthermore, the semiconductor device 4 has the wide margin of the implantation amount in which the high breakdown voltage is obtained.

The implantation amount in the P-base layer 12 and the area of the dot opening, which can be formed, determine whether the semiconductor device 2 of the second embodiment or the semiconductor device 4 of the fourth embodiment has the more advantage over the other. In the example shown in FIG. 33, in a case where the number of acceptor ions implanted from one dot opening is less than or equal to $1.25\times10^6$, the semiconductor device 2 of the second embodiment has the higher breakdown voltage. In a case where the number of acceptor ions is greater than or equal to $2\times10^6$, the semiconductor device 4 of the fourth embodiment has the higher breakdown voltage.

In this manner, in the case where the number of acceptor ions implanted from the one dot opening is relatively small, the semiconductor device 2 of the second embodiment has the more advantage, and in the case where the number of acceptor ions implanted from the one dot opening is relatively great, the semiconductor device 4 of the fourth embodiment has the more advantage.

It should be noted that the number of activated acceptor ions eventually in the semiconductor substrate 11 needs to be considered in a case where an activation ratio of the impurities implanted is low, the acceptor ions are sucked out by thermal oxidation, or a surface is etched. This holds true throughout the present invention.

<Modification of Fourth Embodiment>

Figure 34:
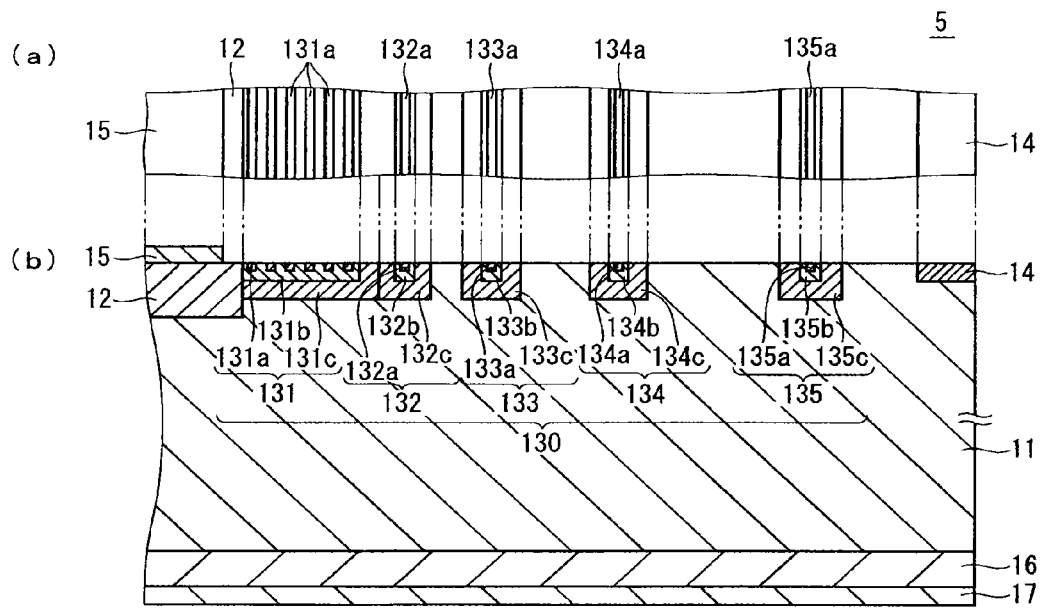
FIG. 34 is a plan view and a cross-sectional view illustrating a configuration of a semiconductor device 5 in a modification of a fourth embodiment of the present invention.

FIG. 34 is a plan view and a cross-sectional view illustrating a configuration of a semiconductor device 5 in a modification of a fourth embodiment of the present invention. FIG. 34(a) is the plan view illustrating the configuration of the semiconductor device 5 in the modification of the fourth embodiment of the present invention, and FIG. 34(b) is the cross-sectional view illustrating the configuration of the semiconductor device 5 in the modification of the fourth embodiment of the present invention. Also in this modification, description will be given of the configuration in the case where the semiconductor device 5 of this modification is applied to the PIN diode similarly to the first embodiment. The semiconductor device 5 of this modification has the configuration similar to that of the semiconductor device 1 of the first embodiment, so that the same configuration is denoted by the same reference numerals and the common description will be omitted here. FIG. 34 illustrates an enlarged portion of an electric field buffer layer 130.

In this modification, the dot-shaped P-type implantation layers forming each of the P-type implantation layer groups 111a to 115a in FIG. 32 are joined in the circumferential direction to have a stripe shape with a narrow width. In other words, the first P-type implantation layer group 111a formed of the dot-shaped P-type implantation layers in the fourth embodiment corresponds to a first P-type implantation layer group 131a formed of the stripe-shaped P-type implantation layers in this modification. Similarly, the second to fifth P-type implantation layer groups 112a, 113a, 114a, 115a formed of the dot-shaped P-type implantation layers in the fourth embodiment respectively correspond to second to fifth P-type implantation layers 132a, 133a, 134a, 135a having the stripe shape in this embodiment.

Then, the electric field buffer layer 130 is formed of the first P-type implantation layer group 131a, the second to fifth P-type implantation layers 132a to 135a, first to fifth shallow P-type diffusion layers 131b to 135b, and first to fifth deep P-type diffusion layers 131c to 135c. This embodiment does not perform a dot implantation, so that an impurity concentration of the electric field buffer layer 130 and widths of the P-type diffusion layers 131b to 135b, 131c to 135c do not fluctuate in the circumferential direction.

Figure 35:
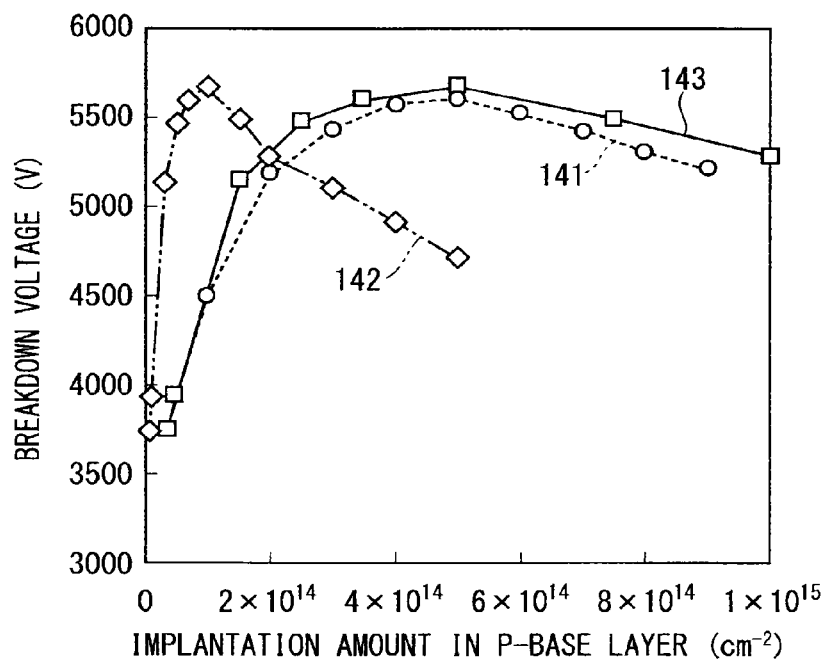
FIG. 35 is a graph illustrating a simulation result when the semiconductor device 5 in the modification of the fourth embodiment of the present invention is applied to the vertical PIN diode of Si having the breakdown voltage of 4500 V class.

FIG. 35 is a graph illustrating a simulation result when the semiconductor device 5 in the modification of the fourth embodiment of the present invention is applied to the vertical PIN diode of Si having the breakdown voltage of 4500 V class. In FIG. 35, the vertical axis represents the breakdown voltage (V) in 300 K, and the horizontal axis represents the implantation amount ($cm^{-2}$) in the P-base layer 12. FIG. 35 illustrates a dependence of the breakdown voltage on the implantation amount when the P-type implantation layer has a dot shape of 1 μm per side, a stripe shape with a width of 1 μm, or a stripe shape with a width of 0.2 μm.

In FIG. 35, the simulation result is indicated by a broken line with a symbol "○" and a reference numeral "141" in the case where the P-type implantation layer has the dot shape of 1 μm per side. The simulation result is indicated by a chain double-dashed line with a symbol "◇" and a reference numeral "142" in the case where the P-type implantation layer has the stripe shape with the width of 1 μm. The simulation result is indicated by a solid line with a symbol "□" and a reference numeral "143" in the case where the P-type implantation layer has the stripe shape with the width of 0.2 μm.

In the example shown in FIG. 35, in the case where the P-type implantation layer has the dot shape of 1 μm per side, each of the dot-shaped P-type implantation layers is assumed to be disposed in the period of 5 μm in the circumferential direction. In addition, in any cases, the number of sets is 46 and the heat treatment is under the condition such a degree that the PN junction depth is 6 μm.

As seen from FIG. 35, even in a case where the stripe-shaped P-type implantation layers 131a to 135a are formed, that is to say, even in a case where the semiconductor device is manufactured using an implantation mask having stripe-shaped openings formed therein (hereinafter referred to as "stripe openings" in some cases), sufficient breakdown voltage can be obtained in the implantation amount of greater than or equal to $1 \times 10^{14}$ cm$^{-2}$. Also as seen from FIG. 35, in a case where the width of the stripe opening increases, the optimal implantation amount can decrease, and in a case where the width of the stripe opening decreases, the optimal implantation amount can increase. In other words, the width of the stripe opening may be adjusted to the implantation amount in the P-base layer 12. It should be noted that in the case where the width of the stripe opening increases, the width of the stripe opening needs to be sufficiently smaller than a diffusion length. Moreover, in a case where the optimal width of the stripe opening is smaller than a resolution of the implantation mask, the number of acceptor ions to be implanted needs to be reduced by providing the dot openings as shown in FIG. 32.

In FIG. 35, the dependence of the breakdown voltage on the implantation amount in the case where the P-type implantation layers 131a to 135a have the stripe shape with the width of 0.2 μm is close to the dependence of the breakdown voltage on the implantation amount in the case where the P-type implantation layers 131a to 135a have the dot shape of 1 μm per side. The reason is that the dot opening of 1 μm per side in the circumferential period of 5 μm and the stripe opening with the circumferential length of 5 μm and the width of 0.2 μm have the same number of acceptor ions to be implanted. It should be noted that the concentration of the electric field buffer layer does not fluctuate in the circumferential direction in the case of the stripe opening with the width of 0.2 μm, whereby the breakdown voltage of the semiconductor device is slightly higher than that in the case where the implantation mask having the dot opening of 1 μm per side formed therein is used.

Here, if the pattern of the openings with the width of 0.2 μm including the dot shape of 0.2 μm per side can be formed, attention should be given that the P-type implantation layers 71a to 75a in the second embodiment can also be easily formed. The implantation amount in the P-base layer 12 as well as the shape of the opening, which can be formed, and a lower limit of the opening width such as a lower limit by the resolution of the implantation mask and the like determine whether the P-type implantation layers 71a to 75a in the second embodiment or the P-type implantation layers 131a to 135a in the modification of the fourth embodiment have the more advantage over the other.

The widths of the P-type implantation layers 71a to 75a, 111a to 115a, 131a to 135a in the radial direction in the second embodiment, the fourth embodiment, and the modification of the fourth embodiment are preferably lower than or equal to one-fifth (⅕) of the depths of the deep P-type diffusion layers 71c to 75c, 111c to 115c, 131c to 135c with reference to the surface on the one side in the thickness direction of the semiconductor substrate 11. This can further expand the margin of the implantation amount in which the high breakdown voltage is obtained.

To manufacture the semiconductor device having such configuration, the implantation mask may be formed in the mask formation step such that the portion corresponding to the region in which the P-base layer 12 being the active region is formed is open and the widths of the openings in the radial direction are less than or equal to one-fifth (⅕) of the depths of the deep P-type diffusion layers 71c to 75c, 111c to 115c, 131c to 135c to be formed in the heat treatment step with reference to the surface on the one side in the thickness direction of the semiconductor substrate 11. This can reduce the number of manufacturing steps.

Fifth Embodiment

In the first and third embodiments described above, the acceptor ions are diffused in the heat treatment to form the electric field buffer layers 13, 90, but an electric field buffer layer may be formed without using thermal diffusion.

Figure 36:
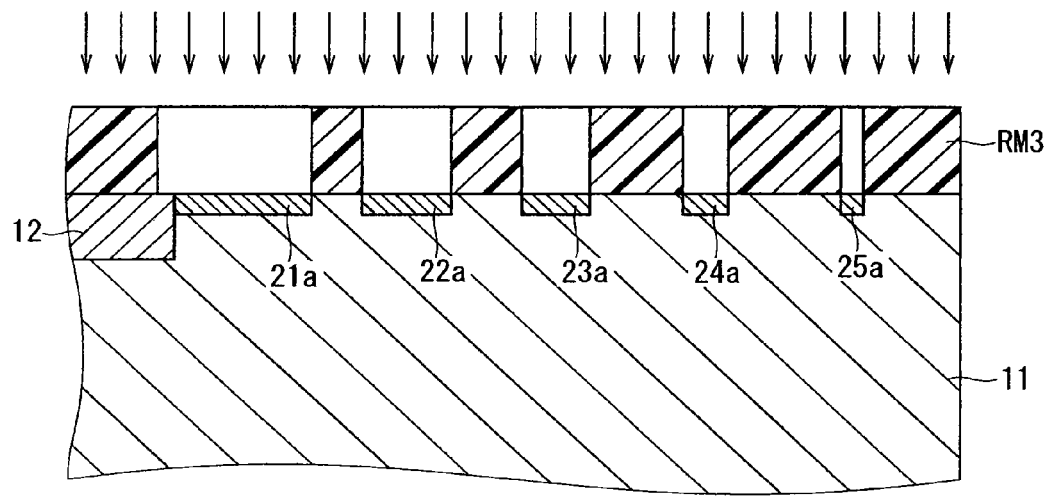
FIG. 36 is a cross-sectional view illustrating a state in which an ion implantation is performed using a resist mask RM3.
Figure 37:
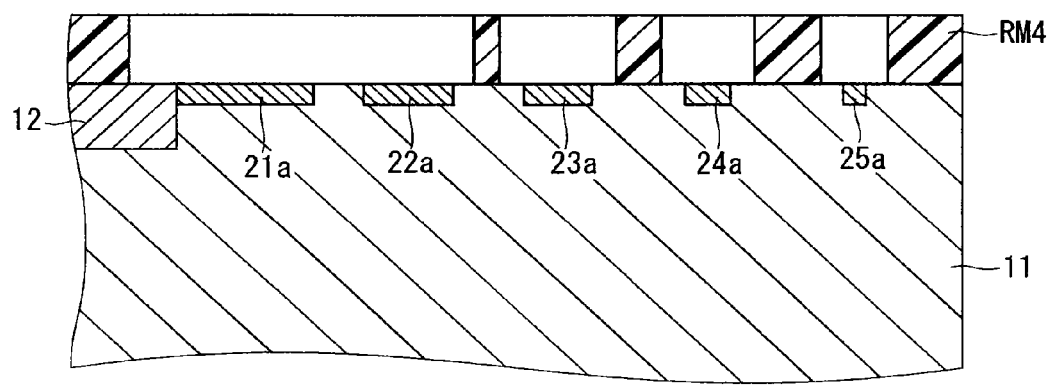
FIG. 37 is a cross-sectional view illustrating a state in which the resist mask RM3 is isotropically etched to form a resist mask RM4.
Figure 38:
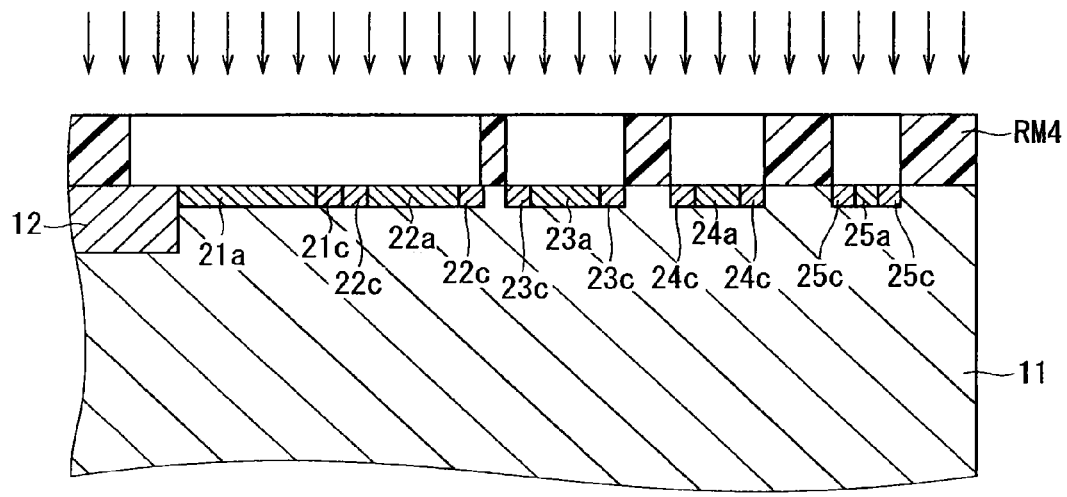
FIG. 38 is a cross-sectional view illustrating a state in which an ion implantation is performed using the resist mask RM4.
Figure 39:
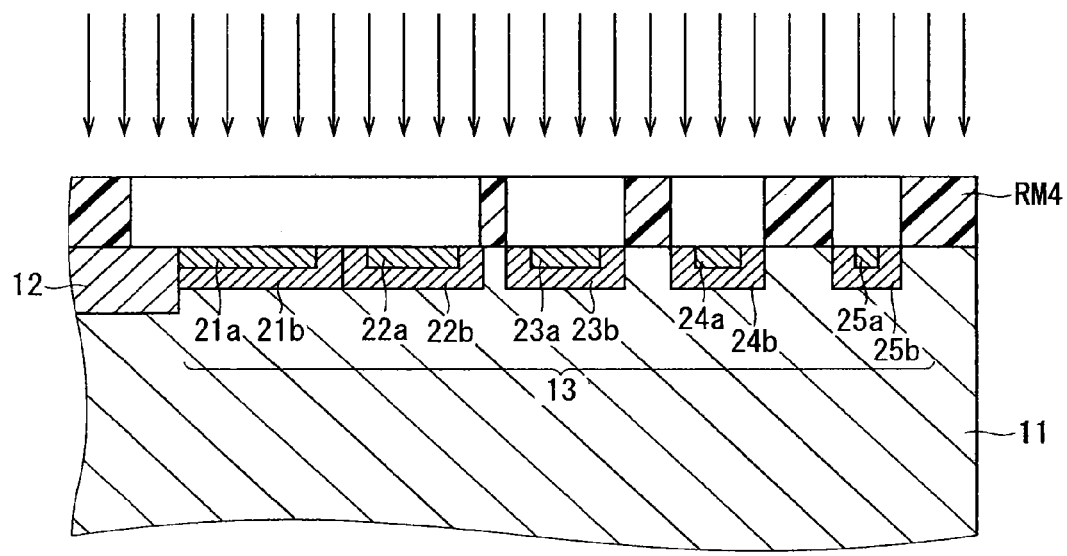
FIG. 39 is a cross-sectional view illustrating the state in which the ion implantation is performed using the resist mask RM4.
Figure 40:
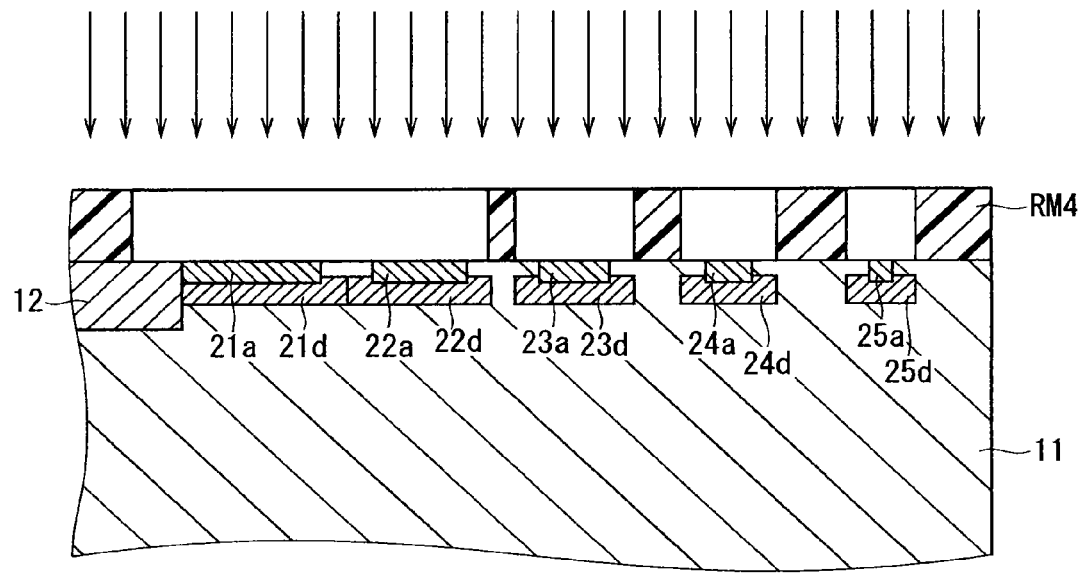
FIG. 40 is a cross-sectional view illustrating the state in which the ion implantation is performed using the resist mask RM4.

With reference to FIGS. 36 to 40, a process of forming the electric field buffer layer 13 without using the thermal diffusion will be described. FIG. 36 is a cross-sectional view illustrating a state in which an ion implantation is performed using a resist mask RM3. FIG. 37 is a cross-sectional view illustrating a state in which the resist mask RM3 is isotropically etched to form a resist mask RM4. FIGS. 38 to 40 are cross-sectional views illustrating a state in which an ion implantation is performed using the resist mask RM4.

As shown in FIG. 36, after the P-base layer 12 that contains the relatively high concentration of the P-type impurities is formed in the surface portion of the semiconductor substrate 11 that contains the relatively low concentration (N⁻) of the N-type impurities, the relatively thick resist mask RM3 is formed on the surface of the substrate, the resist mask RM3 having the pattern in which the openings are provided in the portions corresponding to the regions in which the first to fifth P-type implantation layers 21a, 22a, 23a, 24a, 25a are formed.

Then, in a first ion implantation step, the ion implantation of the acceptor ions being the P-type impurity ions is performed with relatively low energy from the upper portion of the resist mask RM3.

Next, as shown in FIG. 37, only the resist is isotropically etched with an oxygen asher or the like, and the portion covered by the resist mask RM3 is recessed. The resist mask RM3 is etched to be the resist mask RM4. Here, the resist mask RM3 has the resist mask of the portion corresponding between the first P-type implantation layer 21a and the second P-type implantation layer 22a removed by etching.

Next, as shown in FIGS. 38 and 39, in a second ion implantation step, a plurality of ion implantations of the acceptor ions are performed from the upper portion of the resist mask RM4, namely, the one side in the thickness direction thereof while changing the energy from the relatively low energy to the relatively high energy.

In FIGS. 38 and 39, a length of arrows incident from the upper surface of the resist mask RM4 reflects a size of energy of the ion implantation. FIG. 38 illustrates a case where the ion implantation is performed with the relatively low energy, and FIG. 39 illustrates a case where the ion implantation is performed with the relatively high energy.

In the second ion implantation step, for example, after the ion implantation has been performed with the relatively low energy as shown in FIG. 38, the ion implantation is performed with the relatively high energy as shown in FIG. 39. The ion implantation with the relatively low energy forms first to fifth P-type implantation layers 21c to 25c of the first to fifth P-type diffusion layers 21b to 25b, the first to fifth P-type implantation layers 21c to 25c corresponding to portions having the same depth as that of the first to fifth P-type implantation layers 21a to 25a. The second ion implantation step is not limited to the procedure described above, and the ion implantation with the relatively low energy may be performed after performing the ion implantation with the relatively high energy.

Here, a sum of the implantation amount in the first ion implantation step and the implantation amount in the second ion implantation step is made to be greater than or equal to 1.5 times and less than or equal to 3.5 times the RESURF condition determined by a semiconductor material. In this manner, as shown in FIG. 39, the P-type diffusion layers 21b, 22b, 23b, 24b, 25b that surround the P-type implantation layers 21a, 22a, 23a, 24a, 25a are formed.

The electric field buffer layer of the present invention can be formed using such manufacturing steps even if the semiconductor, such as SiC, has the extremely short thermal diffusion length.

Moreover, as shown in FIG. 40, the ion implantation of the acceptor ions may be performed only with the relatively high energy in the second ion implantation step to form recessed P-type implantation layers 21d, 22d, 23d, 24d, 25d so as to protect only the bottom surfaces of the P-type implantation layers 21a, 22a, 23a, 24a, 25a. In this manner, part of the manufacturing steps can be omitted.

At this time, the recessed P-type implantation layers 21d, 22d, 23d, 24d, 25d have a maximum acceptor concentration near the bottom surfaces of the P-type implantation layers 21a, 22a, 23a, 24a, 25a. In other words, the recessed P-type implantation layers 21d to 25d have the maximum concentration of the P-type impurities at the positions from the surface on the one side in the thickness direction of the semiconductor substrate 11, the positions being substantially equal to the positions of the bottom surfaces of the P-type implantation layers 21a to 25a. Such configuration can achieve the semiconductor device having the relatively high breakdown voltage even if part of the manufacturing steps is omitted as described above. Here, the recessed P-type implantation layers correspond to the low-concentration impurity layers.

This embodiment as described above includes the etching step and the second ion implantation step between the ion implantation step and the heat treatment step. In the second ion implantation step, the P-type impurities are ion-implanted with the implantation energy higher than the implantation energy when the P-type impurities are ion-implanted in the first ion implantation step. Consequently, even in the case where a wide band gap semiconductor, such as a silicon carbide (SiC), having a relatively short diffusion length is used, the semiconductor device having the relatively high breakdown voltage can be achieved.

In the first to fifth embodiments as described above, the semiconductor devices in which the conductivity types of the semiconductor substrate and each of the impurity layers are identified by the P-type or the N-type are described, but the similar effects can be obtained even if all of the conductivity types are reversed.

The implantation amount and the number of acceptor ions as indicated above are values based on the premise that the activation ratio is 100% and the acceptor ions are not lost in the manufacturing steps after the ion implantation. Therefore, adjustments to the implantation amount are needed on the basis of the number of activated acceptor ions eventually in the semiconductor substrate in the case where the activation ratio is low, the acceptor ions are sucked out by the thermal oxidation, or the surface is etched.

A fixed charge such as an interface charge is in an interface between the semiconductor and an insulating film such as an oxide film, or an interface between the semiconductor and a passivation film such as a polyimide film in some cases. The adjustments to the implantation amount are needed even in a case where the fixed charge is not negligible for the implantation amount.

The first to fifth embodiments give the illustration that the P-base layer 12 is deeper than the electric field buffer layers 13, 70, 90, 110, 130, but the P-base layer 12 may be shallower than the electric field buffer layers 13, 70, 90, 110, 130.

The first to fourth embodiments give the description that the acceptor ions are implanted with the relatively low energy, but the implantation energy may be high if the implantation mask completely blocks the acceptor ions. In the case of the implantation with the relatively high energy, the P-type diffusion layer expands vertically and horizontally in the P-type implantation layer.

In the first, third, and fifth embodiments, the acceptor ions of the electric field buffer layers 13, 90 are not implanted in the active region to be the P-base layer 12, but the acceptor ions of the electric field buffer layer 13, 90 may be implanted in the active region if the opening of the implantation mask is expanded to the active region.

Figure 41:
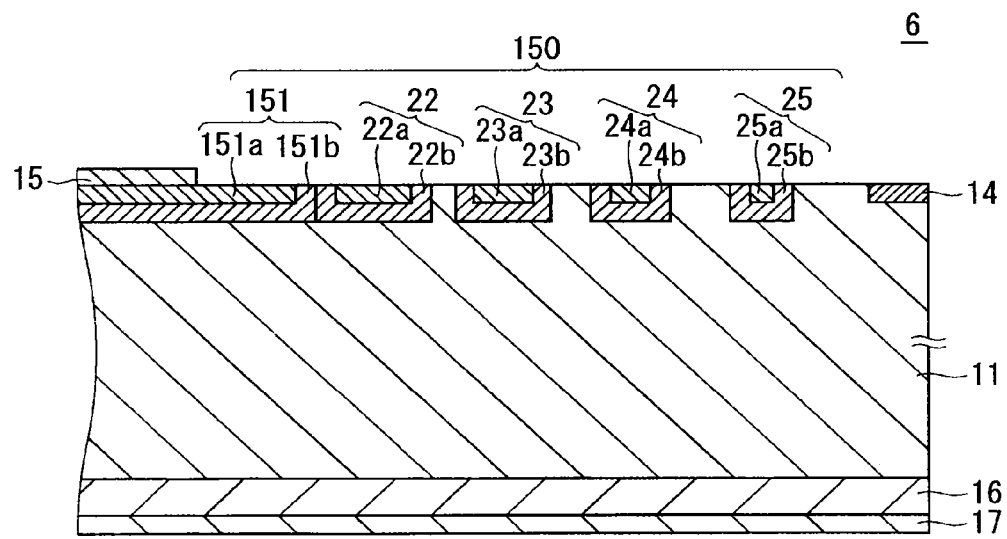
FIG. 41 is a cross-sectional view illustrating the other example of the semiconductor device.

For example, as with a PIN diode 6 shown in FIG. 41, an opening of an implantation mask is expanded to a region in which the P-base layer 12 is formed and acceptor ions of an electric field buffer layer 150 are implanted, whereby the P-base layer 12 may be omitted. FIG. 41 is a cross-sectional view illustrating the other example of the semiconductor device.

In the semiconductor device 6 shown in FIG. 41, the active region is formed of a first P-type implantation layer 151a being the P-type impurity layer that contains the P-type impurities. In other words, the active region is formed of part of the first P-type implantation layer 151a forming the electric field buffer layer 150. That is to say, the P-type impurity layer forming the active region is integrally formed with the first P-type implantation layer 151a forming the electric field buffer layer 150.

Therefore, a concentration profile of the P-type impurities in the thickness direction of the P-type impurity layer forming the active region is the same as a concentration profile of the P-type impurities in the thickness direction of a place in which the high-concentration impurity layer forming the electric field buffer layer 150 is located, namely, the portion of the first P-type implantation layer 151a forming the electric field buffer layer 150.

Such configuration can omit part of the steps to form the active region and achieve the semiconductor device 6 having the relatively high breakdown voltage.

Here, the implantation amount in the electric field buffer layer 150 is greater than or equal to 1.5 times the RESURF condition, so that the omission of the P-base layer does not cause the complete depletion of the P-type impurity layer under the normal usage conditions, whereby no punch-through to the anode electrode 15 occurs. Also in this configuration, to reduce a contact resistance to the anode electrode 15, the P-type impurity layer that contains the relatively high concentration of the p-type impurities may be separately formed at a relatively shallow depth in a place in contact with the anode electrode 15.

In the first to fifth embodiments, the device to which the present invention is applied is the PIN diode, but the similar effects can be obtained if the present invention is applied as the termination structure of various devices that are transistors, such as a MOSFET, an IGBT, and a bipolar junction transistor (BJT), or a thyristor.

Figure 42:
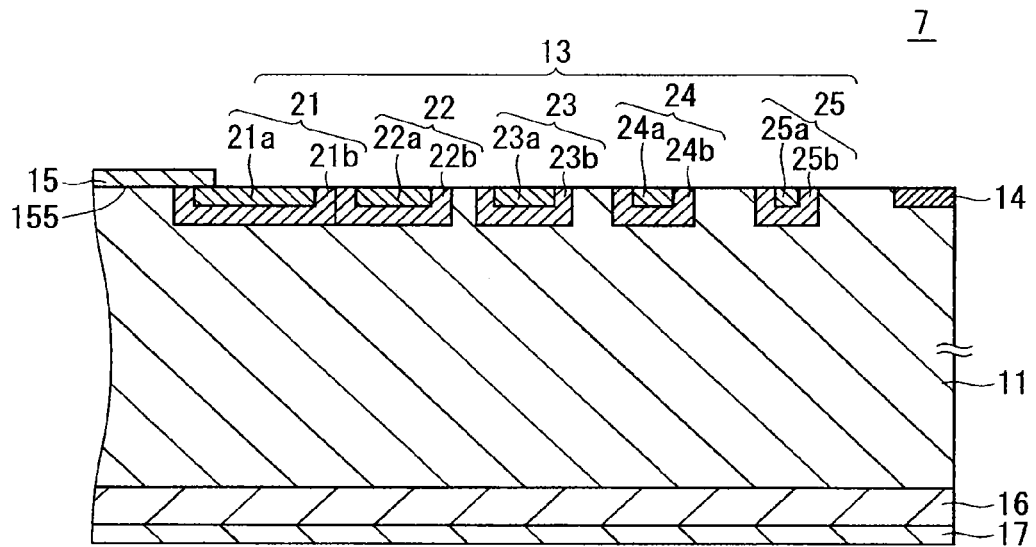
FIG. 42 is a cross-sectional view illustrating the other example of the semiconductor device.

In the first, third and fifth embodiments, as with a semiconductor device 7 shown in FIG. 42, a Schottky barrier 155 in the interface between the anode electrode 15 being a Schottky electrode and the semiconductor substrate 11 is the active region and may be a Schottky barrier diode. FIG. 42 is a cross-sectional view illustrating the other example of the semiconductor device.

As shown in FIG. 42, the active region may be formed of the region of the surface portion on the one side in the thickness direction of the semiconductor substrate 11 to form a Schottky junction with the anode electrode 15 being the Schottky electrode, namely, formed of the Schottky barrier 155 being the Schottky region. The Schottky barrier 155 and the Schottky electrode 15 form the semiconductor device 7 being the Schottky barrier diode. This can achieve the Schottky barrier diode, as the semiconductor device 7, having the relatively high breakdown voltage.

In the case where the Schottky barrier 155 in the interface between the Schottky electrode 15 and the semiconductor substrate 11 is the active region as described above, the ion implantation is performed in the electric field buffer layer as well as part of the active region, whereby the semiconductor device 7 may be a junction barrier Schottky (JBS) diode or a merged PIN Schottky (MPS) diode.

In the first to fifth embodiments, the breakdown voltage class is the rated voltage of 4500 V, but the present invention can be applied to any breakdown voltage classes.

The material for the semiconductor substrate 11 is not limited to a silicon and may be a wide band gap semiconductor having a relatively wide band gap. For example, a silicon carbide (SiC), gallium nitride (GaN) materials, or a diamond may be used as the wide band gap semiconductor.

The optimal implantation amount in the electric field buffer layer is determined by a dielectric constant and a breakdown field of a semiconductor material being mainly used. On the other hand, the optimal width of the electric field buffer layer is mainly determined by the breakdown field and the necessary breakdown voltage of the semiconductor material, but the present invention can effectively reduce the electric field in the semiconductor and can thus reduce the width of the termination structure more than that of the conventional one.

A switching element and a diode element formed of the wide band gap semiconductor have the high breakdown voltage and also a high concentration of allowable current, so that the sizes can be reduced smaller than the silicon. With the miniaturized switching element and diode element, a semiconductor device module in which these elements are mounted can be reduced in size.

A heat resistance is also high, allowing for miniaturization of a heat dissipation fin of a heat sink and also air cooling instead of water cooling. Thus, the semiconductor device module can be further reduced in size.

The impurities used for implantation may include boron (B), nitrogen (N), aluminum (Al), phosphorus (P), arsenic (As), indium (In), or the like that can be activated in place of atoms of the semiconductor material. It should be noted that in the case where the electric field buffer layer is formed by the thermal diffusion, the relatively great diffusion length and high control over the diffusion are preferable.

Finally, the width of the termination structure when the present invention is applied will be specifically described. The present invention can reduce the widths of the electric field buffer layers 13, 70, 90, 110, 130, 150 in the radial direction greater than or equal to twice the thickness of the semiconductor substrate 11.

Here, as in this embodiment, the "thickness of the semiconductor substrate" is referred to as a semiconductor substrate itself formed of the semiconductor material as the semiconductor substrate 11. It is referred to as the thickness of the semiconductor substrate itself, for example, in a case where the semiconductor substrate that contains the relatively low concentration of the N-type impurities is used. A substrate formed of a support substrate and an epitaxial film of the semiconductor material formed on the support substrate, such as an epitaxial film that contains the relatively low concentration of the N-type impurities, may be used as the semiconductor substrate 11. In this case, the thickness of the epitaxial film is referred to as the "thickness of the semiconductor substrate."

Hereinafter, a portion that defines the "thickness of the semiconductor substrate" may be referred to as a "drift layer." In other words, in a case where the semiconductor substrate itself is used as the semiconductor substrate 11, the semiconductor 11 itself is referred to as the "drift layer." In a case where the substrate that is formed of the support substrate and the epitaxial film of the semiconductor material formed on the support substrate is used as the semiconductor substrate 11, the epitaxial film is referred to as the "drift layer."

The lower limit of the widths of the electric field buffer layers 13, 70, 90, 110, 130, 150 has a dependence on the impurity concentration of the drift layer, namely, the impurity concentration of the semiconductor substrate or the epitaxial film, the lowest temperature that assures an operation of the semiconductor device, and a manufacturing variation, and the lower limit thereof is greater than or equal to approximately 1.5 times the thickness of the drift layer being the "thickness of the semiconductor substrate."

For example, in a case of Si, the thickness (unit: μm) of the drift layer needs greater than or equal to approximately 0.1 times the rated voltage (unit: V). In other words, in the case of the Si, the present invention can make the width (unit: μm) of the electric field buffer layer to be greater than approximately 0.15 to 0.2 times the rated voltage (unit: V).

Figure 43:
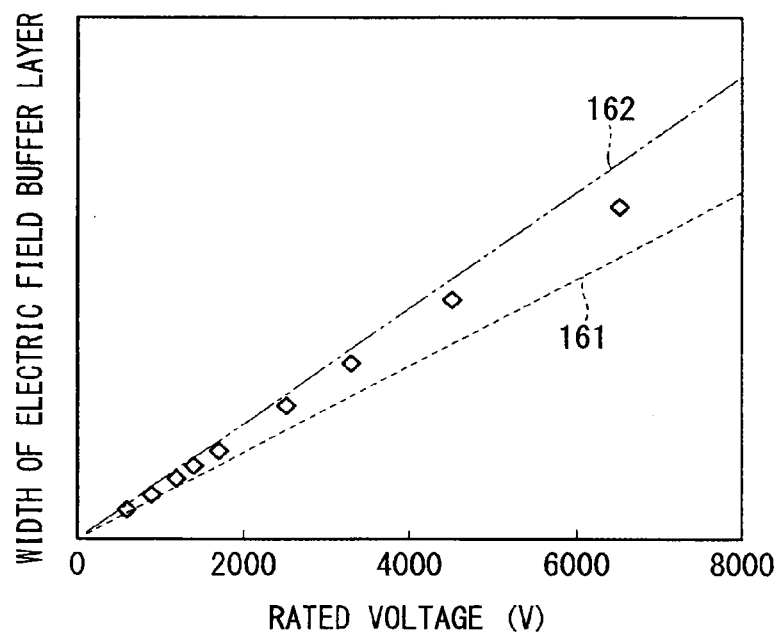
FIG. 43 is a graph illustrating a relationship between a rated voltage and a width of an electric field buffer layer.

FIG. 43 is a graph illustrating a relationship between the rated voltage and the width of the electric field buffer layer. In FIG. 43, the vertical axis represents the width of the electric field buffer layer, and the horizontal axis represents the rated voltage (V). FIG. 43 illustrates the width of the electric field buffer layer in which the breakdown voltage greater than or equal to 1.2 times the rated voltage at room temperature is obtained when the semiconductor device 1 of the first embodiment of the present invention is applied to the vertical PIN diode of Si of each rated voltage.

In FIG. 43, a case where the width of the electric field buffer layer is greater than or equal to 1.5 times the thickness of the drift layer (hereinafter referred to as the "drift layer thickness") is indicated by a broken line with a reference numeral "161," and a case where the width of the electric field buffer layer is greater than or equal to 2.0 times the drift layer thickness is indicated by a chain double-dashed line with a reference numeral "162." In FIG. 43, the width of the electric field buffer layer is between 1.5 times and 2 times the drift layer thickness. In addition, the width of the electric field buffer layer in the other embodiments of the present invention can be nearly equal to that in the first embodiment.

As described above, the present invention can achieve the relatively high breakdown voltage as shown in FIG. 43 when the widths of the electric field buffer layers 13, 70, 90, 110, 130, 150 are less than or equal to twice the drift layer thickness being the thickness of the semiconductor substrate 11, and more particularly, in the range of 1.5 times to 2 times the drift layer thickness. The widths of the electric field buffer layers 13, 70, 90, 110, 130, 150 are less than or equal to twice the drift layer thickness, whereby increasing the size of the semiconductor device can be prevented. In other words, the semiconductor device can achieve the relatively high breakdown voltage without increasing in size.

Moreover, as the breakdown voltage increases, the drift layer thickness increases and the impurity concentration of the drift layer also needs to decrease. The decrease in the impurity concentration of the drift layer causes the depletion layer to easily increase its length in the drift layer. Therefore, to prevent a phenomenon in which the depletion layer reaches the stopper layer 14 and the leakage current significantly increases, namely, a reach-through to the stopper layer 14, a separation distance from the electric field buffer layers 13, 70, 90, 110, 130, 150 to the stopper layer 14 is preferably expanded in proportion to the rated voltage. For example, the separation distance from the electric field buffer layers 13, 70, 90, 110, 130, 150 to the stopper layer 14 is made identical to the drift layer thickness, whereby the reach-through to the stopper layer 14 can be sufficiently prevented.

However, the separation distance from the electric field buffer layers 13, 70, 90, 110, 130, 150 to the stopper layer 14 does not greatly influence the breakdown voltage except for concern about the reach-through, so that the separation distance is preferably short as much as possible.

Figure 44:
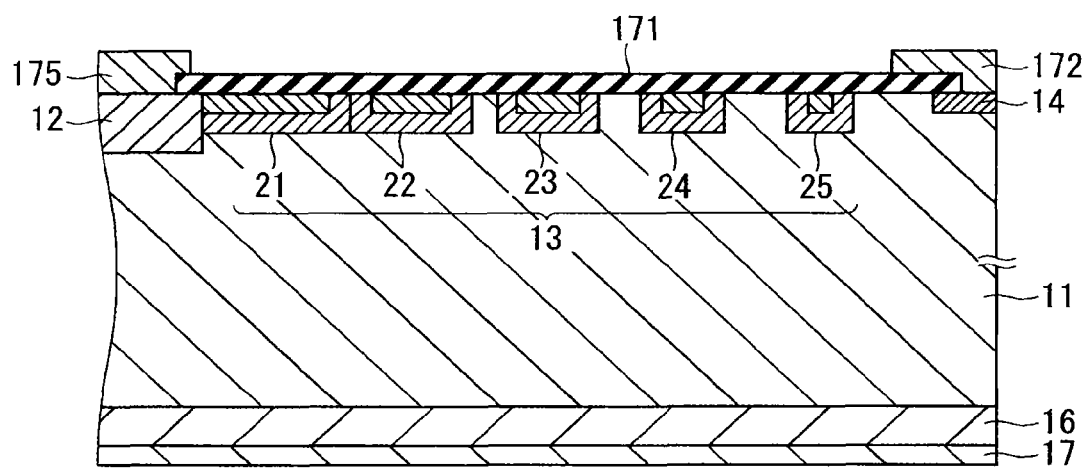
FIG. 44 is a cross-sectional view illustrating the other example of the semiconductor device of the present invention.

Then, to positively suppress the reach-through to the stopper layer 14, a field plate 172 may be provided as shown in FIG. 44, the field plate 172 being at the same potential as that of the stopper layer 14, namely, the same potential as that of the cathode electrode 17. FIG. 44 is a cross-sectional view illustrating the other example of the semiconductor device of the present invention. In a semiconductor device 8 as shown in FIG. 44, the field plate 172 at the same potential as that of the stopper layer 14 is formed to include the same wiring layer as an anode electrode 175. A tip of the field plate 172 faces the semiconductor substrate 11 through an insulating film 171.

In this manner, the field plate 172 as a metal wiring layer having the same potential as that of the surface on the other side in the thickness direction of the semiconductor substrate 11 is provided outside the electric field buffer layer 13 in the radial direction, and the insulating film 171 as an insulating layer is located between the field plate 172 being the metal wiring layer and the surface portion on the one side in the thickness direction of the semiconductor substrate 11. Thus, the separation distance from the electric field buffer layer 13 to the stopper layer 14 can be shortened. For example, if the separation distance from the electric field buffer layer 13 to the stopper layer 14 is reduced to be half the thickness of the semiconductor substrate 11 being the drift layer thickness, the reach-through to the stopper layer 14 can be sufficiently prevented.

Also in this case, the separation distance from the electric field buffer layer 13 to the end portion of the field plate 172 and the separation distance from the electric buffer layer 13 to the stopper layer 14 are preferably expanded in proportion to the rated voltage. It should be noted that a proportionality constant for determining an appropriate value for the separation distance from the electric field buffer layer 13 to the stopper layer 14 is smaller than that in the case without the field plate 172.

In addition, according to the present invention, the above embodiments can be arbitrarily combined. Each embodiment can be appropriately varied or omitted within the scope of the invention.

While the invention has been shown and described in detail, the foregoing description is in all aspects illustrative and not restrictive. The present invention is not restricted to that. It is therefore understood the numerous modifications and variations can be devised without departing from the scope of the invention.

DESCRIPTION OF NUMERALS

1, 2, 3, 4, 5, 6, 7, 8 semiconductor device; 11 semiconductor substrate; 12 active region (P-base layer); 13, 70, 90, 110, 130, 150 electric field buffer layer; 14 stopper layer; 15, 175 anode electrode; 16 cathode layer; 17 cathode electrode; 21 to 25, 71 to 75, 91 to 95, 111 to 115, 131 to 135, 151 P-type impurity layer; 21a to 25a, 21c to 25c, 21d to 25d, 71a to 75a, 91a to 95a, 111a to 115a, 131a to 135a, 151a P-type implantation layer; 21b to 25b, 71b to 75b, 71c to 75c, 91b to 95b, 111b to 115b, 111c to 115c, 131b to 135b, 131c to 135c, 151b P-type diffusion layer; 171 insulating film; 172 field plate.

The invention claimed is:

1. A semiconductor device, comprising:
    a semiconductor substrate of a first conductivity type;
    an active region of a second conductivity type formed in a surface portion on one side in a thickness direction of said semiconductor substrate and formed away from an outer peripheral portion of said semiconductor substrate; and
    an electric field buffer layer formed in the surface portion on the one side in the thickness direction of said semiconductor substrate in an annular shape so as to surround said active region from an outer peripheral portion of said active region toward the outer peripheral portion of said semiconductor substrate, wherein
    said electric field buffer layer includes:
        a plurality of high-concentration impurity layers that are formed at intervals so as to surround said active region and contain second conductivity type impurities; and
        a plurality of low-concentration impurity layers that are formed so as to respectively surround said high-concentration impurity layers and contain said second conductivity type impurities at a concentration lower than that of said high-concentration impurity layers,
    an innermost high-concentration impurity layer formed on the innermost side in a radial direction of said electric field buffer layer among said high-concentration impurity layers is formed to be in contact with or to partially overlap said active region,
    an innermost low-concentration impurity layer that surrounds said innermost high-concentration impurity layer is formed to be connected to at least one of said low-concentration impurity layers that respectively surround other said high-concentration impurity layers formed outside said innermost high-concentration impurity layer in said radial direction, and
    intervals between said high-concentration impurity layers increase from said active region toward the outer peripheral portion of said semiconductor substrate.

2. The semiconductor device according to claim 1, wherein said low-concentration impurity layer that surrounds at least an outermost high-concentration impurity layer formed on the outermost side in the radial direction of said electric field buffer layer among said high-concentration impurity layers is formed at an interval from said low-concentration impurity layer that surrounds said high-concentration impurity layer formed on the inner side next to said outermost high-concentration impurity layer in said radial direction.

3. The semiconductor device according to claim 1, wherein said high-concentration impurity layers are each formed such that a sum of a width of an interlayer region between said high-concentration impurity layers adjacent to each other and a width of said high-concentration impurity layer in contact with the outside of the interlayer regions in said radial direction is a predetermined value.

4. The semiconductor device according to claim 1, wherein the intervals between said high-concentration impurity layers increase in arithmetic progression from said active region toward the outer peripheral portion of said semiconductor substrate.

5. The semiconductor device according to claim 1, wherein
said electric field buffer layer includes three or more of said high-concentration impurity layers including said innermost high-concentration impurity layer,
widths of the other high-concentration impurity layers except for said innermost high-concentration impurity layer among said high-concentration impurity layers are equal, and
positions of the other high-concentration impurity layers except for said innermost high-concentration impurity layer are expressed by a recurrence formula that gives a solution to a quadratic equation on the basis of a distance from said innermost high-concentration impurity layer.

6. The semiconductor device according to claim 1, wherein a sum of a surface density of said second conductivity type impurities of each of said high-concentration impurity layers in a surface on the one side in the thickness direction of said semiconductor substrate and a surface density of said second conductivity type impurities of each of said low-concentration impurity layers surrounding said high-concentration impurity layers in the thickness direction of said semiconductor substrate is greater than or equal to 1.5 times and less than or equal to 3.5 times a RESURF condition that is an optimal value for the surface density of said second conductivity type impurities in a RESURF structure predetermined for every semiconductor material forming said semiconductor substrate.

7. The semiconductor device according to claim 1, wherein said low-concentration impurity layers have a maximum concentration of said second conductivity type impurities at positions from a surface on the one side in the thickness direction of said semiconductor substrate, the positions being substantially equal to positions of bottom surfaces of said high-concentration impurity layers.

8. The semiconductor device according to claim 1, wherein
said active region is formed of a second conductivity type impurity layer that contains said second conductivity type impurities, and
a concentration profile of said second conductivity type impurities in a thickness direction of said second conductivity type impurity layer is the same as a concentration profile of said second conductivity type impurities in a thickness direction of a place in which said high-concentration impurity layer is located.

9. The semiconductor device according to claim 1, wherein a concentration distribution of said second conductivity type impurities in the surface portion on the one side in the thickness direction of said high-concentration impurity layers periodically changes in a radial or a circumferential direction, or in the radial direction and the circumferential direction of said electric field buffer layer.

10. The semiconductor device according to claim 1, wherein said high-concentration impurity layers include local high-concentration regions in the surface portion on the one side in the thickness direction thereof, said local high-concentration regions containing said second conductivity type impurities at a concentration substantially equal to that of said active region.

11. The semiconductor device according to claim 10, wherein widths of said local high-concentration regions in said radial direction are less than or equal to one-fifth (⅕) of depths of said low-concentration impurity layers with reference to a surface on the one side in the thickness direction of said semiconductor substrate.

12. The semiconductor device according to claim 1, wherein a width of said electric field buffer layer in said radial direction is less than or equal to twice a thickness of said semiconductor substrate.

13. The semiconductor device according to claim 1, comprising:
a metal wiring layer that is provided outside said electric field buffer layer in said radial direction and has the same potential as that of a surface on the other side in the thickness direction of said semiconductor substrate; and
an insulating layer located between said metal wiring layer and the surface portion on the one side in the thickness direction of said semiconductor substrate.

14. The semiconductor device according to claim 1, comprising a Schottky electrode provided in the surface portion on the one side in the thickness direction of said semiconductor substrate, wherein
said active region is formed of a Schottky region of the surface portion on the one side in the thickness direction of said semiconductor substrate, said Schottky region forming a Schottky junction with said Schottky electrode, and
said Schottky electrode and said Schottky region form a Schottky barrier diode.

15. The semiconductor device according to claim 1, wherein said semiconductor substrate is made of a wide band gap semiconductor having a relatively wide band gap.

16. A method for manufacturing a semiconductor device that comprises a semiconductor substrate of a first conductivity type, an active region of a second conductivity type formed in a surface portion on one side in a thickness direction of said semiconductor substrate and formed away from an outer peripheral portion of said semiconductor substrate, and an electric field buffer layer formed in an annular shape so as to surround said active region from an outer peripheral portion of said active region toward the outer peripheral portion of said semiconductor substrate, said method comprising:
a mask formation step of forming, on a surface portion on one side in a thickness direction of said semiconductor substrate, an implantation mask in which a plurality of openings surrounding a portion corresponding to a region to form said active region are formed at intervals in a radial direction;
an ion implantation step of ion-implanting said second conductivity type impurities in said semiconductor substrate through said implantation mask to form high-concentration impurity layers; and
a heat treatment step of heat-treating said semiconductor substrate in which said second conductivity type impurities have been ion-implanted to form low-concentration impurity layers that respectively surround said high-concentration impurity layers, wherein
in said mask formation step, said implantation mask is formed such that the intervals between said openings in said radial direction increase from a portion corresponding to a region in which said active region is formed toward a portion corresponding to the outer peripheral portion of said semiconductor substrate, upon completion of said heat treatment step, an innermost high-concentration impurity layer formed on the innermost side in a radial direction of said electric field buffer layer among said high-concentration impurity layers is formed to be in contact with or to partially overlap said active region, and an innermost low-concentration impurity layer that surrounds said innermost high-concentration impurity layer is formed to be connected to at least one of said low-concentration impurity layers that respectively surround other said high-concentration impurity layers formed outside said innermost high-concentration impurity layer in said radial direction.

17. The method for manufacturing a semiconductor device according to claim 16, wherein in said mask formation step, said implantation mask is formed such that the portion corresponding to the region in which said active region is formed is open and said openings have a periodic pattern in said radial or a circumferential direction, or in said radial direction and said circumferential direction.

18. The method for manufacturing a semiconductor device according to claim 16, wherein in said mask formation step, said implantation mask is formed such that the portion corresponding to the region in which said active region is formed is open and the widths of said openings in said radial direction are less than or equal to one-fifth (⅕) of the depths of said low-concentration impurity layers to be formed in said heat treatment step with reference to a surface on the one side in the thickness direction of said semiconductor substrate.

19. The method for manufacturing a semiconductor device according to claim 16, comprising between said ion implantation step and said heat treatment step:
   an etching step of selectively and isotropically etching said implantation mask; and
   a second ion implantation step of ion-implanting said second conductivity type impurities in said semiconductor substrate through said implantation mask etched,
   wherein in said second ion implantation step, said second conductivity type impurities are ion-implanted with implantation energy higher than implantation energy when said second conductivity type impurities are ion-implanted in said ion implantation step.

* * * * *